(12) United States Patent
Knight et al.

(10) Patent No.: US 6,916,719 B1
(45) Date of Patent: Jul. 12, 2005

(54) METHOD AND APPARATUS FOR NON-CONDUCTIVELY INTERCONNECTING INTEGRATED CIRCUITS

(76) Inventors: Thomas F. Knight, 58 Douglas Rd., Belmont, MA (US) 02178; David B. Salzman, 1429 Second Ave., Suite 3, New York, NY (US) 10021

( * ) Notice: Subject to any disclaimer, the term of this patent is extended or adjusted under 35 U.S.C. 154(b) by 0 days.

(21) Appl. No.: 09/459,108

(22) Filed: Dec. 10, 1999

Related U.S. Application Data

(62) Division of application No. 08/082,328, filed on Jun. 24, 1993.

(51) Int. Cl.[7] .............................................. H01L 21/20
(52) U.S. Cl. ..................... 438/381; 438/107; 438/129; 438/171; 438/190; 438/210; 438/329; 438/239; 361/760; 257/664
(58) Field of Search ............................... 438/107, 109, 438/128, 129, 238, 239, 171, 190, 210, 329, 381, 901, 6, 10; 361/760, 738, 763, 766, 830; 257/664

(56) References Cited

U.S. PATENT DOCUMENTS

| | | | |
|---|---|---|---|
| 3,584,287 A | * 6/1971 | Binoche | 363/61 |
| 3,613,033 A | * 10/1971 | Denes | 333/182 |
| 3,983,546 A | * 9/1976 | Zappe | 365/162 |
| 4,876,535 A | * 10/1989 | Ballmer et al. | 340/825.34 |
| 5,138,436 A | 8/1992 | Koepf | |
| 5,155,655 A | * 10/1992 | Howard et al. | 361/5.8 |
| 5,155,656 A | * 10/1992 | Narashimhan et al. | 361/309 |
| 5,269,882 A | * 12/1993 | Jacobsen | 438/151 |
| 5,356,484 A | * 10/1994 | Yater et al. | 136/200 |
| 5,404,265 A | * 4/1995 | Moresco et al. | 361/766 |
| 5,629,838 A | * 5/1997 | Knight et al. | 361/782 |
| 5,673,131 A | * 9/1997 | Jacobsen | 359/173 |
| 6,500,696 B2 | * 12/2002 | Sutherland | 438/109 |

* cited by examiner

Primary Examiner—Amir Zarabian
Assistant Examiner—Khanh B. Duong
(74) Attorney, Agent, or Firm—Francis E. Morris

(57) ABSTRACT

Methods and apparatus are described for capacitively signaling between different semiconductor chips and modules without the use of connectors, solder bumps, wire-bond interconnections or the like. Preferably, pairs of half-capacitor plates, one half located on each chip, module or substrate are used to capacitively couple signals from one chip, module or substrate to another. The use of plates relaxes the need for high precision alignment as well as reduces the area needed to effect signaling, and reduces or eliminates the requirements for exotic metallurgy.

23 Claims, 33 Drawing Sheets

METHOD AND APPARATUS FOR NON-CONDUCTIVELY INTERCONNECTING INTEGRATED CIRCUITS

REFERENCE TO RELATED APPLICATIONS

This application is a division of application Ser. No. 08/082,328 filed Jun. 24, 1993.

FIELD OF THE INVENTION

The present invention relates generally to the field of electronic and microelectronic packaging and, more particularly, to a multichip package, a method for assembling, testing and repairing systems so packaged, and a method for communicating between circuits so packaged, via capacitive coupling of particular interest are digital systems, meaning systems which contain important constituents that operate according to the rules of multistate or binary logic.

BACKGROUND OF THE INVENTION

Packaging Technology

Electronic systems are usually implemented as hierarchical packages of components. Passive or active electronic elements, such as resistors and transistors, and their wiring are typically combined into memory or logic units, which are then combined into circuits and devices, which are combined into larger functional units, and so forth up to the level of a system.

Each higher level of hierarchy grants the designer greater productivity, but compounds costs for connecting packages together logically and physically. Communication of data and timing among devices at each of these levels requires signal interconnection means, which the package provides. The package also provides powering means and fulfills other requirements such as physical support, heat removal and protection.

By convention, there are five hierarchical packaging levels 0–4, although these levels are not rigidly defined. An exemplary scale in the hardware system hierarchy is the naked semiconductor wafer, sometimes called an undiced "Level 0" package. Many components are formed simultaneously on a common substrate during fabrication stages, even if the substrate is subsequently separated into subunits. For instance, wiring, memory or logic gates may be assembled into integrated circuits on the surface of a semiconductor wafer and then cut into individual dies. Examples of dies include microelectronic devices implemented on semiconductor materials, superconductors bearing Josephson Junctions, and materials bearing other quantum interference devices.

Individual dies are typically mounted into "Level 1" packages, which provide mechanical stability, protection, cooling and heat dissipation, power and grounding, and interconnection of signal lines (including clocking) to other packages examples include DIP, ceramic, surface mounted and socketed packages.

A "Level 2" package is a module carrying one or more Level 1 or Level 0 packages and interconnecting their signal and power wiring. It typically comprises a printed circuit board (PCB), a printed wiring board (PWB), or a thermal conduction module, and may cluster one or more interconnected packages for these purposes. "Level 3" assemblies further organize the Level 1 and Level 2 packages, typically with backplanes, but do not differ conceptually from Level 2 or Level 1 packages. The "Level 4" package canonically ties together the lower level packages with power supplies, environmental systems, mechanical systems, peripherals, and so forth to provide system functionality.

A multichip module ("MCM" or "Level 1½" package) provides modular functionality as a Level 2-like or Level 3-like package for holding and interconnecting multiple dies and/or associated interconnections. At a minimum, an MCM provides the signal distribution, and power is usually distributed by way of the MCM as well. The MCM may also, or merely, encapsulate its constituent dies as an erstwhile Level 1 or Level 0 package, thereby providing protection. It may also communicate the dies to a heat sinking substrate, thereby providing heat dissipation.

Strictly speaking, an MCM could be treated as a package at any level of hierarchy, as defined in practice by its interconnection topology. Note that the term "chip" is used interchangeably in the industry both in reference to Level 0 dies and Level 1 packages (e.g., a multichip module is usually in fact a multidie module). As used herein, the term chip refers to a Level 0 package or die unless context indicates otherwise. The term "module" or "submodule" as used herein is intended to be general, and can refer to any package level, for example one or more Level 0 dies, one or more Level 1 or Level 0 chips (packaged or not), and of course higher order ensembles.

Present MCM Technologies

An MCM involves two or more dies, whether bare or encapsulated, mounted and conductively coupled to it. It provides power and inter-die signal wiring. In some MCM technologies, the dies are physically bonded to a substrate, and leads that are wire-bonded to peripherally positioned contacts (e.g., pins) supply the conductive connections between the dies and a multichip substrate. Other technologies utilize a "flip-chip" configuration in which the leads of the dies area positioned either peripherally or over much of the die area (such as a pin grid array (PGA) or solder bumps) and are soldered or otherwise bonded to respective contacts on the multichip substrate.

Several families of multichip packaging technology are standard at present. The so-called MCM-L technology utilizes a laminated, organic board substrate to which dies are bonded by flip-chip, tape automatic bonding (TAB), or wire-bonding. In the MCM-C technologies, dies are attached either directly by flip-chip or indirectly in prepackaged carriers to a ceramic thick-filmed substrate. The ceramic substrate is formed either sequentially, by a print and fire process, or by lamination and sequential co-insertion of screened green sheets. The MCM-D technology utilizes deposited thin-film substrates to which dies are then attached as in MCM-C. There are also variations of these three basic MCM technologies. For example, a variation using plastic packages and involving molding compounds and lead frames is the so-called multichip plastic quad packs (MCM-P) technology. Another recent variation involves the use of deposited thin films on a ceramic multichip substrate, referred to alternatively as MCM-DC or MCM-CD, and typically provides inter-die signal wiring in the deposited polymer-metal thin-film layers and power/ground wiring in the co-fired ceramic thick-filmed substrate. All of these technologies are subjects of intense research and invention in industry and universities. (See Rao R. Tummala, "Multichip Packaging—A Tutorial." *Proc. of the IEEE*, December, 1992.)

Many approaches to the construction of high density multichip modules have been proposed. The IBM C4 technology attaches dies to the multichip module in a flip-chip face-down configuration. The arrangement minimizes the parasitic inductance of the package leads, and allows pad location at any point on the interior of the die. Typically, dies are attached to the module using a reflow-solder approach. Dies are bumped by bonding to each pad several layers of protective metalization followed by a 10–200 micron diameter solder ball. A plurality of dies are then accurately positioned on the multichip module, and reflow-soldered into place. Inspection of the solder joints can be done with thermographic or radiographic techniques, but may be difficult otherwise. Pad location is no longer limited to the die periphery, but is often constrained by thermal coefficient of expansion mismatch between silicon and module to lie within some radius of the center of the die. Repair is carried out by module heating, die removal, and reflow-soldering of replacement die.

"Chips-first" face-up wire-bonding of silicon dies to high density silicon, ceramic, or copper-polyimide modules is similar to conventional hybrid manufacturing technologies, and shares difficulties in rework and bonding yield. The GE/TI process forms a planar wafer-like module from collections of selected loose dies placed face down on a flat surface, and then encapsulates it in a polyimide carrier. After curing, this carrier is flipped over, planarized, and used as a module for further (possibly multilayer) metalization. The major advantages of metalizing on top of planar ensembles of dies include the fine lithography achievable and very small interconnect parasitics.

The process can also be generalized to stacks of dies in 3D. In the Irvine Sensors approach, dies with electrically insulated backs are designed with leads fanned-out to contact pads lined up along an edge, and stacked with those side pads aligned precisely. The exposed side is then cleaned and polished, and interconnect lines are metalized onto it. The package is extremely dense, although heat dissipation can become limiting, but leads must still travel out to the edge and back to route to other die.

In the Cray Computer approach, holes are drilled into a stack of dies in a grid, plated to form a conductive contact with die vias, and then threaded with twisted gold wires, separating the die slightly and supporting them. The package is extremely dense and conceptually trivial, but extremely difficult to manufacture.

Need for MCM Technology

In the present art, it costs much more (in terms of power, latency, performance and circuit real estate) to signal off-die than to stay on-die. Off-die signalling designates communicating between two points, on the same die or different dies, using off-die wiring. A major design goal with the present art is therefore to increase the number of circuits on each die, increasing the ratio to expensive off-die interconnections. However, as the size of a die approaches some economically and technologically feasible limit, the probability that randomly occurring manufacturing defects will produce an unacceptable die rises exponentially in a Poisson distribution. Since slightly larger die yield at significantly lower rates, this so-called "surface-to-volume" (communication-to-computation) ratio severely constrains fabrication yield, hence cost per functioning die.

The need for multichip technologies arises in large part from this inability to produce arbitrarily large semiconductor dies with acceptable yield. Practical limits on die size for a given technology force system designers to partition large digital systems among multiple dies. Unfortunately, such partitioning dramatically impacts system performance since inter-die communication typically inflates packaging costs by tens to many hundreds of percent.

Multichip technologies also offer the possibility of reducing the cost of intra-die communication in modern CMOS technologies. If off-die signalling became somewhat less expensive than at present, at some point it would become preferable to on-die wiring for certain intra-die communication. The implications of this need to be recognized by practitioners of today's MCM art: Dies should be made smaller, at the expense of more interconnects per non-communication gate. Smaller dies have significantly higher yield and lower cost per area, so if designers could employ cheap inter-die communication on MCMs, they could transparently treat a multichip module as if it were a single enormous ensemble of electronic devices (including their interconnections), using small, very high yielding monolithic integrated circuit dies (and modules of them) as the subunits. This would be tremendously useful for designers and cost-effective for semiconductor foundries.

Use of MCMs for intra-die signalling should also have important attractions for low impedance—hence low dispersion—signalling between points on the same die. Low dispersion broadcast is essential for clock distribution, and low dispersion point-to-point is useful in general.

Another application for multichip technologies is in customizing on-die interconnects or engineering change pads. It is valuable to customize interconnects in the manner of a breadboard, within dies up to full wafer-size or among ensembles of dies, in order to rig together specialized functions, test performance, edit out defects, redefine a system's basic connectivity, or perform the functions of engineering change pads. At present, customization generally requires a lengthy (circa six week) logic array masking process, unreliable laser fusing/breaking of wiring junctions, significant expense in microfabrication of wiring, macro-scale (e.g., wire-wrap) assemblages, lack of durability (e.g., hand-wired jury-rigs), or a combination of these. The enormous value of customization can be exploited with properly designed MCMs.

Inter-die signalling technology trends demand MCM technology. Shorter signal paths directly contribute to higher performance, since they allow shorter delays and faster clock rates (i.e. more operations per second) and wider synchronous instructions (i.e. more operations per clock tick). Dies are generally planar, so the longest signal path will scale as the diameter, or roughly as the square-root of the area. Planar MCMs can be constructed more densely with smaller dies since they ask less wiring overhead for excursions to the edge and back. In principle, the electronic devices a die bears that make it useful could be disposed volumetrically, but in the current art that is uncommon, except for on-die wiring and stacked capacitors. MCMs can in principle be constructed in a space-filling manner, so that the volumetric packing is denser than planar packing, hence signal paths are kept much shorter (e.g., proportional to the cube root of the chip package volume, which is small if the package is thin compared to its area).

The cost of interconnection networks for signal lines generally scales as a function of area (i.e. a proxy for system real estate) and number of layers (i.e. density and layout efficiency), with linear scaling as a goal. The number of leads or number of chips within an area may inflate cost by a significant factor in many packaging technologies, such as those using wire-bonds. Even if a technology avoids scaling as the number of leads or die, if it requires post-processing steps to form a package, as with solder bump conductive couples, it may still be expensive due to yield losses from handling, amortization of costly test/repair cycles, and of course operating and capital costs.

Even if a large and a small system have identical numbers of wires starting and stopping in each average square inch, the wires in the larger system will travel further on average, so account for a greater proportion of system density than in the smaller system. This is the well-known "Law of Numbers" and is a dominant consideration in constraining layout to a minimum number of metalized layers, which generally rises (geometrically) faster than real estate as a chip design grows. Runaway wiring density can in principle choke off the manufacturability of large high performance systems. The requirement for high interconnection density makes MCMs almost inevitable, and rewards volumetric packing as well as the shorter Manhattan distances that accrue to volumetric interconnection.

A further need for multi-chip technology arises from the cost and complexity of combining hybrid materials to exploit properties of each. For instance, an arbitrarily large, cheap silicon CMOS chip would still lack the speed and optical properties of GaAs, while growing one material on the other is inherently more complicated than forming them separately.

A further need arises from the enduring value of packaging hierarchies, wherein standardized packages with well-described components, such as microprocessors, are available commercially with various advantages compared to components or full system-level packaging. Important advantages to using such hierarchies may include lower cost, modular upgradeability, well-characterized behavior, and multiple sourcing. The designer balances competing benefits and costs of a hierarchy: necessarily limiting the degrees of freedom of system design, while commensurately reducing complex system interactions and failure modes.

A further need arises from the difficulty of package manufacture per se. The engineering or manufacturing complexity, process requirements, and cost of the package approach or exceed those of the die, so the cost and turnaround time for the package can become as formidable as those of the die.

Problems of Present MCM Technologies

Despite the intensive research efforts of the past several years, present day MCM technologies still have significant problems in terms of cost, performance, design, manufacturability, reliability-and reparability, as well as shortcomings with respect to the needs enumerated above.

Present MCM technologies require significant retooling and/or expensive reorientation of existing integrated circuit ("IC") fabrication lines. High volume is needed to realize cost advantages of MCM packaging, but re-implementing an existing production system (for which high volume demand already exists) to utilize MCM technology typically requires extensive system-wide redesign. System vendors rationally resist such efforts, choosing instead to implement certain clusters of ICs as application specific Ics (ASICs), which generally involves only local redesign of Level 2 boards and Level 1 chips. Accordingly, the relatively high up-front cost of MCM implementation discourages use of MCM technology for systems where large volume cannot be predicted a priori. (See Balde, J. W., "Crisis in Technology: The Questionable U.S. Ability to Manufacture Thin-Film Multichip Modules." *Proc. of the IEEE*, December, 1992.)

While the electrical performance of TAB, fine-line, or solder bump conductive interconnect can be significantly better than wire-bonding for a conductive interconnect, and pad count is somewhat less constrained, prior art MCM processes often require special processing of wafers or dies prior to assembly to place solder balls or construct metal bonding locations for assembly. The processes also require custom tooling and substantially more sophisticated wafer manufacture post-processing than would be required for standard wafer or packaging lines.

Reparability and die attach yield issues also arise with current MCM technology, principally because of the difficulty in die removal and replacement. Testing the dies in the MCM before it is fully assembled (and paid for) typically accounts for tens of percent of the delivered MCM cost, due to the need for sacrificial test rigs or time-consuming intermediary connections as well as the cost of compensating for parasitics in order to test at operating speeds. Making physical contact with microscopic probes or rigs of probes is slow, and exposes the probe points to mechanical forces leading to misalignments, fatigue, and wearing. If the dies are packaged beyond Level 0, only a fraction of the interconnects may even be visible. Nevertheless, working dies should be selected perfectly before module assembly, due to the expense (or impossibility) of reworking the module. Repair methods are very difficult-essentially a tear down and rebuild—and usually require essentially the same elaborate, expensive assembly technology as used to build the MCM originally.

The difficulties, mechanical constraints and costs of multichip module designs are largely driven by the drawbacks of conductive signalling per se. Conductive signalling is almost universally understood to be inevitable among practitioners of the present art (See Daryl Ann Doane and Paul D. Franzon, *Multichip Module Packaging Technology and Alternatives*. Van Nostrand Reinhold, 1993). Conductors in general must expose a face in contact to one another; they cannot hide behind shielding or a passivation layer. If there are (re)movable constituents in the electrical path, there will be exposed surfaces, and unless certain materials (e.g., noble metals) are used on exposed surfaces, conductors may be susceptible to oxidation, although some non-metallic conductors avoid the oxidation problems. Troublesome surface chemistry complications include mechanical stability (e.g., whiskering), finite conductance (e.g., charge carrier saturation), and time-dependent material or phase changes (e.g., intermetallic compounds). Non-metal conductors have other chemistry problems. If the entire path is bonded continuously, repair and testing may require physically severing material. Removing conductively mated dies, chips or modules for repair/replacement may entail cutting mechanical linkages and removing solder, metal-metal bonds, pins from sockets, or the like. Such breaks introduce metal fatigue (i.e. increase the likelihood of future failure modes) and contamination by conductive dust. The conductor-conductor junctions will later need to be realigned and restored. Intense localized thermal stresses from (de)soldering may also be involved. Methods for replacement pose severe constraints on the design and manufacture of conductively-coupled components in electronic systems.

Even if these or other approaches were practical in a manufacturing sense, all suffer the series inductance performance costs of conductive signalling. The performance improvement achievable with solder-bumped or wire-bonded dies is fundamentally limited by the excessive series inductance of the solder bump or wire-bond interconnection. State-of-the-art MCM technologies endure much the same performance limitation as current surface mounted IC technologies. Both families of technology require bonding wires, solder bumps, TAB, or their equivalent, to couple signals conductively between the dies and the substrate (for MCMs) or Level 2 package (for surface mounted ICs), which impose parasitic series inductance unavoidably. Parasitic inductance of 50–1000 pH is typical, and introduces significant latency, frequency limitations, and power requirements for signalling off-chip. While the best currently available MCM technologies reduce the disparity between on-die and off-die communication compared to the conventionally quoted ten-to-one ratio for surface mounted IC technologies, there remain significant penalties associated with inter-die signalling on conventional MCMs. Current MCM technologies suffer from mechanical and thermal problems, design and fabrication limitations, power costs, complexity, and expense.

With the present state of the art, technology for conductive signalling is itself directly responsible for many problems with current MCMs. It imposes mechanical and cost limitations on the density, number, and arrangement of signal leads attached to a MCM package or constituent dies in carriers, and generally requires further expense and yet more volume devoted to mounting and interconnecting the leads from chip packages onto Level 2 circuit boards or multichip carrier modules and packaging at all higher levels. Typical Level 1 packages holding a die and its conductive leads are generally much larger than the active area of the contained Level 0 die, due to requirements for spacing out contact pads and attached leads, and MCMs similarly inflate real estate requirements. On each die, fan-out of conductive leads (in order to simplify testing or wiring contact pads) takes up chip real estate. The practical need for a sufficient number of conductive pads, adequately large and well-separated, typically accounts for several tens of percent of the chip's real estate, but can range from a fraction of a percent to essentially all of the chip's real estate. With some MCM technologies, pad bonding locations cannot overlay active circuits, since applied contact probe pressure or other process steps risk damaging the circuits, so pads occupy real estate at the expense of useful electronic devices. That wasted real estate costs money (about $10–1000/square inch). Since present approaches emphasize placing the pads at the perimeter of the die's active area to minimize wiring lengths (or at the center, to minimize thermal expansion mismatch), and pad count is often limited by the available perimeter bonding density of the die, many designs are "pad limited," wasting chip real estate, and/or "pin-limited," leading to large, expensive packages. Other leads which can be used as pin-substitutes include solder, eutectic, or soft metal (e.g., gold) bumps, conductive wires (e.g., copper, silver, or aluminum) lithographed on polyimide or tape, and sharpened probe needles.

Current MCM technologies require special circuitry for interconnecting dies operating at different voltage levels. Dies fabricated from different materials generally use different voltage levels, such as CMOS versus GaAs. Dies designed with different circuit technologies, even in the same material, generally use different voltage levels, such as Si TTL versus Si ECL. Even dies fabricated from the same technology may still use different voltage levels, such as CMOS in silicon at 5.0 volts versus 3.3 volts.

The circuitry supporting signalling is sensitive to manufacturing variations during wafer fabrication. Manufacturing processes produce variation in basic physical parameters (e.g., impedance, capacitance, inductance) absolutely and spatially, across a wafer or between wafers. This variation causes circuitry to produce waveforms of differing spectra, affecting shape and skew, and differing amplitude, affecting thresholds, noise susceptibility, power requirements and termination characteristics. Unreliable waveform spectra and amplitude means that the yield of dies follows a bell curve distribution, with very few able to operate at higher frequencies. Designers have therefore adopted conservative design rules to compensate for performance ranges.

Power must still be provided to the electronic devices in a system, whether the devices are packaged in MCMs or any other level. Nearly all leading MCM designs treat power leads and signal leads the same way at Level 1, which wastes space and loses important opportunities for increasing the density of signal lines.

In short, there remains a significant need for an improved method and apparatus for coupling signals among modules in a modular electronic system which mitigates one or more of the above-explained problems with the present MCM technology. While MCM technology represents an important application domain, the invention, as defined in the succeeding sections, applies broadly to all levels of electronic packaging and interconnection, such as die, wafer, board, MCM, system, etc. It is therefore the inventors' intent that the invention not be viewed narrowly, or only in the context of the preferred MCM embodiment, except where the context inarguably indicates otherwise.

OBJECTS OF THE INVENTION

One object of the invention relates to a method and apparatus for interconnecting modules which mitigates one or more of the previously identified deficiencies in the prior art.

Another object of the invention relates to a method and apparatus for coupling signals among modules which mitigates one or more of the previously identified deficiencies in the prior art.

Another object of the invention relates to a method and apparatus for coupling signals among modules at very high speeds.

Another object of the invention relates to a method and apparatus for providing improved inter-module and intra-module signal coupling without the need for costly or exotic fabrication techniques.

Another object of the invention relates to a modular electronic system having shorter signal paths, and to a method for constructing such a system.

Another object of the invention relates to a modular electronic system wherein at least some of the signals between two dies, between two substrates or between a die and a substrate communicate via capacitive coupling.

Another object of the invention relates to a modular electronic system wherein at least some of the signals between two dies, between two substrates or between a die and a substrate communicate via magnetic coupling.

Another object of the invention relates to a modular electronic system wherein a module couples both capacitively and conductively to other modules.

Another object of the invention relates to a modular electronic system wherein a module couples both magnetically and conductively to other modules.

Another object of the invention relates to a module adapted to couple capacitively or magnetically to other modules in a modular digital system.

Another object of the invention relates to a method and apparatus for integrating modules of physically incompatible materials into a modular electronic system wherein signals couple between nearby, physically incompatible modules via capacitive or magnetic means.

Another object of the invention relates to a method and apparatus for coupling signals between two or more modules without need for additional means to compensate for differences between the chemistry, conducting state, wave phase, fabrication technology, clock rates, voltage levels, numbers of logical states, thermal expansion properties, operating temperature, ambient pressure, or environmental requirements between components.

Another object of the invention relates to a method and apparatus for coupling signals from or to a superconducting module.

Another object of the invention relates to a module comprising a plurality of dies formed by several different fabrication technologies, and a method for assembling and testing such a module.

Another object of the invention relates to a module comprising more technologies or devices than can be supported economically on a single die, and to a method for designing and laying out such a module.

Another object of the invention relates to a module wherein the connections between dies, or between a die and a substrate, are easily reversible, and to a method for reversibly forming and breaking such connections.

Another object of the invention relates to a method of repairing or replacing submodules without tearing down interconnection wiring.

Another object of the invention relates to an MCM wherein neither the process of installing a die nor the process of removing a die damages either the die or a substrate.

Another object of the invention relates to a method and apparatus for identifying and replacing undesirable modules in a modular electronic system.

Another object of the invention relates to a method for improving the performance of a modular electronic system by full speed parametric testing of modules within the system.

Another object of the invention relates to a method for improving the yield of a modular electronic system by full speed testing of modules within the system.

Another object of the invention relates to a method for improving yield of an MCM by full speed testing of chips and larger modules prior to assembly.

Another object of the invention relates to a method for improving the performance of a modular electronic system by selective replacement of modules within the system.

Another object of the invention relates to an MCM comprising a plurality of known-good modules selected by testing in a test fixture having electrical properties substantially identical to those of the MCM substrate.

Another object of the invention relates to an MCM wherein modules are selectively replaced in order to correct or improve system performance.

Another object of the invention relates to modules adapted for full speed testing prior to installation in an MCM, and to a method for testing and installing such modules.

Another object of the invention relates to an MCM wherein modules are attached to a substrate without use of solder or wire-bonding.

Another object of the invention relates to an MCM or other modular digital system wherein a clock signal is distributed with extremely low dispersion, and to a method of distributing clock signals with extremely low dispersion in such systems.

Another object of the invention relates to an MCM wherein digital signals are communicated among dies via transmission lines on the substrate, the transmission lines being capacitively or magnetically coupled to the dies.

Another object of the invention relates to an apparatus and method for coupling a transmission line to a means for capacitively signalling, and to a method and apparatus for terminating such couples.

Another object of the invention relates to a transmission line connected between two means for capacitively signalling and adapted to provide a capacitive path between two separate modules.

Another object of the invention relates to a method and apparatus for connecting two separate modules capacitively or magnetically by coupled transmission lines.

Another object of the invention is a modular electronic system having improved signal-to-noise and higher speed transmission of digital signals between modules.

Another object of the invention relates to a die wherein a substantial number of intra-die connections are routed via off-die signal paths, and a method of designing such a die.

Another object of the invention is a modular electronic system having improved routing, busing, networking, or switching of signals among constituent modules.

Another object of the invention relates to methods for laying out modular electronic systems—entailing optimizing interconnections among devices, circuits, blocks, and modules of any size—and to systems so implemented.

Another object of the invention relates to design of a modular electronic system partitioned into a number of small, high-yielding dies and low cost, high performance inter-die connections.

Another object of the invention relates to a module wherein the negative effects of misalignments from design, manufacture, assembly, or operation are substantially mitigated, and a method of isolating those effects.

Another object of the invention relates to a method of designing, manufacturing, assembling, or operating a modular electronic system which removes the need for long-range physical alignment.

Another object of the invention relates to a method and apparatus for self-aligning a modular electronic system electrically or logically.

Another object of the invention relates to a method and apparatus for providing low-cost, defect-tolerant wafer-scale interconnections in a modular electronic system.

Another object of the invention relates to a method for operating a wafer-scale module in spite of fabrication defects.

Another object of the invention relates to a method and apparatus for reducing the number of packaging hierarchy levels needed for a modular system of a given complexity.

Another object of the invention relates to a modular electronic system supporting many hierarchical layers of modules.

Another object of the invention relates to a modular electronic system using standardized interconnections to serve as a building block for larger systems.

Another object of the invention relates to a method and apparatus for standardizing the assembly of, and the interfaces between, modules in a hierarchical modular electronic system.

Another object of the invention relates to a method and apparatus for reducing the cost of package engineering and manufacturing for modular electronic systems.

Another object of the invention relates to a method and apparatus for reducing the turnaround time and cost for breadboarding or prototyping a modular electronic system.

Another object of the invention relates to a method and apparatus for assembling a modular electronic system from a standardized kit of parts.

Another object of the invention relates to a method and apparatus for reducing the turnaround time and cost for engineering and manufacturing the package for a modular electronic system.

Another object of the invention relates to methods for designing, manufacturing, assembling, and operating systems which are faster, lower-powered, cheaper, or have more logical elements, and to systems so implemented.

Another object of the invention relates to methods for designing, manufacturing, assembling, and operating systems which have preferable packages (e.g., denser, smaller, lighter, tolerant of planar or volumetric constraints), and to systems so implemented.

Another object of the invention relates to modular electronic systems with a high density or number of signal interconnections, and to methods for constructing such systems.

Another object of the invention relates to manufacturing and design methods for scavenging more real estate on wafers for electronic devices than results from methods used in the prior art, and to systems so implemented.

SUMMARY OF THE INVENTION

One or more of the above objects, as well as other objects and advantages, are provided by the modular electronic system of the invention and the many uses thereof.

Briefly, one aspect of the present invention relates to a modular electronic system comprising at least two modules, at least one of which is powered, and a means for non-conductively (e.g., capacitively or magnetically) communicating between the modules.

Another aspect of the invention relates to an MCM wherein two or more dies communicate via non-conductive signalling means. The MCM preferably comprises a substrate having a plurality of dies affixed thereto. The means for non-conductively signalling preferably comprises coupled half-capacitors, one half-capacitor plate located on a die and the other located on the substrate or another die, the die and the substrate or other die positioned so as to couple the half-capacitor plates.

Yet another aspect of the invention relates to a method and apparatus for assembling, testing and repairing modular electronic systems or MCMs based on the non-conductive signalling techniques of the invention.

Still a further aspect of the invention relates to a modular electronic system or MCM wherein interconnections between elements are non-conductive and, therefore, do not require direct physical contact. The modular system or MCM preferably utilizes the flexibility of the non-conductive junctions to accommodate or dissipate thermal stresses within the system.

A further aspect of the invention relates to a die, chip or module adapted for assembly in a non-conductively interconnected modular system, and including an externally accessible half-capacitor plate and, preferably, a plurality of electronic devices.

Yet another aspect of the invention relates to an MCM comprising a plurality of heterogeneous elements, each affixed to a substrate and having means for non-conductively coupling signals to transmission lines or wires in the substrate.

Still other aspects of the invention relate to means for non-conductively signalling between electronic elements and the use of various dielectric, adhesive, elastomeric and other materials in combination therewith.

Yet another aspect of the invention relates to a method for increasing the manufacturing yield and reducing the cost of a modular electronic system by assembling high yield known-good units to form a modular system utilizing non-conductive interconnections and, if necessary, to repair or optimize the system by replacing selected elements.

Further aspects of the invention relate to methods for differentially signalling between elements in a modular system via non-conductive means, and to receiver and transmitter circuits for practicing such signalling methods.

According to a still further aspect of the invention, very high frequency signals are communicated between modules by transmission line coupling. Such coupling is preferably implemented with parallel or perpendicularly overlapping microstrip or stripline segments. Modular microwave and millimeter wave systems are preferably assembled to communicate via transmission line coupling.

BRIEF DESCRIPTION OF THE FIGURES.

The above, as well as other, aspects of the invention are explained in the detailed description below, which describes the various preferred embodiments of the invention and is intended to be read in conjunction with the set of figures, in which.

DETAILED DESCRIPTION OF THE INVENTION

Figure 1:
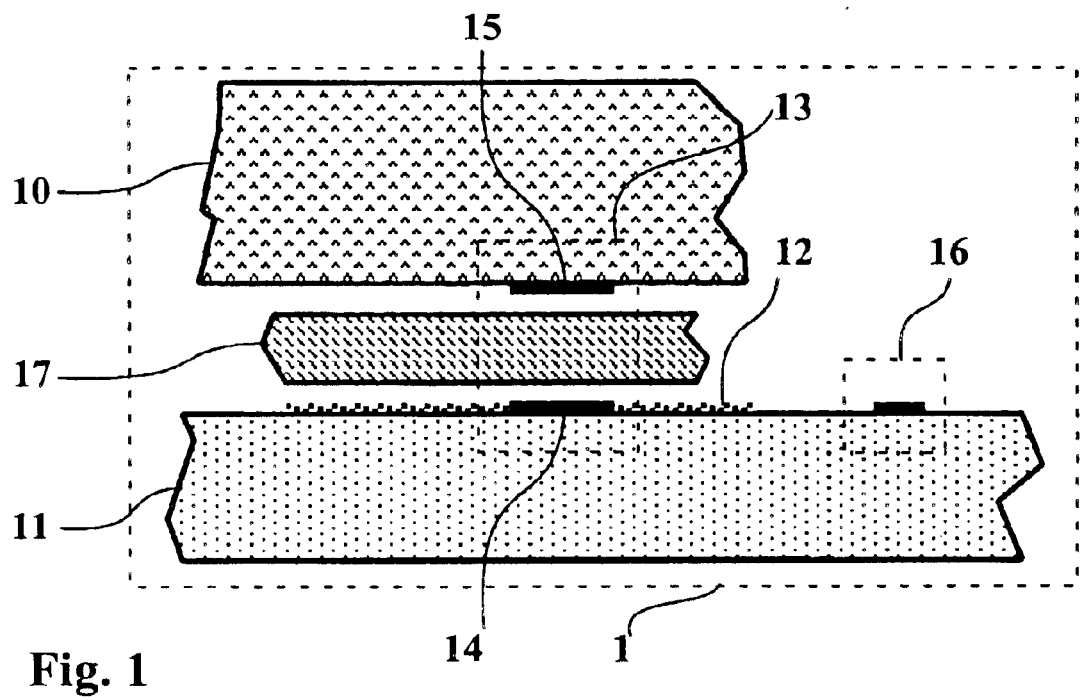
FIG. 1 depicts an exemplary portion of one embodiment of a modular electronic system 1 in accordance with the invention.

Reference is now made to FIG. 1, which shows an exemplary portion of one embodiment of a modular electronic system 1 in accordance with the invention. As depicted, system 1 comprises a substrate 10, a die 11 and a means 13 for capacitively signalling, which provides a capacitive signal path between substrate 10 and die 11. Means 13 for capacitively signalling comprises two electromagnetically communicating regions illustratively depicted as "half-capacitors" 14 and 15. A dielectric 17 is preferably used to partly or totally fill the gap between half-capacitors 14 and 15. Dielectric 17 may be employed to increase the capacitance of capacitive signalling means 13, to provide passivation for die 11 or substrate 10, to enhance the thermal conductivity between die 11 and substrate 10, and/or to mechanically bond or support substrate 10 and die 11.

As depicted in FIG. 1, die 11 also illustratively includes a plurality of electronic devices 12, implemented on an active surface of the die, and a means for powering the die, shown as a conductive contact 16 on the surface of the die.

Die 11 is preferably a digital integrated circuit fabricated by a conventional, low cost process. System 1 preferably includes additional means for capacitively signalling and additional dies, as depicted in later Figures. For example, system 1 could comprise an MCM. In such a system, die 11 might be a CMOS silicon die with active components 12 fabricated on its surface, while the substrate 10 might be a die fabricated of GaAs.

As will be discussed at length below; use of capacitive signalling means 13 in such a system offers considerable advantages over conventional alternative approaches. Conventional approaches, such as packaging the dies independently and wiring them together conductively, or growing a crystal of one material on a region of the other, are significantly more expensive for comparable performance than comparable systems constructed in accordance with the present invention. Moreover, such conventional systems generally suffer low yields and low operational reliability, due to thermal expansion stresses.

Die 11 preferably includes one or more conductive contacts 16 for powering the devices 12. For a conventional silicon CMOS die 11, contact 16 illustratively is a metallic aluminum region fabricated lithographically on the silicon CMOS die. In some applications, it may be desirable to gold-plate the outer surface of the aluminum region to protect against corrosion.

Illustratively, power could be delivered by means of a metallic fuzz button conductively connected to substrate 10 or to a different substrate. Fuzz button power connections, in combination with coupled half-capacitor signal connections 14 and 15, allow die 11 to be successively mounted and removed from substrate 10 non-destructively, which affords significant advantages in terms of testing, repair or performance optimization, as compared to destructive approaches. Such non-destructive mount/remove cycles entail substantially zero forces, torques, or changes in energy across the means 13 for capacitive signalling.

Substrate 10 is preferably constructed from a low dielectric factor material in order to facilitate high speed signalling. The substrate can be either passive or active. An example of a passive substrate is a printed wiring board wherein half-capacitor would preferably comprise a lithographically defined copper region of substrate 10. An example of an active substrate is a collection of active and/or passive semiconductor devices and wiring. Typical active elements are set forth below.

Superconducting substrates are particularly well-suited to use coupled half-capacitors, due to the absence of any metallic contact between die 11 and the superconducting substrate 10.

Materials problems which might otherwise arise in soldering or bonding to brittle high temperature superconducting ceramic layers are eliminated. All of the propagation advantages of superconducting transmission lines (especially low dispersion) are retained. While termination resistor fabrication is potentially challenging, this can be done with localized heating of a line above the transition temperature, or by application of sufficiently intense DC magnetic fields to force the superconductor normal in the resistive region. Such techniques may also provide a means for tuning the value of the termination resistance in a post-fabrication step by adjusting the current which heats or induces the magnetic field.

Illustratively, half-capacitors 14 and 15 comprise conductive plates. Die half-capacitor 14 may comprise an aluminum metal pad lithographically defined on a CMOS silicon integrated circuit 11. Adequate capacitance can be realized using the upper level of the integrated circuit die metalization to form half-capacitor 14, and a matching plate on a high density substrate 10 as the other half-capacitor 15.

Coupled half-capacitors can be formed in arrangements, like 13, which couple one-to-one, or alternatively in structures which couple one-to-many or many-to-many. The circuitry for sending and receiving signals via coupled half-capacitors can advantageously fit underneath or beside the corresponding half-capacitor; the plates themselves therefore need not be lithographed at the expense of usable chip real estate. Using present technology, the invention provides significant advantages in terms of the area required to implement high performance inter-die signalling circuits.

Coupled half-capacitors are preferably formed by affixing die 11 to substrate 10 such that half-capacitors 14 and 15 effectively overlap. Importantly, use of coupled half-capacitors instead of conventional chips first, soldered, or wire-bonded connections substantially relaxes the need for high precision alignment. Indeed, the size or shape of half-capacitors 14 and 15 need not be identical, and can be advantageously optimized to mitigate the effects of anticipated misalignments, such as those from manufacturing tolerances, assembly errors, or thermal mismatch.

Circuitry for coupled half-capacitors can cost substantially less chip real estate per bit than connections for conductively coupled off-die signalling. The driver and receiver circuits are small enough to be fabricated underneath the corresponding half-capacitor plate. The plates are smaller than contact pads and fan-out leads in the present art, and can overlay other active circuitry, including circuitry unrelated to I/O. Plates can be packed much more densely than pads, and can occupy any part of the surface of the die rather than predominantly the perimeter.

A coupled half-capacitor of approximately 1 picofarad can be realized with a plate 70 microns by 70 microns metalized on top of the die, assuming the dielectric factor of the separator is K=112 ($TiO_2$ ceramic) and the plate separation is 3,5 microns. This represents an I/O surface density of approximately $10^5$ equivalent leads per square inch. Alternative dielectric materials, such as oriented barium titanate crystals which have a dielectric factor more than 100 times larger than titanium dioxide, may further increase the I/O density. However, once the half-capacitor plate size becomes smaller than the driver/receiver circuitry, and the die is circuit-limited rather than I/O pad-limited, there is little point in further reducing the size of the plate except in certain scenarios: where they comprise multiple platelet regions ganged together electrically and logically; where they are used for AC powering; or where other surface accessible functions like optical transmitters/detectors compete for surface space.

Standard semiconductor processes allow active circuitry to be implemented beneath a metal half-capacitor plate. In contrast, implementation of active circuitry beneath conductive contact pads is undesirable because mechanical forces imposed on the contact pad can irreversibly alter the electronic behavior of the underlying domain.

Half-capacitors 14 and 15 need not be constructed of the same material and can even be formed from chemically incompatible materials. The half-capacitors can be formed by any means from any uniform or composite material(s)—including metals, superconductors (including High $T_c$), semi-conductors, semi-metals, impedance-varying or conductance-varying materials—in single or multiple layers or domains. They can be built in any state or form of matter—including gases, gasified material, liquids, liquified material, solids, solidified material, composite, slurry, gel, suspension, matrix, or others.

Since the conductance, or charge-carrying capability, of the half-capacitor plates is typically so high, the effective plate-to-plate overlap and separation, and the properties of dielectric 17, largely determine the performance of the coupled half-capacitors 13. Methods for forming capacitor plates are well-known in the microelectronics industry, although their application to MCMs and other modular interconnection schemes is not recognized in the prior art.

The inter-plate gap between half-capacitors 14 and 15 may be filled with a high dielectric material or left empty (with air or vacuum). Illustratively, the dielectric 17 is a high dielectric factor fluid, such as ethylene glycol. Dielectric 17 can be disposed between a series of passivation layers on each plate, if any, and intervening insulator, if any. Such passivation layers can be formed cheaply and reliably from oxides of the metalization layer and/or from applied emulsion coatings such as titanium dioxide, crystalline barium titanate oriented along the high-dielectric axis, and other materials which are well-known in the electrochemical community and commercially available.

The known corrosion properties, cleanliness, and viscosity as a function of temperature of the dielectric are crucial, as is its dielectric factor. Colloidal suspensions of high dielectric factor solids (e.g., ceramics like titanium dioxide applied in a slurry) can be used as the filler material, as well as a corrosion-free low dielectric factor liquid, such as the Fluorinerts. The dielectric may be an insulating liquid, such as, ethylene glycol, propylene glycol, glycerin, or nitrobenzene; a gas, such as uranium hexafluoride; or a mixed-phase suspension or gel, in order to exploit heat transport properties, cleanliness, or mechanical stability. The hygroscopic nature of these materials remains a major concern, and some (lower dielectric factor) hydrophobic materials, such as 1,1,1 trichloroethane may therefore be preferable. Hygroscopy and temperature-dependent sensitivity to vibration and to changes in viscosity or dielectric factor complicate implementation, but their treatment is well-known to those skilled in the art. Some processes for applying coatings also require a polishing step.

Liquid dielectrics may be useful in certain systems, in part because no sheer force is transmitted if the chips have to be moved, and in part because the dielectric is scratch proof. Spacers on the chip surface could assure constant separation in the presence of a high dielectric liquid like glycerol but are not required unless shorting is a risk. In the case of liquid dielectrics, surface tension may be sufficient to hold the die and substrate against one another.

Intervening insulator(s), if used, should generally slide on at least one side to accommodate thermal expansion, and may either be bonded to one of the dies, substrates or modules, as with an adhesive, or maintained as a monolithic material bonded to neither, such as Cellophane. Bonding to both surfaces should be avoided, except with liquid dielectrics, elastomers, or systems carefully engineered to accommodate thermal expansion.

Temperature and frequency dependence of the dielectric factor remain a significant engineering consideration. Nearly all known materials exhibit complicated frequency dependence on their dielectric factor, which can effectively limit their range of use in coupled half-capacitor gaps. Of course, dry air or a vacuum represent exceptions to this rule, but their low dielectric factor and compressibility make them less attractive.

In the MCM design community, high dielectric materials are shunned in general, since signals propagate through wiring at less than the speed of light by a factor of the square-root of the surrounding dielectric factor. (See, for example, Robert Johnson, Robert Teng, and John Balde, "Multichip Modules Systems Advantages, Major Constructions and Materials Technologies." *IEEE Press*, 1991.) Contrary to the teachings in the MCM community, high dielectric materials have a central role in the present invention.

One disadvantage with high dielectric materials, however, is that they cause the electric field to spread outside the region immediately between opposing half-capacitors, necessitating greater spreading out of the placement of neighboring plates. In this regard, lower dielectric material would allow tighter packing of neighbors, but at the cost of a commensurate increase in voltage or plate area, or a decrease in plate separation, with accompanying complexities. For a system with a uniform dielectric and a plate dimension much greater than the separation, neighboring plates can be packed with a separation approximately twice the vertical separation without encountering significant cross-talk problems. A patterned dielectric, with lowered dielectric factor outside of the gaps between opposing plates, would allow slightly tighter areal packing of plates, but increase the manufacturing complexity. Dielectrics may also be engineered to enable/disable capacitance above a threshold between paired half-capacitors. Extremely low cost processes from the painting/copying industry. (e.g., lithography) are well-known for fabricating printed wiring boards, and can analogously be employed to implement the dielectric pattern, effectively defining interconnections.

While a pair of coupled half-capacitors represents the preferred means for capacitively signalling, other such means are available. For example, multi-storey capacitively coupled structures can be constructed wherein one or more intervening conductive regions are disposed (preferably in the dielectric region) between two terminal half-capacitors, thereby effectively forming a series connected chain of two or more capacitors. Importantly, such multi-layer structures do not require any overlap between the two terminal half-capacitors. For example, in a three-layer structure, overlap only between the bottom plate and a middle conductor and between the top plate and the middle conductor suffices to implement a means for capacitively signalling between the top and bottom plates. Printing/copying processes (e.g., xerography) may be applicable for forming such structures cheaply.

Figure 2:
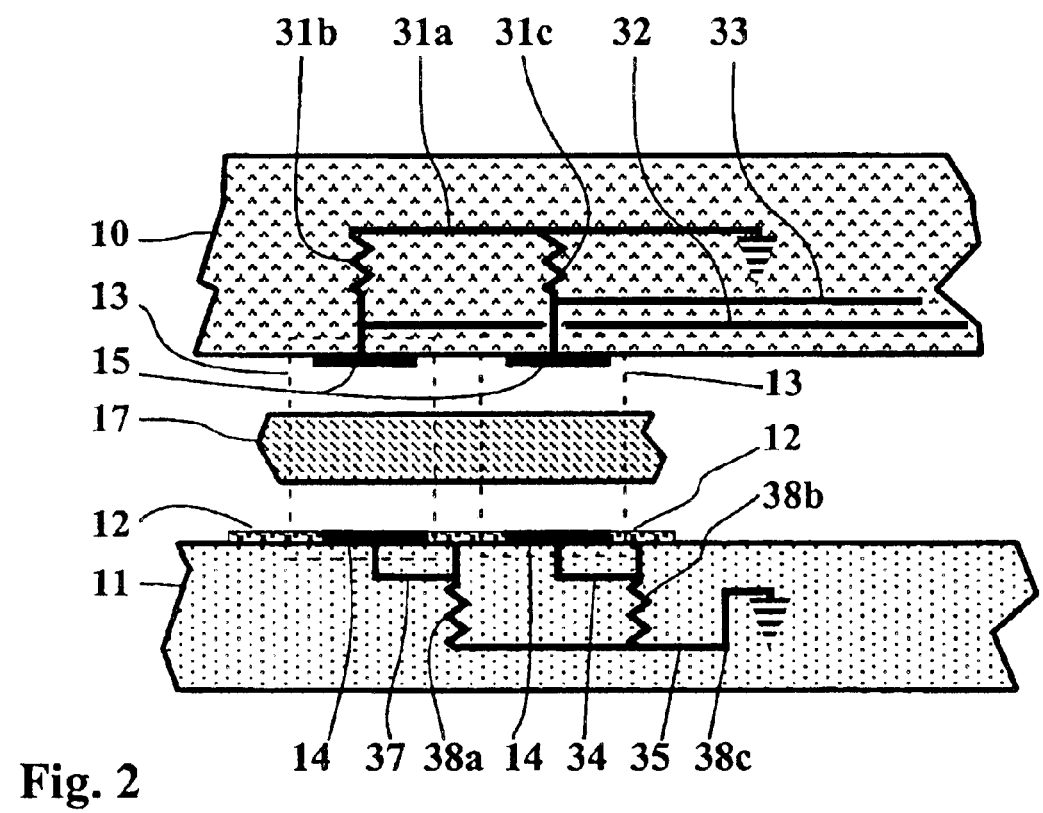
FIG. 2 depicts an exemplary portion of a modular electronic system wherein a signal is differentially coupled from a pair of transmission lines on a substrate, across a pair of coupled half-capacitors, and to a pair of transmission lines on a die.

Reference is now made to FIG. 2, which depicts an exemplary portion of a modular electronic system wherein a signal is differentially coupled from a pair of transmission lines 32 and 33 on substrate 10, across a pair of coupled half-capacitors 13, to a pair of transmission lines 34 and 37 on die 10. A means for terminating transmission lines 32 and 33 is provided on substrate by termination resistors 31$b$ and 31$c$, connected to a ground plane by line 31$a$.

Advantageously, transmission lines 34 and 37 connect to on-die driver and/or receiver circuits, implemented as some of the active elements 12 of die 11. Transmission lines 32 and 33 may couple to driver or receiver circuits implemented on substrate 10, to other chips, modules or substrates via additional coupled half-capacitors, or to external conductive leads. Transmission lines 32 and 33 are preferably implemented as microstrip, stripline or slotline transmission lines. Of course, ordinary unterminated metal or polysilicon interconnect will suffice in certain applications.

Figure 3:
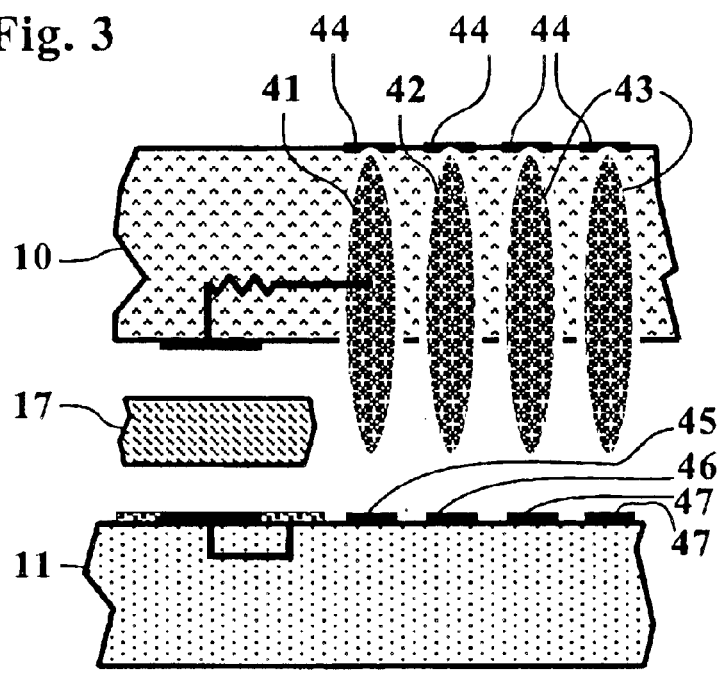
FIG. 3 is a partially exploded view of an exemplary portion of a modular electronic system which includes both capacitive and conductive interconnections between a die and a substrate.

Reference is now made to FIG. 3, which shows a partially exploded view of an exemplary portion of a modular electronic system which includes both capacitive and conductive interconnections between die 11 and substrate 10. Conductive contact pads 45, 46 and 47 illustratively receive power, ground and a plurality of I/O signals from substrate 10. Conductive connection is achieved by affixing die 11 to substrate 10 such that conductive connection means 41, 42 and 43 touch their respective contacts 45, 46 and 47. Importantly, this permits non-destructive removal of die 11 from substrate 10, thereby providing substantial fabrication, testing and repair advantages for modular systems based on the present invention.

Conductive connection means preferably comprise metallic fuzz buttons, such as the Cinapse™ contacts manufactured by Cinch, Inc. The holes in substrate 10 which accommodate metallic fuzz buttons 41, 42, 43 are preferably conically tapered to ensure that the buttons do not interfere with seating of die 11 against substrate 10. Alternative conductive means include solder balls, wiring on tape or films, bonded wires, contact probes, liquid metals such as mercury, low melting point metals such as gallium, and other high conductance media such as may be appropriate for particular engineering situations.

Advantageously, the conductive connections can be customized by impairing (e.g., removing, eroding or destroying) or adding selected fuzz-buttons, thereby disabling or enabling conductive connection between the selected fuzz-buttons and their respective contact pads.

Typically, the conductive connections 45, 46, 47 can be much larger than the capacitive couplings, since power feeds are rarer than signal feeds and benefit from the lessened resistance of bigger leads. Conductive contacts are however relatively very expensive and failure prone compared to coupled half-capacitors. It is therefore advantageous to employ the relatively coarse technology of conductive contacts only for DC power leads, while retaining the invention's advantages of many high bandwidth capacitively coupled paths for signalling.

Contact pads for fuzz buttons occupy 0.3 mm$^2$ each in the preferred embodiment. In contrast, circuitry to drive the capacitive couplings occupies about 0.04 mm$^2$ per half-capacitor, based on a 1 micron CMOS process. Multiply-redundant contact pads may advantageously compensate for the relatively low reliability of mechanical contacts.

Figure 4:
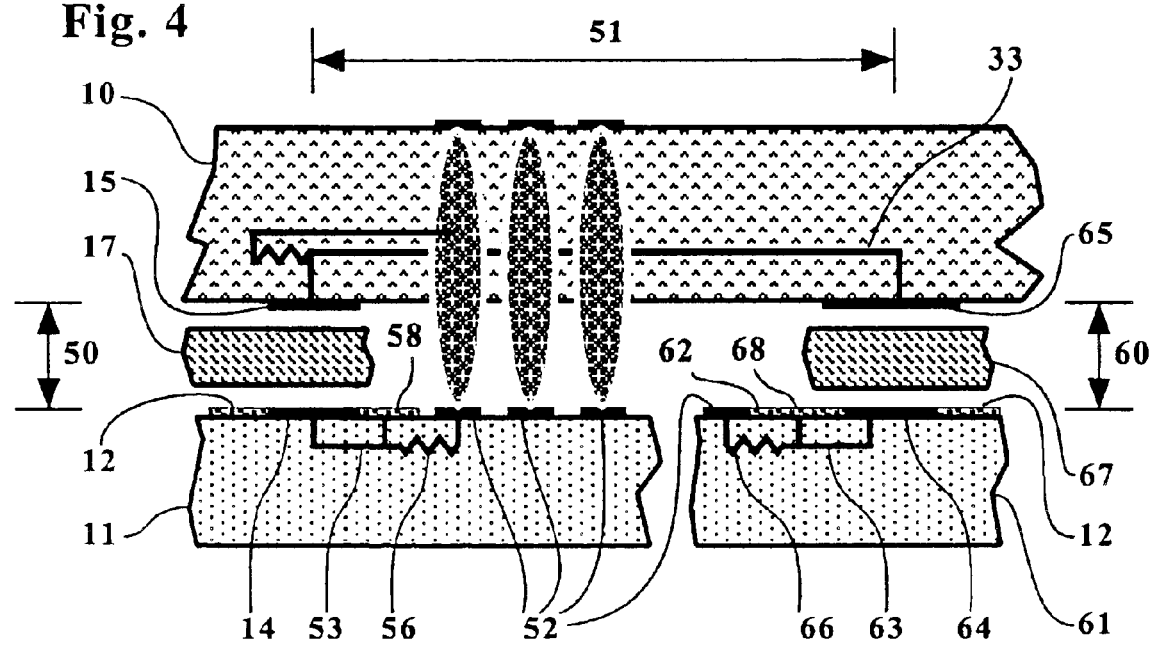
FIG. 4 depicts an exemplary portion of an MCM constructed in accordance with the present invention.

Reference is now made to FIG. 4, which depicts an exemplary portion of an MCM constructed in accordance with the present invention. The MCM comprises a substrate 10, a first die 11 and a second die 61. (First die 11 and second die 61 could also represent different parts of a single die.) A terminated transmission line 33 interconnects half-capacitors 15 and 65 on substrate 10, thereby providing a signal path between half-capacitor 14 on the first die 11 and half-capacitor 64 on the second die 61.

Transmission line 33 provides efficient communication between half-capacitors 65 and 15. Importantly, the power required to couple a signal from half-capacitor 64 (on second die 61) to half-capacitor 14 (on first die 11), via transmission line 33, is substantially independent of the length 51 of transmission line 33. For communications beyond a reasonably short distance, the off-die route (via transmission line 33) offers potentially superior performance to an equivalent on-die routing of the same signal. By contrast, in prior art MCMs based on conductive signal interconnections between die and substrate, the off-die coupling of signals via the substrate involves substantial performance penalties due to the excessive parasitic inductance of the conductive die/substrate connections. Transmission lines and unterminated wiring both, however, suffer limitations from the integrated net series resistance over a path and the present invention cannot avoid this problem unless a shorter wiring path can be achieved. Modem signal coding techniques such a those discussed below are useful in confining this problem to one of power attenuation rather than signal dispersion.

First die 11 and second die 61 also include conductive contact pads 52 for, among other things, receiving power from substrate 10.

Advantageously, dies 11 and 61 can be formed from different or incompatible materials. For example, first die 11 could comprise a low cost CMOS integrated circuit while second die 61 could comprise a GaAs integrated circuit, including optical I/O devices. The spacings 50 and 60 between the dies and substrate can be the same or different, as needed to accommodate the electronic or physical requirements of dies 11 and 61. Likewise, similar or different dielectrics 17 and 67 can be used in the half-capacitors that couple dies 11 and 61, respectively, to substrate 10.

The tolerance of the capacitive interconnections to thermal expansion represents an important advantage of the invention over conventional MCMs. Where dies 11 and 61 represent different portions of a large (e.g., wafer-scale) die, the misalignment errors due to thermal expansion mismatch accrue and can become particularly troublesome. In conductively coupled prior art MCMs, thermal expansion problems often require that the substrate material be selected to match, as closely as possible, the thermal expansion properties of a particular die material, typically silicon. In contrast, the present invention permits integration of heterogeneous dies or modules on a common substrate with substantially relaxed thermal expansion constraints, at least for dies of modest size. To increase the tolerance of the capacitive interconnection between die 61 and substrate 10 to misalignments and/or thermal expansions, half-capacitor 65 is advantageously sized larger than half-capacitor 64.

For large die size, matching the thermal expansion of the substrate 10 to the thermal expansion of the die becomes a major consideration. Sheer stresses will be induced in the dielectrics unless the large size die and the substrate can slide along their adjacent surfaces or have well matched coefficients of thermal expansion. In addition, unsupported standard wafers bow as much as 50 microns with a 70° C. rise in temperature, suggesting a requirement for edge-to-edge thermal control to within a few degrees Celsius, unless the mating of the substrate, the dielectric, and the large size die is compliant.

Figure 5:
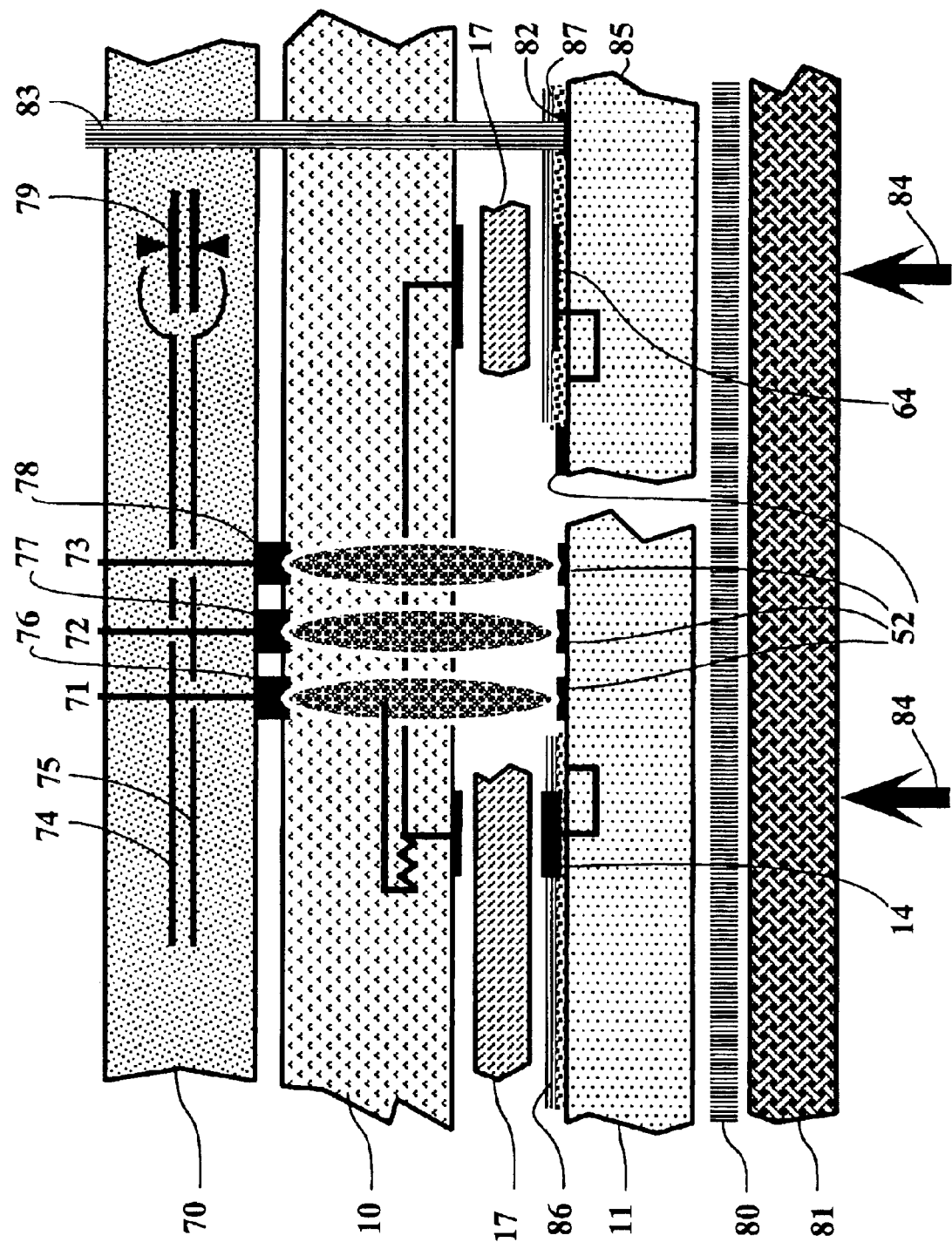
FIG. 5 depicts an exemplary portion of an MCM similar to that of FIG. 4, but including a power substrate, distinct from the signal substrate, as well as a heat sink.

Reference is now made to FIG. 5, which depicts an exemplary portion of an MCM similar to that of FIG. 4, but including a power substrate 70, distinct from the signal substrate 10, as well as a heat sink 81.

Power substrate 70 preferably includes a ground plane 74, power plane 75 and decoupling capacitance 79 coupling therebetween. A plurality of terminals represented as elements 76, 77 and 78 on power substrate 70 are conductively connected to respective terminals on die 11 and provide ground, power and a plurality of external I/O leads, respectively, to die 11.

Ground plane 74, power plane 75 and the power/ground wiring associated therewith are preferably fabricated using a low resolution lithographic process. Power substrate 70 might alternatively be formed from materials, such as metals, ceramics, organic polymers, silicon, inorganic polymers, glasses, amorphous solids, crystalline solids, polycrystalline solids, composite materials, heterogeneous multilayer materials, or others. Power substrate 70 may be made of rigid or flexible material, depending upon the application, and may include holes or similar patterned features to accommodate; for example, an external optical I/O path 83 from/to an optical I/O device 82 on chip 85. Advantageously, external power, ground and I/O terminals 71, 72 and 73 on power substrate 70 can be wire-bonded to appropriately configured pins or other external leads, thereby providing a conventional Level 1, 1½, 2, or 3 package lead-out as appropriate.

The conductive connections between terminals 71, 72 and 73 on power substrate 70 and similar terminals on chip 11 can be fabricated by reflow-solder, liquid metal or other conductor, metallic fuzz buttons, pin & socket, other mechanically compliant reversible or irreversible contacts, or by wire-bond or other welding techniques.

Alternatively, power could be provided to die 11 or other dies using integrated batteries or high frequency alternating current instead of direct current, thereby dispensing with any requirement for conductively coupled contact points altogether. Use of optical or near-optical frequencies to couple power is preferable since it increases transmission efficiency, and polarizing the radiation decreases crosstalk interference with other signal interconnections, notably including on-chip circuitry. Advantageously, essentially all of a die's surface, except that employed for I/O (e.g., signal coupling half-capacitors, semiconductor lasers, photodetectors and the like), can be used to receive power.

FIG. 5 also depicts a means for dissipating heat from dies 11 and 85 comprising a heat sink 81 and a thermal elastomer 80 positioned between heat sink 81 and dies 11 and 85. Thermal elastomer 80 preferably comprises a material having high thermal conductivity, such as organic elastomers filled with boron nitride. Alternatively, other known methods for effecting good thermal contact between dies 11 and 85 and heat sink 81 can be used, including maintaining the dies and heat sink in intimate physical contact, employing thermally conductive greases or epoxies, soldering or eutectic bonding of the heat sink and dies, and the like.

It ordinarily does not matter whether the thermal elastomer is an electrical insulator or conductor, unless dies operating at different bulk potentials share the same heat sink. But for this or other reasons an electrical insulator may be preferred. Ceramic loaded elastomers containing aluminum oxide or (preferably) boron nitride are one such approach.

Heat sink 81 can be cooled with any standard cooling technique, including conductive, convective, or radiative transfer, or by phase change of a suitable material, as in a heat pipe.

Preferably, heat sink 81 also comprises a pressure plate 84. Force 84 applied through pressure plate 81 assures intimate contact between dies 11 and 85 and substrates 10 and 70, as well as dies 11 and 85 and heat sink 81. Positioning the dies and substrates relative to one another by means of pressure offers important advantages with respect to building and unbuilding the MCM assembly reversibly (e.g., for repair, inspection, testing, performance enhancement, and so forth). Advantageously, use of a reformable elastomer 80 further contributes to these reversibility advantages.

If two distinct substrates 10 and 70 are used to carry wiring and power, thermal expansion should be matched. However, this constraint is no different from that faced in conventional MCM designs, which commonly employ distinct power and signal substrates. Accordingly, appropriate techniques for matching or compensating for the thermal expansions of substrates 10 and 70 are known to those ordinarily skilled in the art.

Construction of the interconnects on signal substrate 10 is extremely rapid and amenable to mass production. The signal lines in substrate 10 may advantageously be fabricated as microstrips, striplines or slotlines. In general, more layers will be required on substrate 10 as the size of substrate 10 (and the number of or size of die(s)) grows to compensate for the typical geometric increase in wire density. Advantageously, the superior electrical characteristics of the lithographically formed transmission lines on substrate 10 allows use of longer-than-minimal routing paths in order to relieve layout wiring congestion. Assuming that the resistors terminating a transmission line are lithographically fabricated, the cost of manufacturing substrate 10 is approximately linear as a function of area or at worst is a slowly growing geometric function. Importantly, the manufacturing cost is not proportional to the number of signal interconnections between substrate and die(s), as is the case for the many conventional contact junctions needed for conductive signalling. The cost of the remaining components—power substrate 70, heat sink 81, pressure plate 84, and thermal elastomer layer 80—scale approximately linearly with area, also independent of the number of die/substrate signal interconnections.

FIG. 5 also shows two exemplary passivation layer configurations for dies 11 and 85. Passivation layer 86 (covering die 11) and layer 87 (covering die 85) are preferably thin, protective layers of silicon dioxide, silicon nitride, polyimide, borosilicate glass or similar materials. Illustratively, passivation layer 87 covers the entire active surface of die 85, while passivation layer 86 is patterned and does not cover half-capacitor plate 14. Common passivation materials have significantly lower dielectric factors than many of the materials contemplated for use in the preferred embodiment of dielectric 17. Accordingly, the passivation materials preferably should not be used on the half-capacitor plates and, if used, should have as high dielectric factors as practical.

Passivation layer 86 is patterned by lithographically defining regions of the passivation layer to be removed during the chip fabrication process, then selectively removing such regions. Advantageously, the lithographically defined region can be smaller than the half-capacitor plate, so as to provide a border region surrounding the half-capacitor wherein the passivation layer partially overlaps the plate. With only a portion of the half-capacitor plate 14 exposed without passivation, the influx of chemical contaminants is effectively discouraged.

In contrast, passivation layer 87 covers half-capacitor plate 64. This approach typically reduces the available capacitance of the coupled half-capacitors, but eliminates possible contamination problems at the exposed plate boundary.

In either passivation layer configuration, the conductive contacts 52 will be unpassivated, as in current fabrication technologies. Advantageously, noble metal contacts may be useful for avoiding oxidation or corrosion.

FIG. 5 also illustrates why manufacturing and construction of a modular system in accordance with the invention is simpler than current techniques for forming a modular system with a comparable number of signal interconnections and similar density. The exemplary fabrication of half-capacitor plates and passivation layers employs standard semiconductor fabrication techniques, and the dielectric can itself be the adhesive holding the modular system together, while the heat sink and thermal elastomer are largely standard components. Similarly, the substrate (and power substrate, if employed) can be easily mass-produced with current techniques. While some changes will be required in the CAD layout tools, the flexibility to locate half-capacitor interconnect plates directly above other signal lines on the dies simplifies the layout problem.

Reliability of the interconnects is extremely high if the FIG. 5 embodiment is employed. Fuzz buttons are comparable to pressed gold wires and TAB in assuring reliable electrical contact, although neither is as mechanically robust as solder or a lithographed metal junction. Fuzz buttons are at present, however, the easiest and most reliable of those conductive contact means to handle through repair/replacement cycles. The plurality of means for capacitively signalling avoids, by design, significant amounts of thermally induced sheer stress, assuming the dielectric is properly selected. In any case, the heat stress and forces perpendicular to the surface will likely be significantly lower than in conventional modular systems in which conductive bonds are pushed or soldered together.

Using capacitive couplings for signalling means that many fewer conductive contacts are needed (e.g., only for power, ground, or off-module I/O). Therefore, the Poisson statistics for anticipating failure need only account for a fraction of the number of mechanical components, as compared to conductively coupled signalling systems. Generally, important failure modes in MCM-level modular systems include solder deformities, electromigration, and metal-metal corrosion. Typical processes for assembling MCMs involve repeated installation and removal of dies from the module. During these steps, failure modes associated with the conductive connections to dies represent the dominant factor diminishing the yield or reliability of the manufacturing process. Such yield loss correlates strongly with the number of conductive connections. Therefore, the present invention, which employs dramatically fewer conductive connections than conventional MCM technologies, enjoys considerable advantages in terms of manufacturing/assembling yield, reliability, reparability and cost. These simplifications also benefit the design and operating cycles.

Reference is now made to FIGS. 6A–D, which depict exemplary waveforms for a 3-state digital signal coupled from die 11 to die 85 of FIG. 5 and appropriately supported by 3-state logic.

FIG. 6A shows a typical digital waveform in a high speed digital system. The waveform consists of a series of states, the states being defined by the level of the waveform during a particular clock period 29. For example, during period 21, the waveform represents a digital "1". In period 22, it represents a digital "0". In the case of a 3-state system, the waveform during period 23 represents a state designated "−1". The waveform is generated by a digital circuit constructed from devices 12 on die 11.

Before transmission across capacitative signalling means 13, a transmitter circuit on die 11 converts the digital waveform of FIG. 6A into a pulsed waveform as depicted in FIG. 6B. Note that in this example, the 3-state transmitter suppresses the trailing edge transition, which a 2-state (binary) transmitter advantageously would not bother doing. The exemplary pulsed waveform generated by the transmitter includes a pulse 24 representing the logic state during a particular portion of the clock period. The pulsed waveform is applied to half-capacitor 14, from which it travels to half-capacitor 64 by way of a first half-capacitor 15, terminated transmission line 33, and second half-capacitor 65 on substrate 10.

FIG. 6C shows the pulsed waveform received on half-capacitor 64, lagged in time due to the finite speed of transmission over the electrical distance from half-capacitor 14, and attenuated by the non-zero series impedance of the electrical path. At high speeds, the transmission of pulsed waveforms between half-capacitor plates 14 and 64 achieves much better signal-to-noise ratio than would a conventional conductive interconnection operating at the same power.

The signal received by half-capacitor 64 is coupled to a receiver circuit on die 85. This receiver circuit generates the digital output signal depicted in FIG. 6D. Note that in this example, the 3-state receiver has timing circuitry or access to a clock signal, so can discern and restore "0" states 22 as well as the trailing edges suppressed by the transmitter. As is apparent, the waveform of FIG. 6D represents a delayed and restored version of the original digital input waveform depicted in FIG. 6A.

The waveforms shown in FIGS. 6A–D are merely exemplary. A myriad of signalling schemes are possible, many of which are preferred over the simple, un-encoded, 3-state single-ended scheme depicted in FIGS. 6A–D. In particular, differential binary signalling offers significant advantages in terms of noise immunity.

The signalling across coupled half-capacitors need not utilize the pulsed digital mode depicted in FIGS. 6A–D, but can instead employ any modulation of some combination of phase, frequency, amplitude and/or signal-to-noise ratio. The signals can have any form that does not require coupling of the DC component across the coupled half-capacitor. The signals may comprise binary or multistate codings, and, in the case of a ganged half-capacitor junction, may represent a multibit encoding encompassing the signals from one or more half-capacitors as channels.

The presently preferred embodiment employs pulses, each representing a bit, which are sent across a "differential pairs of coupled half-capacitor junctions. This is essentially a binary differential version of the technique illustrated in FIGS. 6A–D.

Many of the telecommunication industry's techniques for communicating digital information over bandwidth-limited communication links have no DC component, and thus are advantageous in connection with the present invention. Notable such methods include alternate mark inverse and 10B8 codes. In addition, any coding scheme based on (approximately) constant numbers of zero & one bits, such as Knuth's methods, will have particularly advantageous signal-to-noise properties for a given power budget. Modem techniques designed for limited bandwidth environments, including frequency key shifting, phase encoding, and amplitude coding, are also useful as are hybrid coding schemes, such as QPSK. Multidimensional sphere packing, Reed-Solomon codes, Trellis codes, or other algorithms for coding states across one or more signal channels can be used to maximize inter-chip signalling bandwidth, up to the Shannon limit for the system, which may be higher than the clock rate. Of special interest is the class of coding schemes with limited bandwidth, since they can be used to transmit signals through exponentially tapered stripline transmission line transformers, allowing the matching of signals with high voltage swing but low current to low impedance transmission lines as part of the coupled half-capacitor. Limiting the bandwidth can advantageously avoid difficulties arising from dispersive lines. Major causes of such dispersion include the frequency-dependence of the line's dielectric factor, frequency dependent dielectric losses, skin effect and losses from the source resistance.

Figure 7:
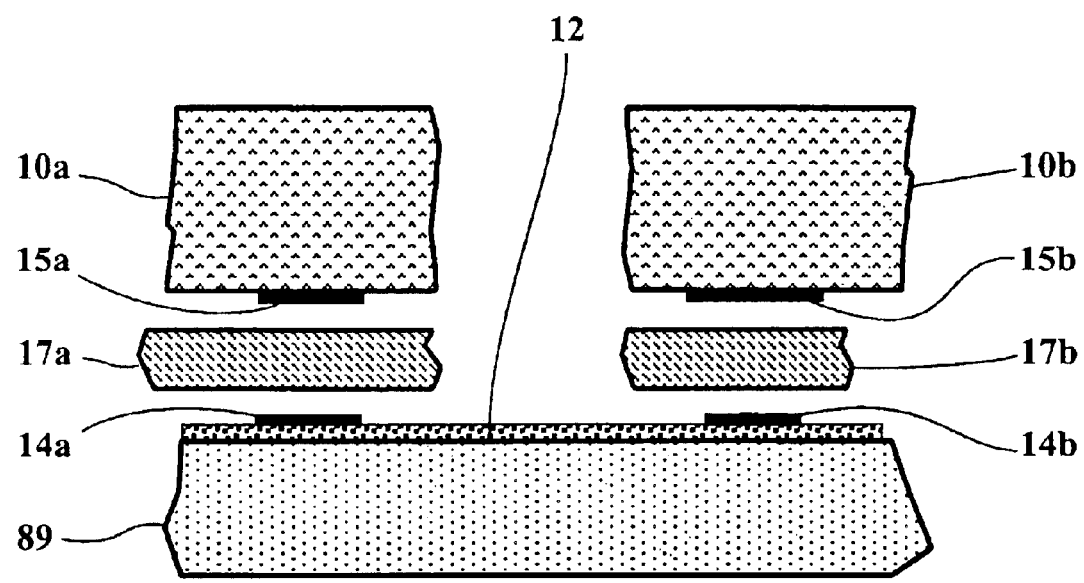
FIG. 7 depicts an exemplary portion of a modular electronic system in which a die capacitively interconnects ("bridges") two substrates.

Reference is now made to FIG. 7, which depicts an exemplary portion of a modular electronic system in which a die bridges two substrates. Bridging die 89 includes at least two half-capacitors 14a–b, each of which couples to half-capacitors 15a–b on different substrates 10a–b via dielectrics 17a–b. Bridging die 89 preferably includes a plurality of active electronic devices implemented on an active surface 12 thereof. Substrates 10a and 10b may be of similar or dissimilar construction. Likewise, half-capacitors 14a–b and 15a–b are advantageously sized to accommodate anticipated thermal expansion and/or mechanical misalignment.

Either a passive or active signal path on bridging die 89 connects half-capacitors 14a and 14b. Advantageously, an active signal path may be used to convert between incompatible signal waveforms, timings and/or codings on substrates 10a and 10b.

Figure 9:
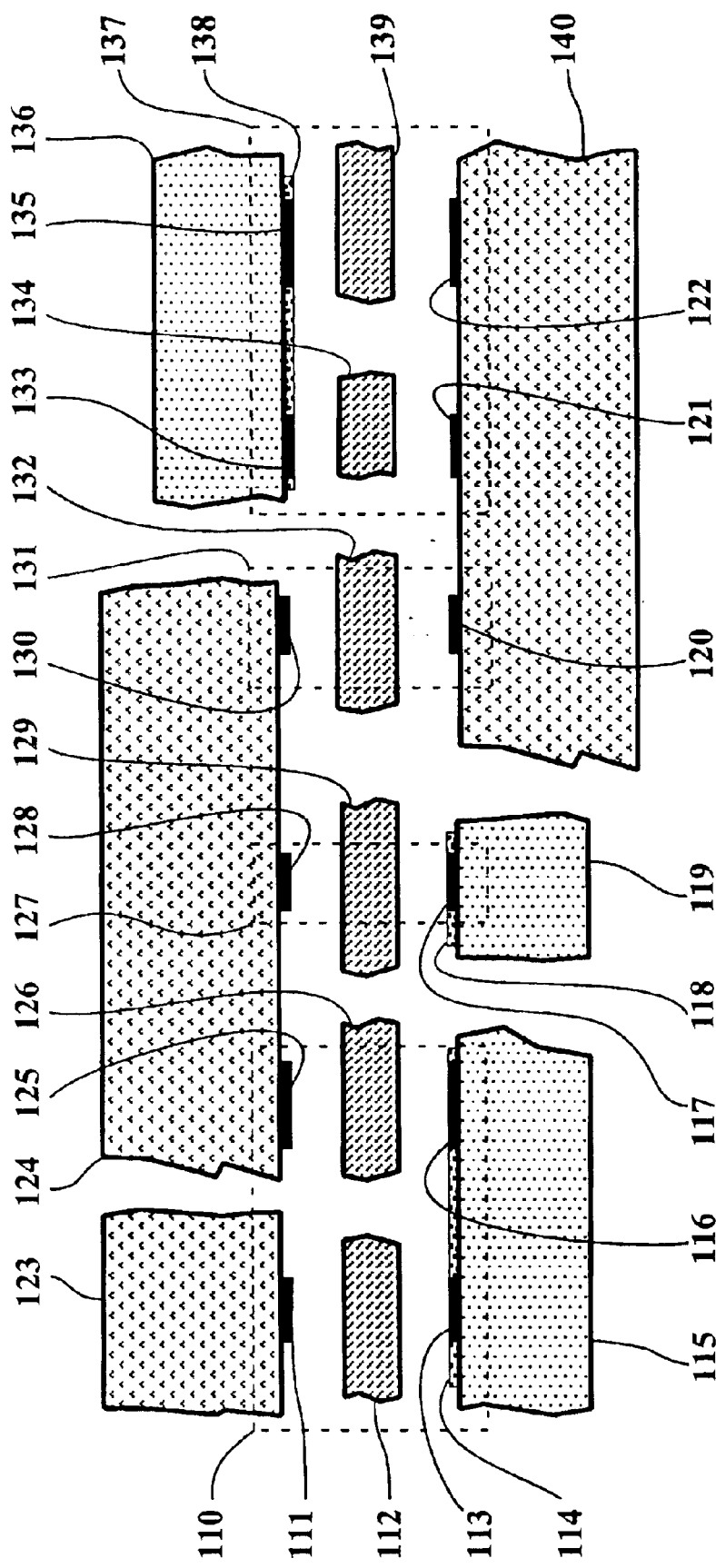
FIG. 9 depicts and exemplary portion of a large-scale modular system constructed in accordance with the invention which utilizes a so-called "leapfrog" geometry.
Figure 10:
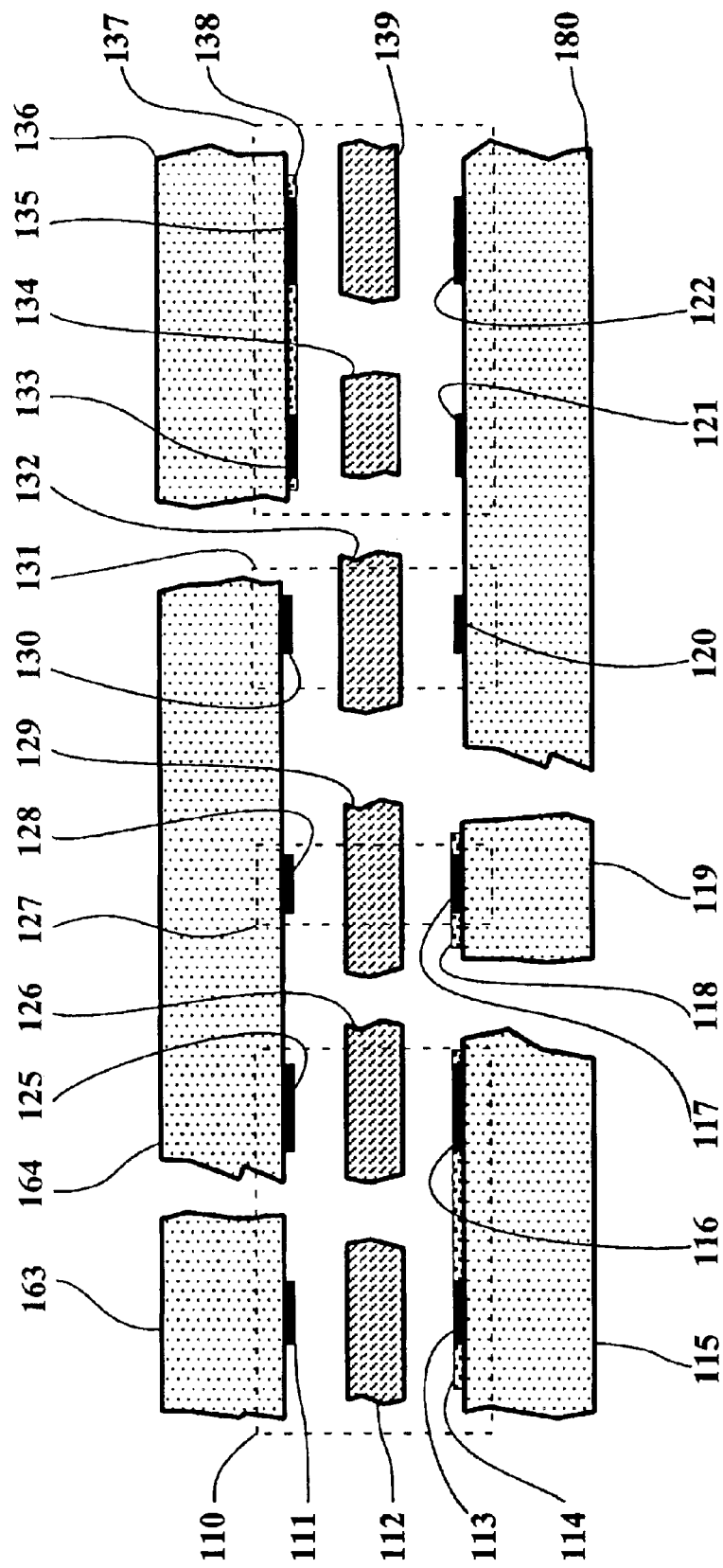
FIG. 10 depicts an illustrative portion of a "leapfrog" integrated system constructed entirely from dies.
Figure 13:
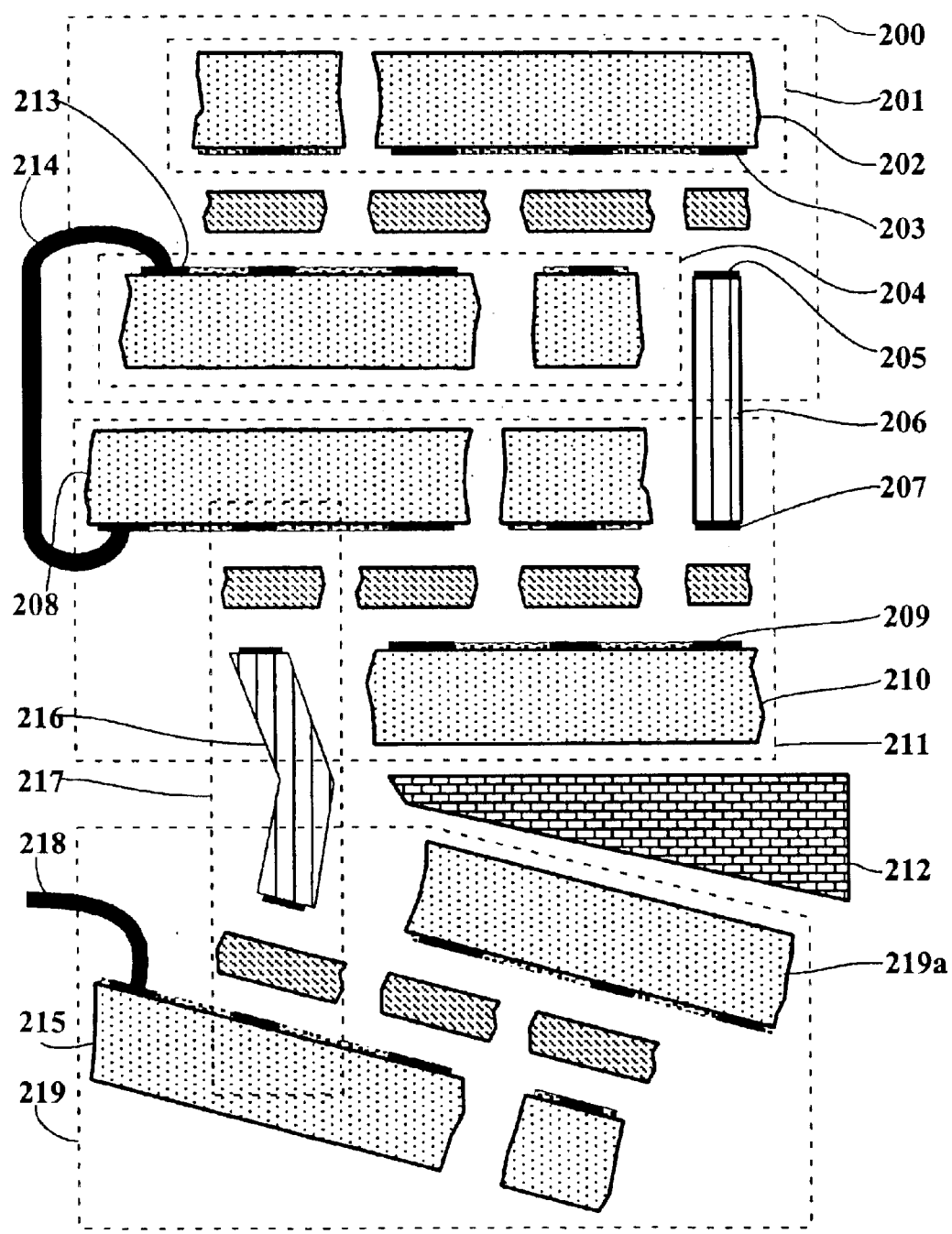
FIG. 13 depicts a modular electronic system wherein a plurality of (optionally superconducting) electronic devices on implemented on a flexible substrate.

Bridging die 89 preferably comprises a part of a very large system wherein a multiplicity of substrates are tied together with bridging modules, in this example a die. Systems formed from a multiplicity of substrates bearing microelectronic devices and/or wiring need not be primarily planar like those depicted in FIGS. 5 and 7, and can be extremely large: Barn Door Scale Integration is possible using the invention. FIGS. 9, 10, and 13 extend the teaching to exemplary extensible non-planar and planar arrangements.

Buckling modes may arise at the edges overlapped by bridging modules, particularly in vibration-rich environments. Such bending or expansion modes may effectively limit the diameter of buildable systems. Fortunately, these issues are well-understood by practitioners, and can be ameliorated in the preferred embodiment by a combination of compliant, mechanically damping dielectric or mounting materials, and use of compensatingly larger half-capacitors and circuit thresholds near the affected regions.

Figure 8:
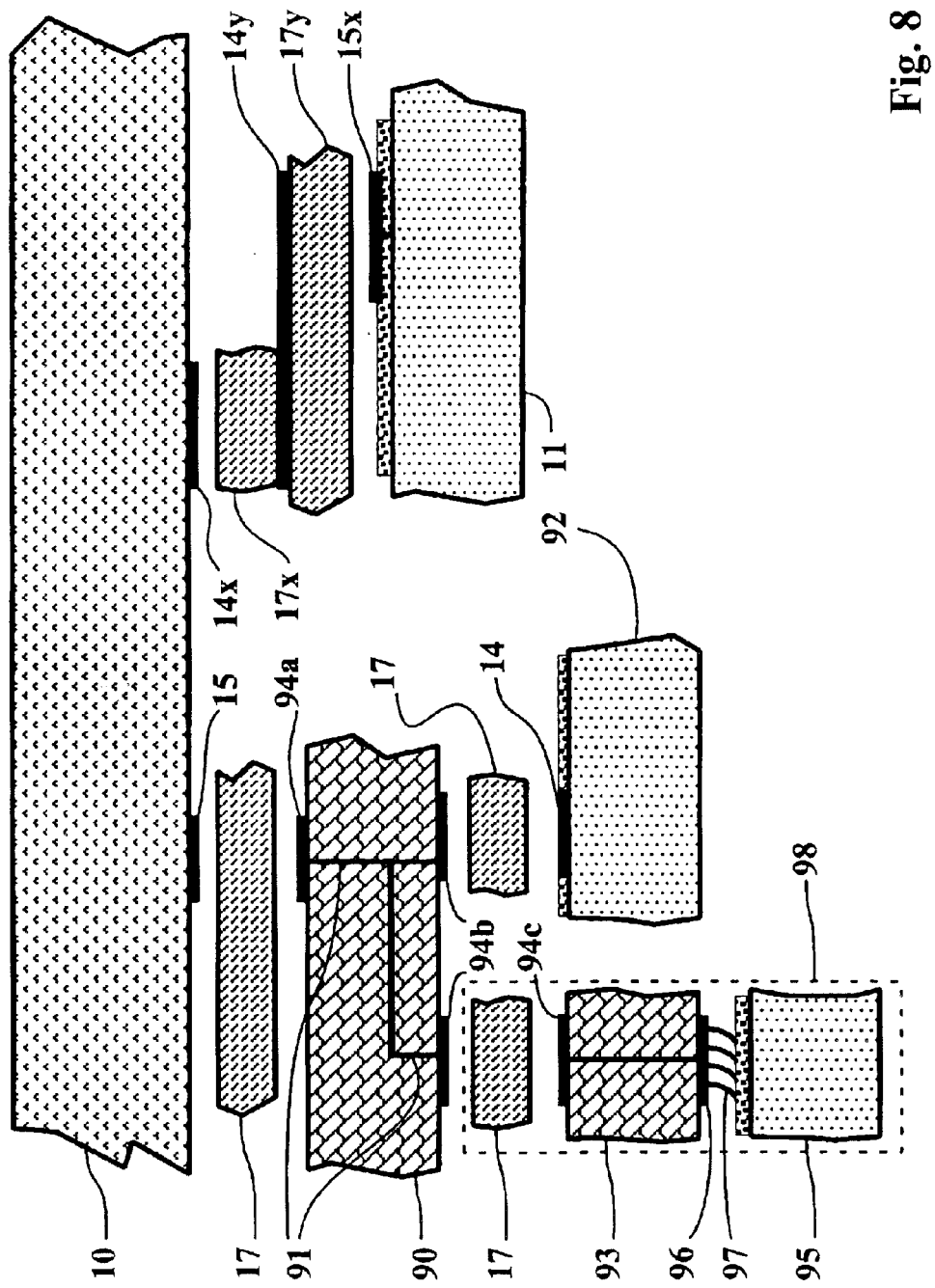
FIG. 8 depicts an illustrative portion of a non-planar modular electronic system that includes multiple dies and substrates.

Reference is now made to FIG. 8, which depicts an illustrative portion of a modular electronic system that includes multiple dies 11, 92, 95 and substrates 10, 90, 93. In FIG. 8, die 11 is capacitively coupled to substrate 10. Note that the multi-storey structure of the capacitive signal path coupling chip 11 to substrate 10 (by way of conductor 14y, illustratively depicted as having been fabricated monolithically amidst dielectrics 17x and 17y) creates an "effective overlap" between half-capacitors 14x and 15x, which are not "substantially overlapped" plates. Substantially overlapped half-capacitors, such as 94a and 15, are effectively overlapped ipso facto.

Substrate 10 is also capacitively coupled to substrate 90. Within substrate 90, wiring 91 connects a plurality of half-capacitors 94a to a plurality of half-capacitors 94b, thereby providing an AC signal path between substrate 10 and substrate 93 and between substrate 10 and die 92. Substrate 93 also connects conductively to die 95 via a plurality of conductive leads 97, bonded to a plurality of conductive pads 96 on substrate 93.

Illustratively, substrate 10 may comprise a printed wiring board, while substrate 90 may comprise a multilayer ceramic substrate. Substrate 93 may be encapsulated within a plastic carrier package 98, which package also advantageously encapsulates die 95. Modules 92 and 11 may represent separate dies or different portions of the same die or wafer.

Those ordinarily skilled in the art will recognize numerous alternative arrangements of single or multiple dies coupled to or between single or multiple substrates by means of the invention. Such alternative arrangements are advantageously selected to accommodate particular physical, mechanical, electrical, thermal, and economic constraints of a particular system application. The distribution and costs of all components—on dies or substrates, as higher level modules of them, the thermal and environmental systems, the mechanical chassis, and so forth—can be considered in the overall system-wide Level 0–4 package optimization. For example, a substrate bearing capacitive contacts at right angles to the interconnection orientation may facilitate construction of Level 3 packages akin to backplanes or card cages, as in FIG. 16, and the given form factor may therefore influence the choice of circuitry in detail and assignment of circuits to modules.

Flexible or articulated substrates may be used to further extend the number of feasible physical arrangements. Abutting or partially overlapping substrates may be used to couple signals, clocks, etc. throughout a large system, as in FIGS. 9–10. Using means for capacitive coupling to link regions bearing powered microelectronic devices to others or to substrates bearing wiring, numerous alternative regular or irregular topologies follow obviously from the present invention, including tilings, lattices, or cluster configurations. Arrangements of organized congregations of such regions, such as modular ensembles of dies and/or substrates, likewise follow directly from the invention. To the extent that such alternative system arrangements employ various claimed aspects of the invention, such arrangements shall be considered within the scope of the present invention.

Reference is now made to FIG. 9, which depicts an exemplary portion of a large-scale modular system constructed in accordance with the invention. FIG. 9 illustrates a so-called "leapfrog" geometry: Signals "leap" from a first module to a second via a bridging module which partially overlaps the first and second modules. Using this leapfrog assembly technique, large-scale systems can be constructed very economically.

In FIG. 9, a portion of die 115 overlaps substrate 123 such that half-capacitors 111 and 113 align to provide a capacitive signal path between substrate 123 and die 115. The leapfrog arrangement continues with substrate 124, which partially overlaps and capacitively couples to die 115 via coupled half-capacitors 125 and 116. Similarly, substrate 140 partially overlaps and capacitively couples with substrate 124, thus extending the leapfrog configuration. Advantageously, the leapfrog technique can also be used to distribute power from one die/substrate to the next through, for example, the previously mentioned fuzz-button connections.

Also depicted in FIG. 9 is a non-bridging die 119 (not part of the leapfrog arrangement) having a plurality of active devices and coupled to substrate 124 via a plurality of coupled half-capacitors 117. Similarly, non-bridging die 136 illustratively employs an off-die signal path (in substrate 140) to couple circuits on active surface 138 proximate to half-capacitors 133 and 135.

Several advantages of the leapfrog geometry are worth noting. First, the negative effects of thermal expansion are greatly reduced as compared, for example, to a similarly sized system in which a single substrate and die mate. Thus, if die 115 runs very hot and causes a slight misalignment of half-capacitors 116 and 125, the alignment of half-capacitors 117 and 128 and half-capacitors 120 and 130 will remain largely unaffected.

Another advantage of the leapfrog configuration is its easy reparability. The top level modules 123, 124 and 136 can be individually replaced, if defective, without further disassembly of the system. Even replacement of the bottom modules 115, 119 and 140 requires relatively little disassembly in a system having a large number of modules.

Still another advantage of the leapfrog configuration is the high performance of its inter-die connections. As previously noted, coupled half-capacitors (or coupled transmission lines) have lower parasitic inductance than similarly sized conductive connections. Additionally, since the modules in the leapfrog configuration overlap, the lengths of signal paths will be shorter than, for example, conventional technologies which utilize peripherally distributed pins, such as PC boards or MCMs with surface mounted dies. The combination of shorter signal paths and lower parasitic inductances can lead to a substantial increase in overall system performance.

The leapfrog configuration can also be denser than conventional planar packaging techniques. Therefore, clock skew problems are significantly mitigated. Advantageously, a clock signal can be broadcast, preferably from a centrally located module in a leapfrog integrated system, via a plurality of clock distribution paths, each of which comprises one or more transmission line segments linked by coupled half-capacitors. Such clock distribution paths preferably do not include restoring logic (e.g., transmitter and/or receiver circuits) and thus avoid introducing unnecessary gate delays into the clock signal.

In conventional MCM systems, great effort is expended to reduce the dielectric factor of the substrate material, since the speed of signal propagation scales inversely with the square root of the dielectric factor. Advantageously, the leapfrog configuration of the present invention reduces the lengths of signal paths, which provides a linear improvement in signal propagation time. Accordingly, low latency can be achieved using the invention without need for exotic, low dielectric factor substrates.

A further advantage of the leapfrog configuration is that it enables integration of heterogeneous, incompatible modules. The voltage levels, materials, etc. can be different among semiconductor die 115, die 119, and die 136, thereby permitting a system designer to exploit the particular advantages of various technologies within a densely integrated system. Likewise, the properties of substrates 123, 124 and 140 can be selected to enhance performance, reliability, reparability, cost, and other factors. For example, die 115 might be consumer-grade silicon CMOS, die 119 might bear microelectronic devices on diamond, and die 136 might be a high-temperature superconducting material bearing Josephson Junctions, while substrate 123 might be a laminate material such as FR4, substrate 124 might be an active substrate formed with a thin-film such as lines lithographed onto chips-first plane, and substrate 140 might be a thick-film fabricated xerographically.

The cheapness of interconnect and amenability to heterogeneous integration means that small dies or modules may be used to support partial or specialized functions. Conventional technology, in contrast, generally attempts to bundle multiple functional subsystems into large-scale integrated circuits due to the cost of off-die signalling, often compounding manufacturing costs and sacrificing performance (due to use of suboptimal technologies for particular components, e.g., analog, etc.). Some important examples of components which a capacitively coupled multichip system might carry include logic devices (e.g., Field Programmable Logic Arrays), (field-programmable) gate arrays, processors, arithmetic units, bitwise manipulation units (e.g., cellular automata), permutation units, interconnection networks, memory, nanomechanical actuators, sensors, arrays of fractional analog or digital components (e.g., resistors of various sizes), or others.

Reference is now made to FIG. 10, which depicts an illustrative portion of a leapfrog integrated system constructed entirely from dies. Advantageously, replacement of substrates 123, 124 and 140 (of FIG. 9) with dies 163, 164 and 180 permits denser integration of logic and other circuits, as well as perfect matching of thermal coefficients of expansion. Otherwise, the properties and advantages of the FIG. 10 die-die-die leapfrog configuration are analogous to those of the FIG. 9 die-substrate-die leapfrog assembly or FIG. 7 substrate-die-substrate assembly, and therefore need not be reiterated. Power is advantageously delivered through the interstices between dies in such a system, rather than through either perforations or diffused contacts through dies, and may advantageously employ a dedicated power substrate and pressure plate.

Figures 11A, 11B:
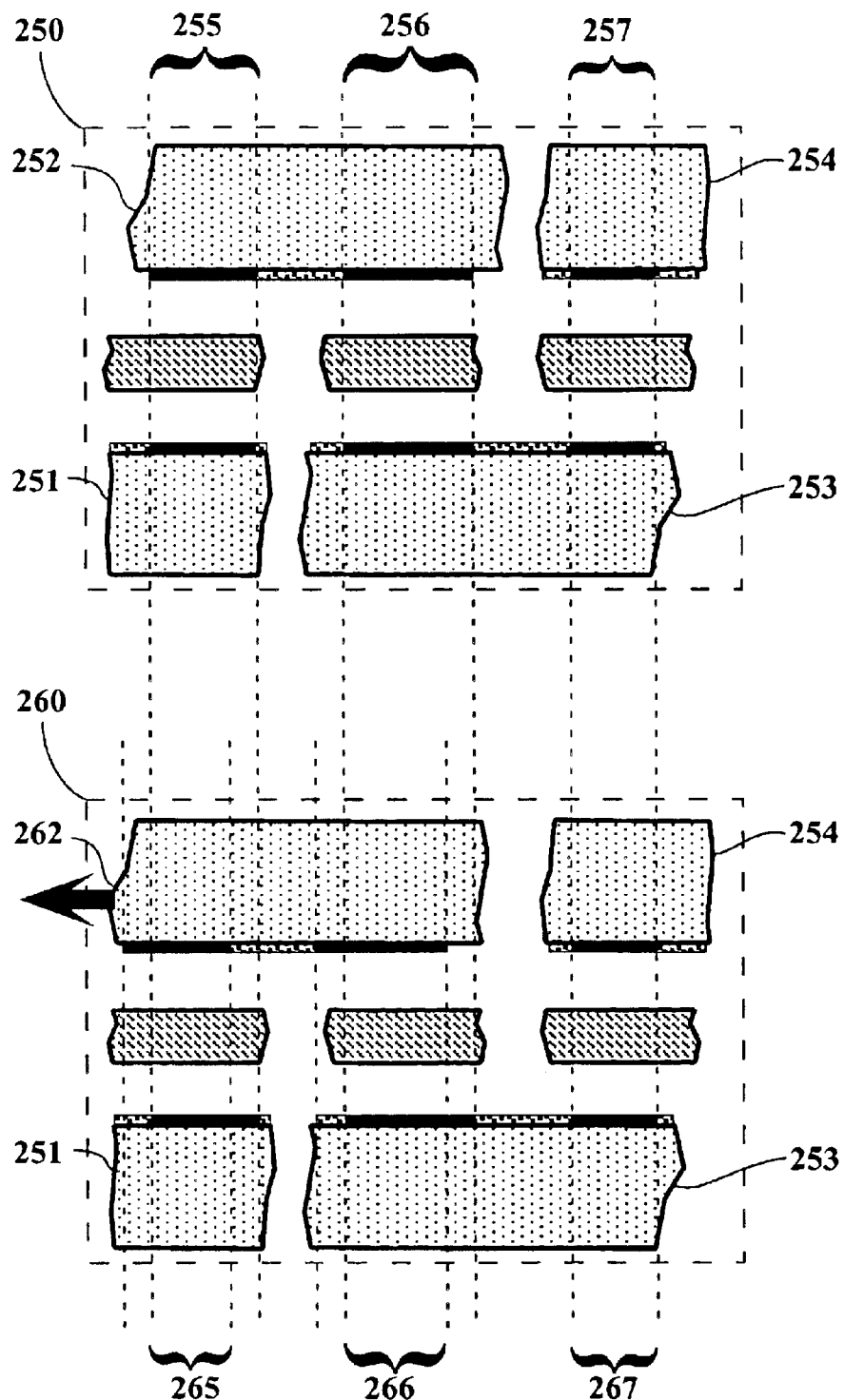
FIGS. 11A–B depict the effect of misalignment between capacitor plates in a capacitively coupled modular system.

Reference is now made to FIGS. 11a–b, which depict the effect of misalignment between capacitor plates in a capacitively coupled modular system. FIG. 11a shows a portion of a capacitively coupled system wherein dies 251, 252, 253 and 254 are perfectly aligned so as to define overlapping regions 255, 256 and 257 identical to the size of the half-capacitor plates. In this idealized configuration, capacitive signal coupling is maximized and unwanted crosstalk is minimized.

FIG. 11b shows the same portion wherein die 252 (of FIG. 11a) has been replaced by a misaligned die 262. The misalignment of die 262 decreases the area of regions 265 and 256 which represent overlap of the misaligned die's half-capacitors. Therefore, the magnitude of the signal coupled between die 262 and dies 251 and 253 will diminish; crosstalk between die 262's half-capacitors and other proximate conductive signal lines or half-capacitors may increase as well. Importantly, however, the misalignment of die 262 does not affect the coupling or alignment between other dies not directly coupled to 262, for example, die 254.

If misalignment of particular dies can be anticipated (e.g., the dies run very hot) the size of the half-capacitors associated with those particular dies can be advantageously increased to compensate. Importantly, only those particular half-capacitors associated with the troublesome dies need be enlarged. Therefore, there is no significant decrease in the overall density of off-die connections in the system. The low cost or inherent tolerance to misalignment of coupled half-capacitor junctions makes these junctions useful in many different applications, not just in multichip modules. For example, cables utilizing half-capacitor connections potentially provide cost, reliability, size and performance advantages over conventional cables (See FIG. 21). Likewise, high pin-count modular consumer products, such as dockable laptop computers, will realize similar benefits by use of the invention. Pad-limited chips in general can advantageously be implemented using the invention. Notable such chips typically compose signal routing networks; binary integrated circuits whose size is limited by the number of permissible simultaneous 1-0 or 0-1 transitions, and many very small chips.

Figures 12A, 12B:
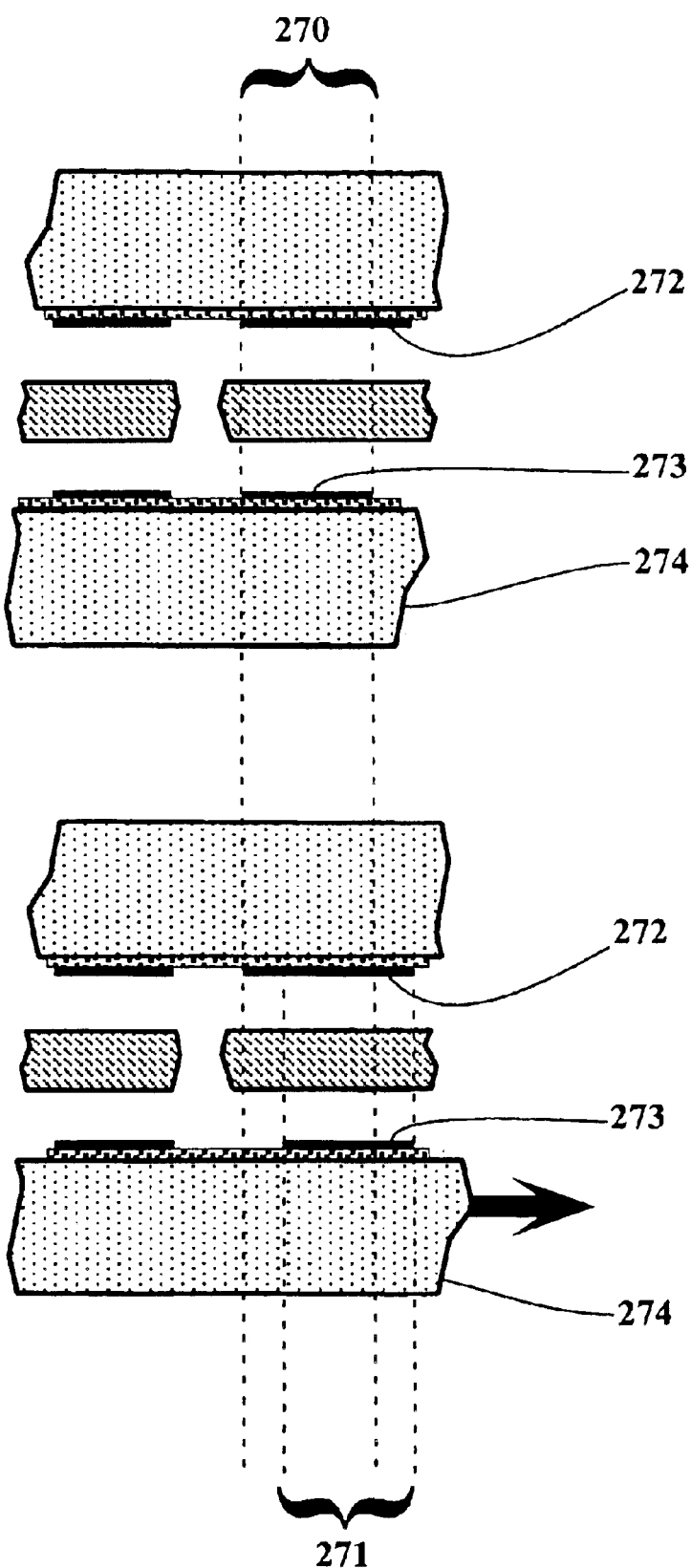
FIGS. 12A–B depict the use of an oversized half-capacitor plate to minimize the impact of misalignment in a capacitively coupled system.

Reference is now made to FIGS. 12a–b, which depict the use of an oversized half-capacitor plate to minimize the impact of misalignment. In FIGS. 12a–b, half-capacitor 272 is intentionally made larger than half-capacitor 273. This allows die 274 to expand substantially (as depicted in FIG. 12b) without affecting the area of half-capacitor plate overlap (i.e. 270 versus 271).

Another use for an oversized half-capacitor plate such as 272 is to terminate some of the fringing field lines from the smaller half-capacitor plate 273 which would otherwise terminate on other nearby structures. This advantageously reduces the amount of crosstalk received by the smaller half-capacitor plate 273. Reference is now made to FIG. 13, which depicts an exemplary portion of a heterogeneously integrated system and illustrates various techniques for integrating modules in accordance with the invention.

The system of FIG. 13 illustratively depicts two hierarchical levels arranged in a substantially space-filling package. However, the integration techniques exemplified therein are extensible systems utilizing deeper levels of hierarchical encapsulation in 2D or 3D. The system comprises modules 200, 211 and 219. Module 200 comprises capacitively coupled chips 201 and 204. Module 211 comprises capacitively coupled chips 208 and 210. Module 219 comprises capacitively coupled chips 215 and 219a.

FIG. 13 exemplifies a variety of means for coupling modules 200, 211 and 219 in accordance with the invention. Cable 214 conductively couples chip 204 of module 200 to chip 208 of module 211. A capacitive signal path is provided between chip 202 of module 200 and chip 210 of module 211 via half-capacitor 203, half-capacitor 205, interconnection substrate 206, half-capacitor 207 and half-capacitor 209.

The mounting of chips 215 and 219a in module 219 is angled against a spacer 212 to accommodate an illustratively depicted externally imposed form factor requirement. Flexible interconnection substrate 216 completes a capacitive signal path 217 between chip 208 of module 211 and chip 215 of module 219, and is preferably fabricated from a flexible material so as to accommodate non-planer form factor constraints. Chip 215 of module 219 receives further input from external conductive or optical connection 218.

Although depicted in partially exploded view, it is apparent that the partial system depicted in FIG. 13 makes up a substantially space filling assembly. Thus, the space filling assembly depicted on FIG. 13 may itself be a modular part of a larger modular electronic system. Systems implemented in volumetrically dense 3D space filling packages generally have shorter average path lengths and faster clock rates than 2D implementations.

Heat sinks are not explicitly shown in FIG. 13, but may be easily positioned as disclosed elsewhere herein. Spacer 212, in addition to providing mechanical support to meet externally imposed form factor requirements, also advantageously conducts heat away from chips 210 and 219a.

Figure 14:
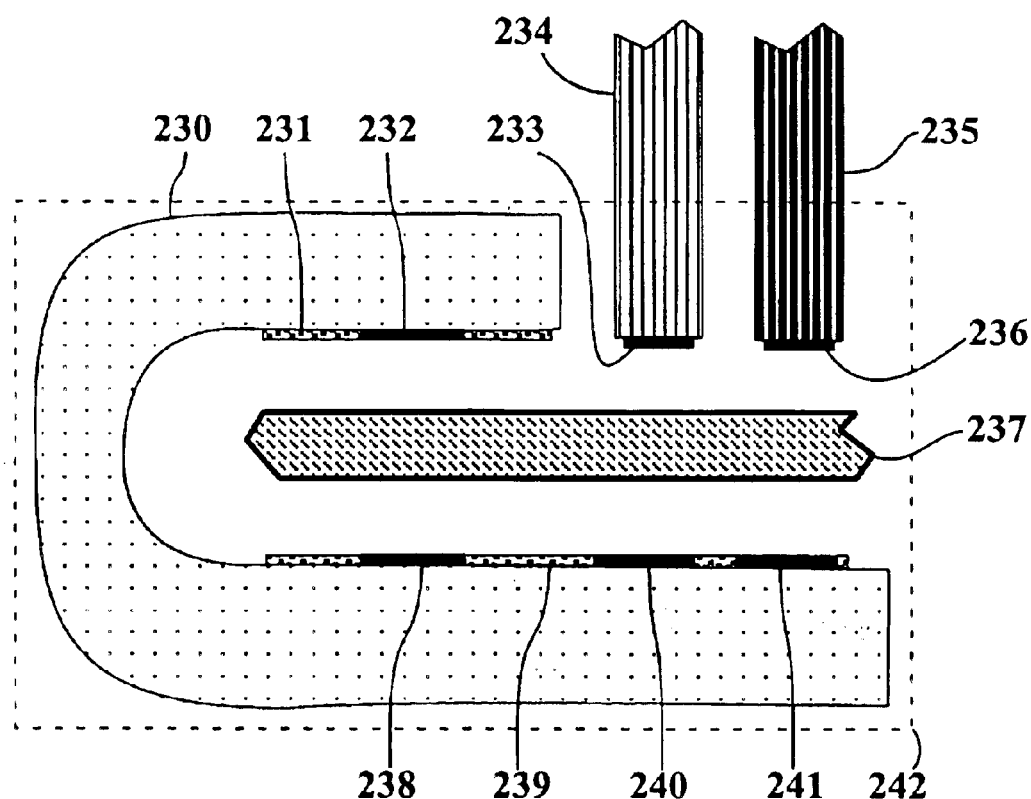
FIG. 14 depicts an illustrative portion of a large-scale, heterogeneously integrated modular electronic system constructed in accordance with the invention.

Reference is now made to FIG. 14, which depicts an embodiment of the invention wherein a plurality of optionally superconducting devices are implemented as a layer on a flexible or contoured substrate. Prefabricated die 231 and 239, each bearing a plurality of microelectronic devices, are affixed to opposing faces of a single substrate 230. Capacitive signalling between die 231 and 239 is provided by coupled half-capacitors 232 and 238, also implemented on or otherwise affixed to opposing faces of substrate 230 and advantageously need not be planar.

When material constraints permit, both the microelectronic devices and the half-capacitors are advantageously implemented in substrate 230 by monolithic fabrication techniques. For example, regions of material may be deposited onto substrate 230 or otherwise processed into it (e.g., by ion implantation). Advantageously, Josephson Junction devices may be implemented in a (preferably high-$T_C$) superconducting thin film painted or otherwise deposited onto substrate 230.

Substrate 230 is contoured so as to provide adequate capacitive coupling between half-capacitors 232 and 238. Although illustrated as a simple U-shape, other shapes for substrate 230, such as spirals or coaxial cylindrical shapes, may also be used.

Dies 231 and 239, as well as half-capacitors 232, 238, optical sensor 240 and power contact pad 241 are preferably fabricated prior to deformation of substrate 230. Substrate 230 may be formed either from two or more distinct pieces bonded or otherwise melded during manufacture, from a flexible material, or from a single piece of rigid material deformed during manufacture by heat or other appropriate treatment.

Power and ground may be provided to the devices by conductive or radiative contact to power pad 241, or by on-board batteries. Advantageously, particularly in superconducting systems, AC powering means 235 may communicate power to pad 241 without need for mechanical contact.

External signalling is advantageously provided by a light-pipe 234 optically coupled, through dielectric 237, to an optical sensor (or driver) 240. Alternatively, capacitive or magnetic means, as detailed elsewhere herein, may be used.

Figure 15:
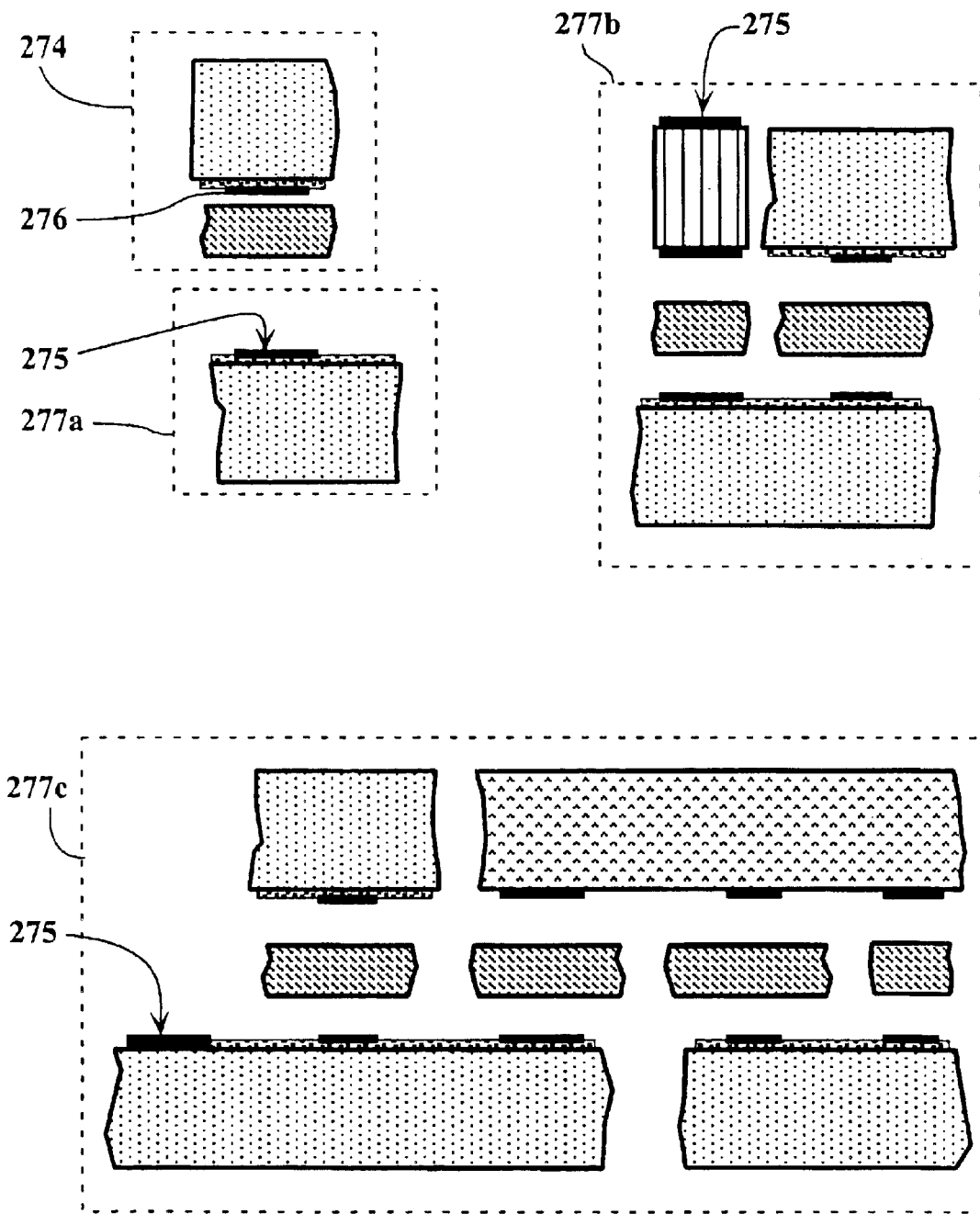
FIG. 15 depicts the use of a uniform capacitive interface to couple modules of varying sizes and packaging levels in accordance with the invention.

Reference is now made to FIG. 15, which depicts the use of a uniform capacitive interface to couple modules of varying sizes and packaging levels. In FIG. 15, the use of a uniform capacitive interface 276 on module 274 and a uniform capacitive interface 275 on modules 277a–c permits interchangeable connection of modules 277a–c to module 274.

Capacitive interfaces 275 and 276 are illustratively depicted as a single half-capacitor and a half-capacitor with bonded dielectric portion, respectively. In actual systems, such capacitive interfaces will preferably comprise a plurality of half-capacitors (and optional conductive contacts), disposed in a standardized footprint. Advantageously, capacitive interface 276 may more half-capacitors than are coupled to interface 275, the additional half-capacitors on interface 276 being used to accommodate coupling to test-modules, engineering changes, etc.

In FIG. 15, alternatively connectable modules 277a–c illustratively represent different levels in the packaging hierarchy: module 277a illustratively comprises a Level-0 unpackaged die; module 277b illustratively comprises a Level-2 packaged module; and, module 277c illustratively comprises a Level-2 or Level-3 packaged module.

The use of standard capacitive interfaces 275 and 276 in accordance with the present invention facilitates improved methods for product and/or system evolution. In terms of product evolution, a given module is preferably implemented initially utilizing a semicustom assembly of standard or semicustom parts (e.g., modules 277b or 277c). As the product matures and production volume increases, the module may be advantageously re-implemented as a custom ASIC die (e.g., module 277a) and installed into the product without need for any higher-level system modifications. Other sequences of product evolution, such as replacement of module 277c with 277b or replacement of either with a Level 1½ MCM implementation, are also possible within the scope of the present invention.

To illustrate the system evolution aspect of the present invention, one may view modules 277a–c as different implementations of a functional block of a massively parallel computer. Depending on the requirements of a particular application, the computer manufacturer could alternatively install a low performance module 277a, a medium performance module 277b, or a high performance module 277c. Similarly, such functional modules can be advantageously upgraded as the overall requirements of a particular system in the field evolves.

A pervasive problem in hierarchically decomposing a design in the prior art encompasses the partitioning of high level functions, followed by the discovery that a low level module cannot be implemented effectively in a given technology, followed by the need to repartition at a high level again to avoid the suboptimal (e.g., very expensive) technology mix. Underlying both the improved product evolution and system evolution provided by the invention is the fact that the invention permits implementation of common dense, high performance interfaces uniformly to all the levels in the packaging hierarchy. The hierarchical decomposition design process can exploit a uniform interface and functional specifications for each submodule in accordance with the invention. The invention's support for common interfaces assures that a submodule specified early can be implemented late in the process, even if multiple dies or different technologies are needed to accomplish the function. Thus, the invention greatly enhances a designer's ability to exploit hierarchical decomposition, since the implementation of particular modules in a hierarchical system is not necessarily constrained by the interfaces between modules. If, as the implementation proceeds, the anticipated technology proves inappropriate for implementing a submodule, an alternative technology or MCM can generally be substituted without reworking higher-order partitions.

Figure 16:
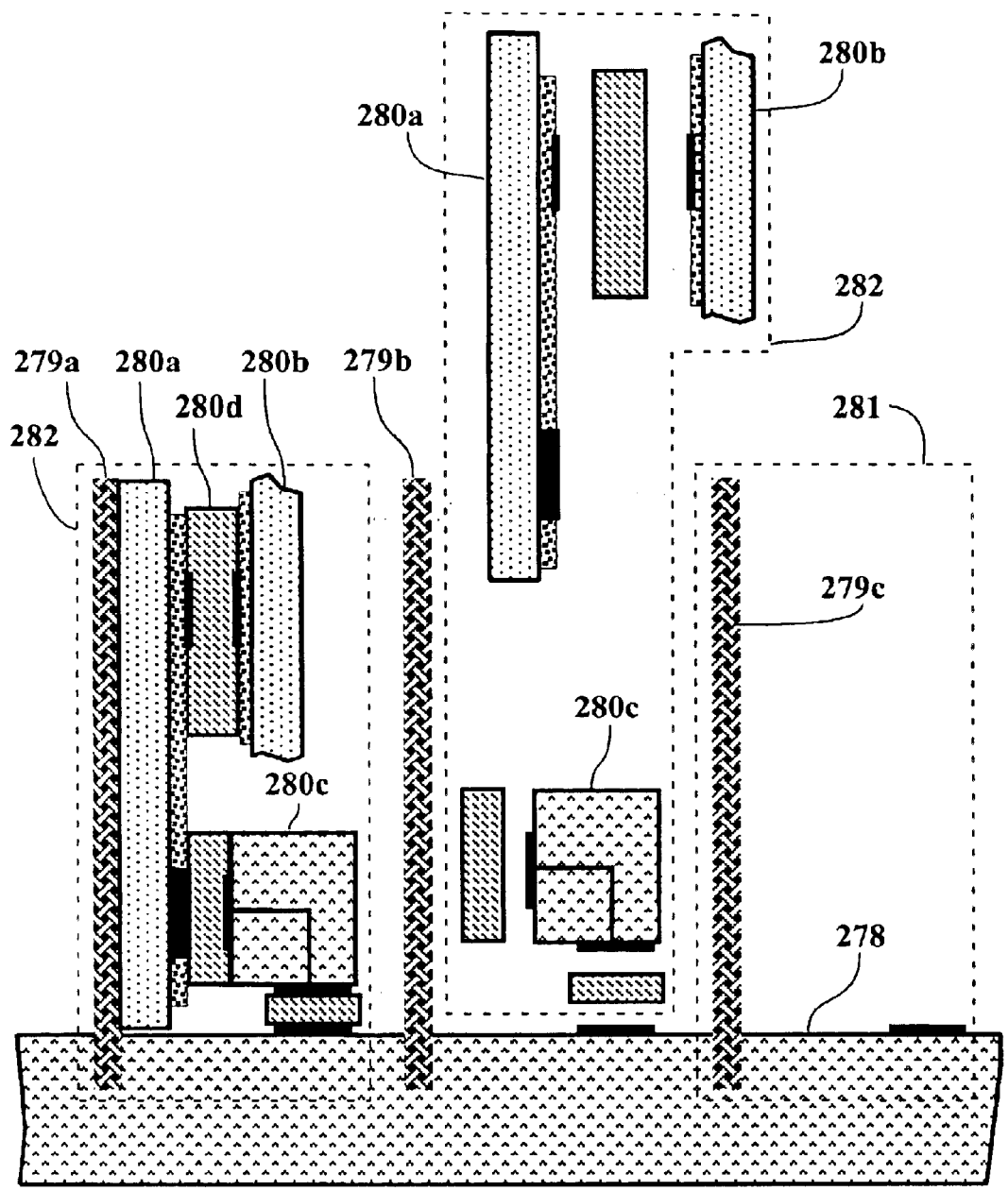
FIG. 16 depicts a modular system in which a plurality of modules capacitively couple to a backplane.

Reference is now made to FIG. 16, which depicts a modular system in which a plurality of modules capacitively couple to a substrate mounted to a supporting chassis, illustratively depicted as a backplane. Substrate 278 comprises the backplane and includes a plurality of module mounting supports 279a–c. Supports 279a–c are preferably fabricated from a material of high thermal conductivity, so as to enhance heat dissipation from the modules 280a affixed thereto. Each backplane slot 281 preferably accommodates a modular subsystem 282, illustratively mounted on support 279a and depicted in an exploded view adjacent to support 279b.

Figure 6:
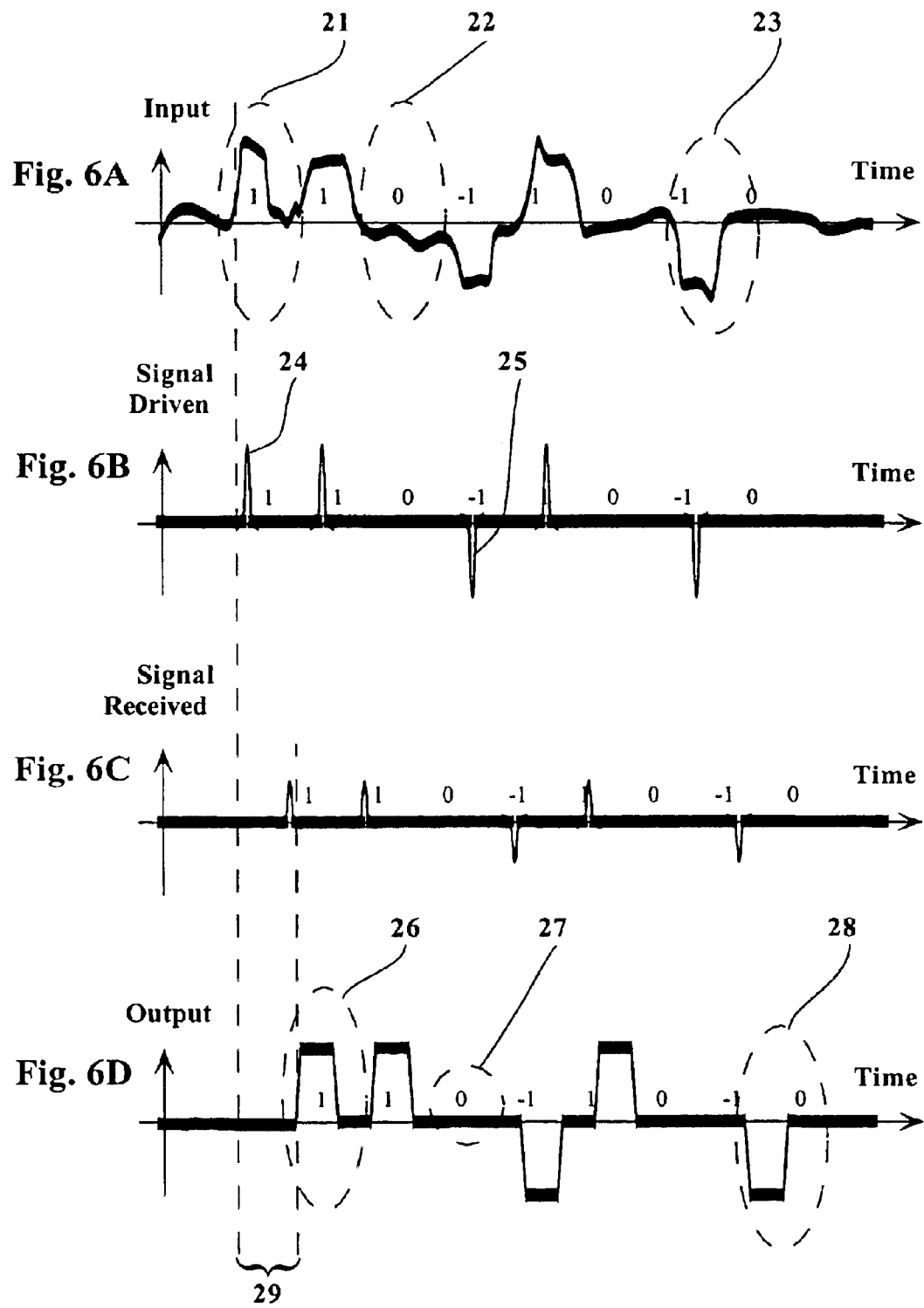
FIGS. 6A–D depict the exemplary waveforms for a digital (or multistate) signal capacitively coupled from a die to a substrate in accordance with the invention.

Modular subsystem 282 includes a plurality of dies 280a–b and a bridging substrate 280c. Die 280a capacitively interconnects to die 280b. Conductive power connections are not shown; these can be implemented as shown in FIGS. 4–6. Bridging substrate provides a capacitive signal path between die 280a and substrate 278. Substrate 278 preferably includes a plurality of terminated transmission lines (not depicted, but generally as shown in FIG. 5) which interconnect the various modular subsystems 282.

Figure 17A:
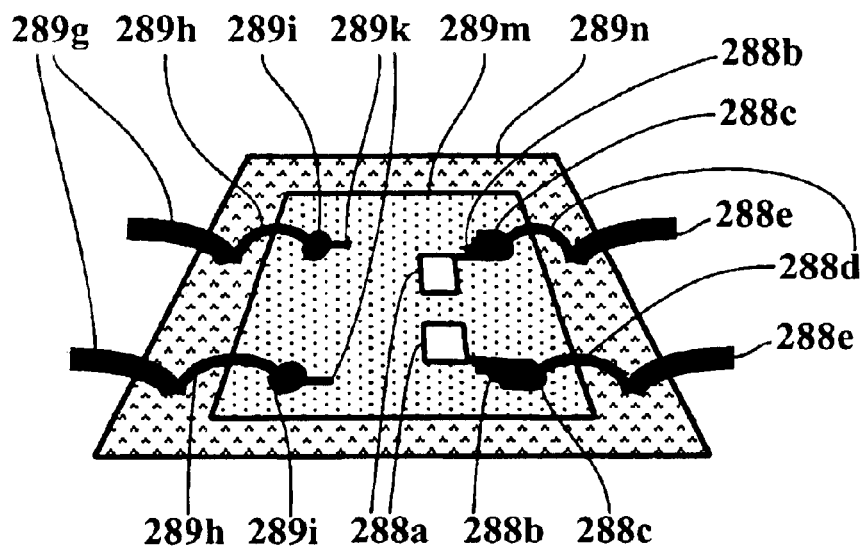
FIGS. 17A–B depict connection methods in accordance with the prior art and the present invention.

Reference is now made to FIG. 17A, which depicts a perspective of a prior art face-up level 1 package. A single die 289m, typically formed of silicon, is supported by a substrate 289n, typically formed of an epoxy or ceramic material. A plurality of power leads 289g and signal leads 289e are typically formed from aluminum struts. Power leads 289g conductively contact power/ground contact pads 289i via wire-bonds 289h; ground and power rails 289k distribute voltage to circuits implemented on die 289m. Signal leads 288e conductively couple to I/O circuitry 288a by means of low-resistance fan-out 288b, contact pads 288c, and wire-bonds 288d.

FIG. 17A illustrates a fundamental disadvantage of the prior art: useful real estate on die 289m is wasted to support conductive signalling to other chips and/or other package levels. In FIG. 17A, such real estate for signalling includes contact pads 288c, low-resistance fan-out 288b to the pads, and drivers/receivers 288a. In addition to the costs of excess real estate utilization, the prior art also requires bond wires 288d and the package itself 288n. If pads 288c are limited to the periphery of the die 289m (thereby shortening fan-outs 288b), additional real estate may be needed to provide enough perimeter area to accommodate the pads. Thus, designs requiring a high density of I/O terminals further increase the fraction wasted chip real estate. Finally, the presence of substrate 289n increases the size of the overall package assembly to many times of that the bare die 289m.

FIG. 17A also depicts some of the sources of reliability and performance problems commonly encountered in the prior art. The series inductance of a contact junction 288b–288c and bond lead 288d is typically very high (e.g., 0.05–10 nH), and serves as a low pass filter, thereby necessitating more power to drive signal lines at higher clock rates. Conductive contacts are large relative to logic gates, and do not scale desirably as clock rates increase and lithographic dimensions decrease. Finally, conductive contact junctions entail mechanical contact, thereby limiting ability to assemble and disassemble the connections to die 289m and decreasing the reliability of such connections.

Figure 17B:
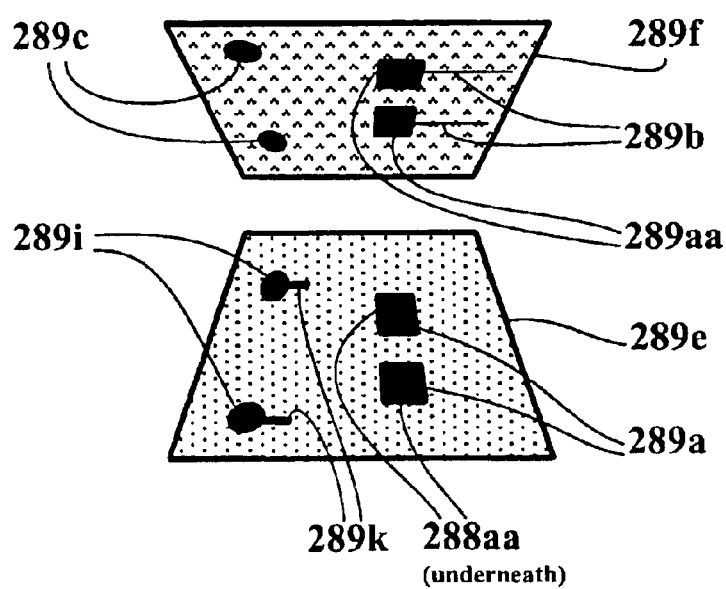

Reference is now made to FIG. 17B which depicts an exploded view of illustrative flip-chip Level 1 modular system implemented in accordance with the present invention. Substrate 289f mates with die 289e, and advantageously provides signalling interconnections 289b, preferably implemented as terminated transmission lines. Power/ground contact pads 289i mate reversibly with conductive fuzz buttons 289c so as to provide a reversible conductive interconnection between substrate 289f and die 289e. Alternatively, substrate 289f can be adapted such that contact pads 289i mate with conventional conductive contacting means, such as solder bumps, wire-bonds, pins or ball grid arrays. Fan-outs 289k distribute power to various circuits implemented on die 289e. One or more drivers and/or receivers 288a, preferably utilizing pulse signalling and implemented underneath half-capacitor plates 289a, signal between matched half-capacitor plates 289a–aa across a gap. The gap is preferably filled with a material having a high die electric factor.

Comparing the illustrative single-die system of the invention (FIG. 17B) to the typical single-die system of the prior art (FIG. 17A), it is apparent that the invention frees up most of the real estate devoted to fan-outs 288b and contact pads 288c, making this area available for the implementation of useful circuitry in FIG. 17B. Further, the invention eliminates the costs associated with elements with bond wires 288e and external signal leads 288d; and the cost for the conductive power contact pads 289c in the invention is likely to be less than the sum of the costs of power bond wires 289g and leads 289h in the prior art.

The cost per square inch of substrate of 289f and the associated dielectric is roughly comparable to that of substrate of 289n. However, since substrate 289n is likely to be smaller than substrate 289f, the invention provides reduced substrate cost as well. Since the system of the invention (FIG. 17B) is generally denser than the prior art system (FIG. 17A) the invention will require shorter signal lines, thereby decreasing latency and attenuation loss.

Certain prior art flip-chip technologies, such as solder bump, avoid the real estate needed for bond wires 288b and leads 288c. However, such prior art technologies still introduce the undesirable series inductance associated with conductive interconnections. Moreover, the small size of coupled half-capacitor junctions allows large numbers of junctions to be fabricated cheaply, densely and at high yield. Further, the simple mating process provided by the invention allows assembly of the die into MCMs at the foundry, thus avoiding the need to ship die elsewhere in order to manufacture MCMs or boards.

Figure 18A:
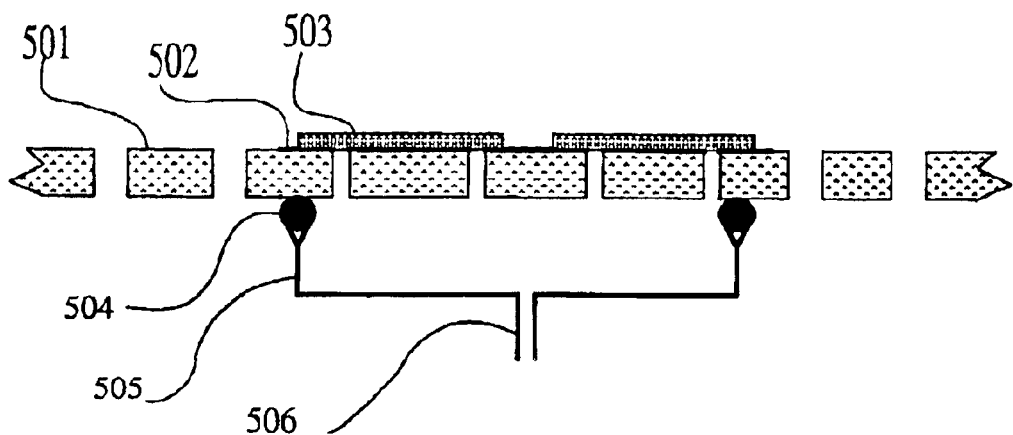
FIGS. 18A–C depict several steps in the assembly of an MCM (such as those of FIGS. 4–5) in accordance with the invention.
Figure 18B:
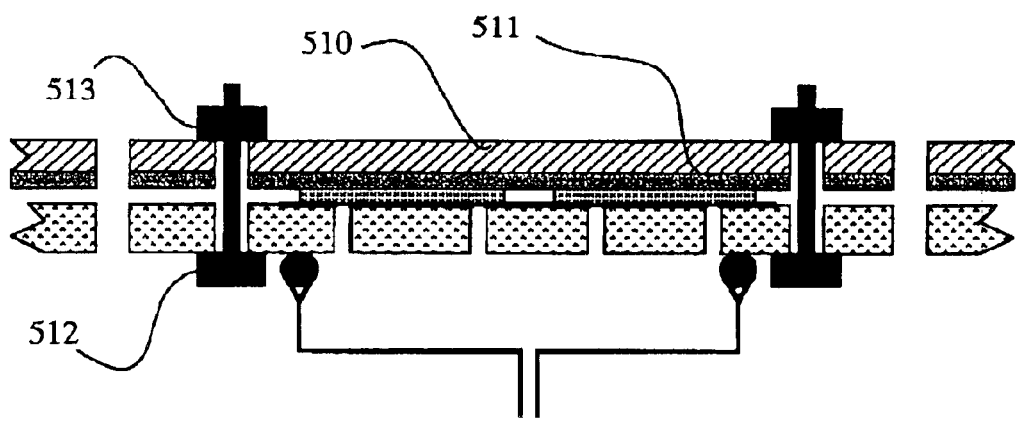
Figure 18C:
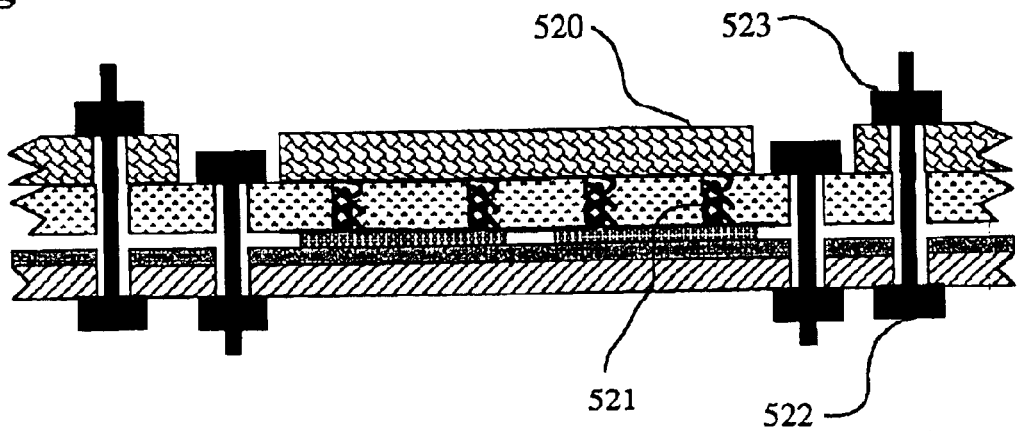

Reference is now made to FIGS. 18A–C, which depict several steps in the assembly of an MCM (such as those of FIGS. 4–5) in accordance with the invention. While a number of methods could be used, FIGS. 18A–C illustrate an approach which uses a vacuum hold-down during assembly.

Referring now to FIG. 18A, a plurality of die 503 are aligned with a high resolution substrate 503, coated with a dielectric 502, using optical feedback and fiducial marks on both die and substrate. Such fiducials can be tracked through holes in the substrate under the die, or by infra-red imaging through silicon wafers. Registration of the die 503 can be verified, and alignment refined, by measuring and maximizing the capacitance between selected pairs of die and substrate half-capacitors. Interferometry by the pick 'n' place apparatus may also be used.

Once all die are aligned, a vacuum is drawn under substrate 501—by vacuum chamber 505, vacuum hose attachment 506 and 0-ring 504—so as to hold the die 503 firmly in place.

Referring now to FIG. 18B, an elastomeric thermal conductor 511 and pressure plate/heat sink 510 are then positioned and locked into contact with the back side of the die 503 by bolts 512 and nuts 513, thereby forming a rigid assembly.

Referring now to FIG. 18C, the rigid assembly is inverted and conductive contacts 521 are placed into the high resolution substrate 501. The power substrate 520 is placed over the contacts. Assembly of the module is completed by compression of the power substrate against the pressure plate using bolts 522 and nuts 523.

An advantageous alternative assembly technique involves the use of ultra-violet curable adhesives. In this method, the substrate is coated with a dielectric material, a UV curable adhesive is applied, the die are then individually positioned and aligned, and UV radiation is applied to cure the adhesive.

Figure 19:
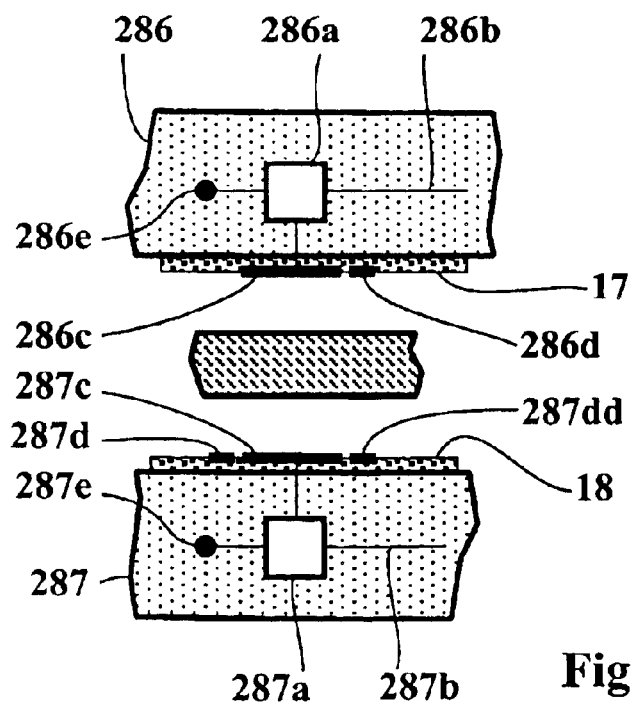
FIG. 19 depicts a capacitive signal path including means for adjusting overall gain.

Reference is now made to FIG. 19, which depicts a capacitive signal path including means for adjusting overall gain. The need for gain adjustment may arise from a number of factors, including lateral and/or angular misalignments of the half-capacitor plates (from construction or thermal expansion), processing variations affecting transmitters or receivers, variations or non-linearities in the dielectric, and so forth.

On module 286, transmitter 286a, in response to an input signal on signal line 286b, generates signals on half-capacitor 286c. On module 287, receiver 287a, in response to the signals received at half-capacitor 287, generates an output signal on signal line 287b.

FIG. 19 depicts several means for adjusting the overall gain of the capacitively coupled signal path in order to optimize the signal-to-noise ratio between input 286b and output 287b: (1) the gain of transmitter 286a may be adjusted; (2) a trim plate (a/k/a "platelet" 286d may be ganged in parallel with or disconnected from half-capacitor 286c; (3) trim plates 287d–dd may be ganged in parallel with or disconnected from half-capacitor 287; and/or, the gain of receiver 287a may be adjusted.

Transmitter configuration means 286e controls the gain of transmitter 286a and/or the connections between trim plate 286d and half-capacitor 286c. Similarly, receiver configuration means 287e controls the gain of receiver 287a and/or the connections between trim plates 287d–dd and half-capacitor 287c. The use of such configuration means generalizes easily to differential signal paths as well.

Adjustment of capacitive signal path gain can be either static or dynamic. Static adjustment is preferably performed prior to assembly (i.e., mating of 286 and 287) and compensates for variances in the manufacture of dies 286 and 287. The goal is to avoid a situation in which a particularly weak transmitter is paired with a particularly weak receiver. Static adjustment of die 286 involves temporarily affixing die 286 to a well characterized test die. The test die receives pulses from die 286 and provides feedback used to program transmitter configuration means 286e, thereby configuring the gain of transmitter 286a within the ordinary tolerance. Static adjustment of die 287 involves an analogous procedure wherein a temporarily affixed test die applies well characterized pulses to die 287, so as to enable appropriate programming of receiver configuration means 287e.

Dynamic configuration compensates for gain variances that arise either during manufacture of modules 286 and 287 or during operation of the assembled system. Dynamic configuration is preferably performed during system operation by adjusting the configurations of transmitter configuration means 286e and/or receiver configuration means 287e so as to optimize the signal-to-noise ratio across the capacitive signal path. Various techniques are known in the telecommunications industry for performing such configuration. The periodicity with which such dynamic adjustments need to be performed will vary anywhere from once at power-up to many times per second, depending on surrounding environmental conditions such as temperature fluctuations and mechanical stresses, among other things.

Information may advantageously be relayed among configuration means 286e and 287e, and devices in the larger system. The larger system preferably provides storage means, analysis & data reduction means, diagnostic means, and reporting & auditing means, as well as other services. Preferably, the larger system may cooptimize the settings in configuration means 286e and 287e together, advantageously as a function of data from both, advantageously including sensory data.

Figure 20A:
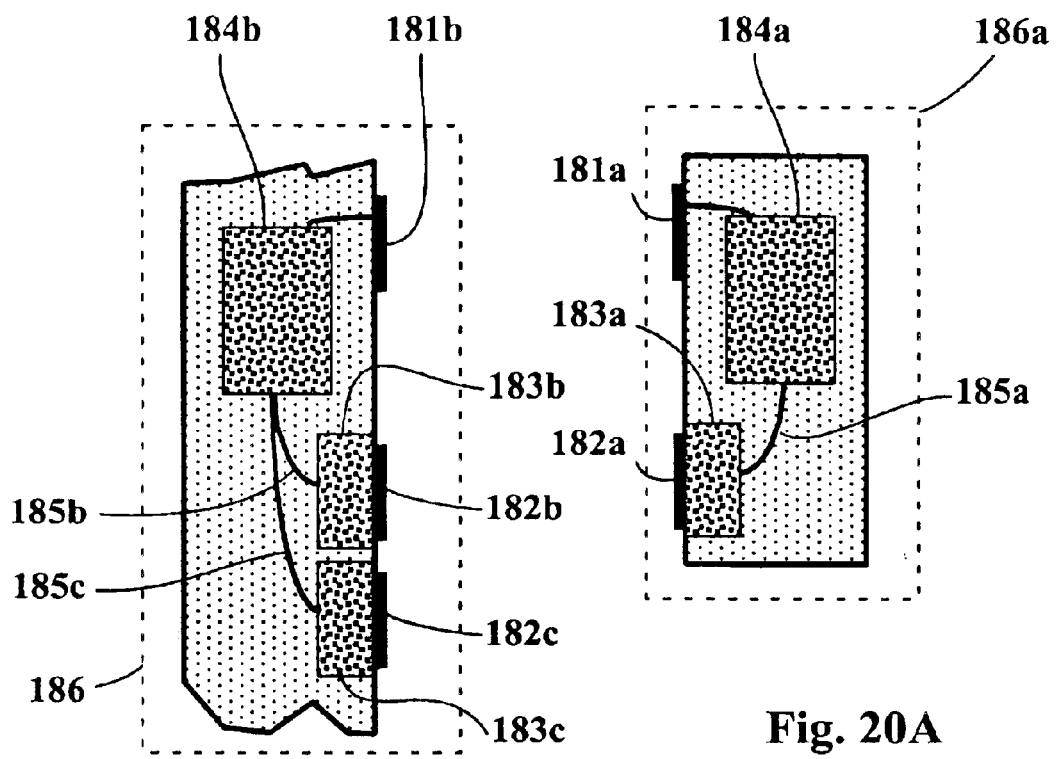
FIGS. 20A–B depict an exemplary application specific module (ASM) constructed in accordance with the invention.
Figure 20B:
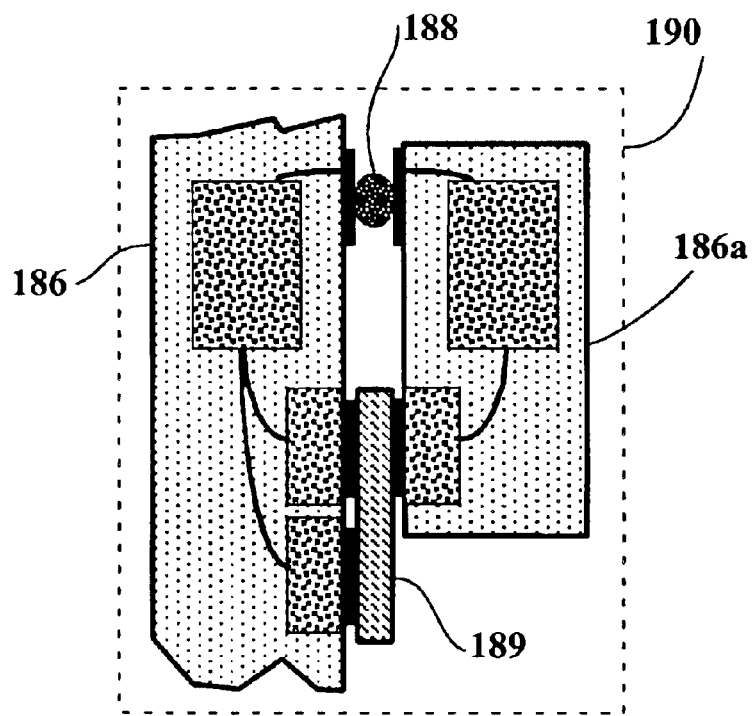

Reference is now made to FIGS. 20A–B, which depict an exemplary application specific module (ASM) constructed from application specific submodules (ASSMs) in accordance with the invention. As is well known, advances in CAD technology have precipitated explosive growth in the use of application specific integrated circuits (ASICs) wherein a stored description of a system is implemented automatically by CAD system customization of an integrated circuit mask, and the mask is then fabricated and packaged in a standard Level 1 package. In conventional technology, the high costs and performance limitations of packaging and interconnecting multiple die make application specific implementation of multiple die systems (e.g., MCMs) much more costly than single die ASICs. The invention, however, eliminates many of the costs and performance limitations of multi-die interconnections, thereby enabling economically advantageous implementation of application specific multi-die systems, ASSMs, or ASMs.

FIG. 20B depicts an exemplary ASM comprising ASSMs 186a and 186, conductively coupling power through solder bump 188 and capacitively signalling through dielectric 189. Use of the assembly/testing techniques of the present invention permits very low cost and high yield, high reliability fabrication of ASM 190.

FIG. 20A depicts ASSMs 186a and 186 prior to mating. Only a portion of ASSM 186 is depicted; ASSM 186 may advantageously mate with more than one other ASSM 186a. Either or both of ASSMs 186a and 186 may be custom fabricated utilizing ASIC-like techniques and/or otherwise personalized by the techniques used to customize (field) programmable logic parts.

Structurally, ASSMs 186a and 186 each preferably include a plurality of electronic devices 184a and 184b, respectively. Conductive contact pads 181a and 181b are configured to accommodate a solder ball 188 or the like, so as to provide a means for powering ASSM 186a from ASSM 186. Capacitive signalling between devices 184a and 184b is provided via wiring 185b, driver/receiver 183b, coupled half-capacitors 182b and 182a, driver/receiver 183a and wiring 185a. ASSM 186 optionally includes additional wiring 185c, driver/receiver(s) 183c and half-capacitor(s) 182c to accommodate additional ASSM(s). Use of the ASM design paradigm in accordance with the present invention effectively extends the reach of application specific implementation technology to systems too large to implement with acceptable yield on a single die.

Figure 21:
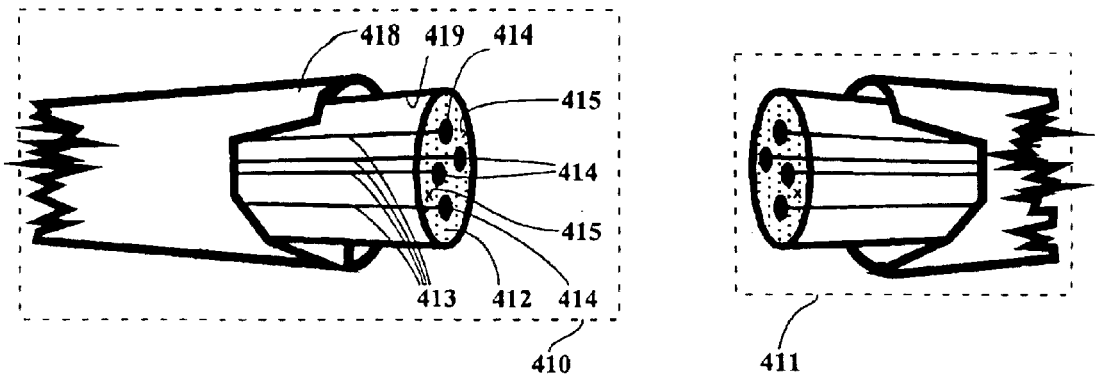
FIG. 21 depicts a cable interface utilizing the capacitive coupling techniques of the invention.

Reference is now made to FIG. 21, which depicts a cable interface utilizing the capacitive interface of the invention. Cable 410 comprises an outer sheath 418 encapsulating a plurality of transmission lines 413 disposed in an appropriately selected dielectric inner medium 419. Transmission lines 413 each preferably connect to half-capacitors 414 at interface 412 so as to form a standard interface adapted to mate with another capacitively terminated cable or socket. Interface 414 preferably includes means 415 for affixing 410 to another cable or connector socket, which may entail mechanical guides, optical positioning, registration marks, or other means for positioning and holding the cable 410 to another device's interface. Interface 414 may be flat or patterned to enhance alignment stability. Cable 410 may additionally incorporate one or more lines adapted for conductive interconnection at interface 414.

Use of half-capacitor cable interfaces in accordance with the invention provides numerous advantages over conventional cable connections. Coupled half-capacitors allow substantially better impedance matching at the interface than conventional conductive interfaces. In addition, the invention permits substantially denser interconnections at the interface. Also, capacitive cable interfaces are simpler to fabricate and offer higher reliability (in terms of resistance to contamination corrosion) than conventional conductive cable connections.

Figure 22:
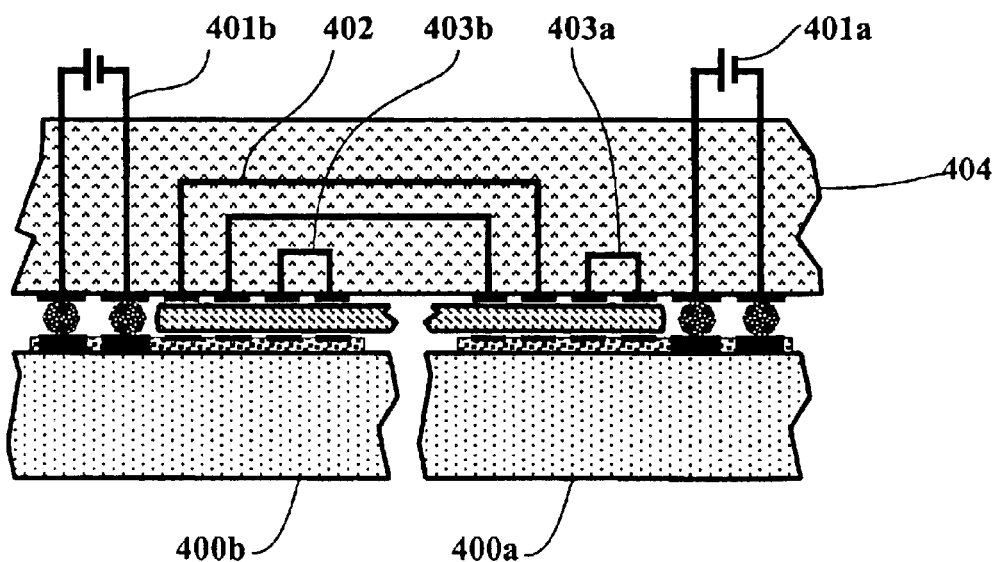
FIG. 22 depicts an exemplary portion of a module electronic system wherein a substrate provides both inter-chip and intra-chip capacitive signal paths.

Reference is now made to FIG. 22, which depicts an exemplary portion of a modular electronic system wherein a substrate provides both inter-chip and intra-chip capacitive signal paths.

Inter-chip capacitive signal path 402 interconnects chips 401a and 401b. Intra-chip capacitive signal path 403b interconnects two points on chip 400a via a transmission line and two half-capacitors on substrate 404. Intra-chip capacitive signal path 403a similarly interconnects two points on chip 400b. It should be noted that signal paths need not be simply inter-chip or intra-chip. For example, the pattern of transmission lines on substrate 404 may include branches which implement a hybrid signal path, providing both inter-chip and intra-chip interconnections.

Chips 400a and 400b are illustratively depicted as being powered by conductive power connections 401a and 401b, respectively, from substrate 404. Alternatively, a powering means such as 401b might provide connectivity to a battery supply comprised by the chip 400b, the substrate 404, or elsewhere in the system, preferably eliminating the need for external power connections. Numerous means for powering electronic devices are well-known in the art and may be employed advantageously along-side the invention.

Figure 23A:
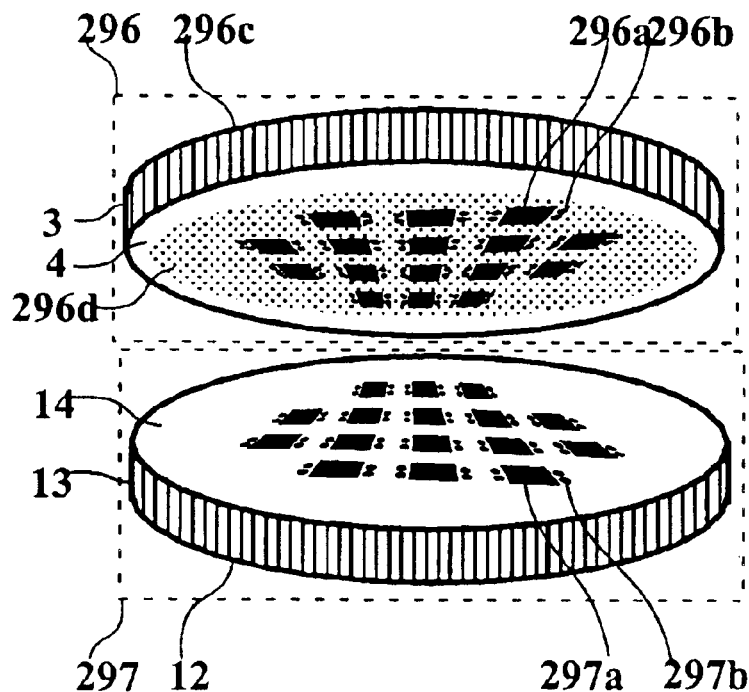
FIG. 23A depicts an exemplary apparatus for testing modules constructed in accordance with the invention.

Reference is now made to FIG. 23A, which depicts an exemplary apparatus for testing modules constructed in accordance with the invention. A module-under-test 296 couples capacitively to a test-module 297, which drives test vectors and receives (and optionally evaluates) test signals. Importantly, from the perspective of module-under-test 296, the electrical interface to test-module 297 can be made essentially identical to the interface that module-under-test 296 will see when installed in an actual system. Therefore, module-under-test 296 can be tested at full speed without any need to over-design the drivers on it to accommodate the higher parasitics of a testing fixture. The apparatus permits circuits being tested in module 296 to be operated at full speed with essentially no parasitics. Except for latency, the test signals can be made substantially the same as those seen when coupled to a second "real" module, and the latency can be made arbitrarily small.

Conventional test procedures involve actual contact between each contact point on a die and a corresponding probe on a test fixture. This typically requires specialized microscopes or similar optical alignment means, and a fragile, expensive "bed-of-nails" or sacrificial test rig. In contrast, the invention preferably utilizes capacitive alignment in which a tuned circuit on the module-under-test 296 or on test module 297 is used to servo a capacitance extremization (and thus alignment) between certain half-capacitors on module-under-test 296 and test-module 297. Such capacitive alignment advantageously obviates any need for expensive optical alignment equipment. Of course, other circuitry can instead be used to facilitate the alignment process, although tuned circuitry is advantageous and capacitive means may be preferable since already available.

During testing, module-under-test 296 is positioned relative to test-module 297 and mated such that signals can pass between a plurality of respective coupled half-capacitors 296a and 297a. Respective conductive connections 296b and 297b allow test-module 297 to provide power to module-under-test 296 during the testing cycle, and possibly during a fine alignment cycle.

The test assembly 296–297 is durable and may advantageously be constructed by a process of building or unbuilding modules 296 and 297, without requiring any positive or negative insertion force or energy changes across the signal junctions 296a–297a. It preferably does not require sacrificial test-rigs, nor the severing or joining of conductor-conductor signal junctions.

Referring again to FIG. 23A, either or both module-under-test 296 and test-module 297 preferably comprise undiced wafers. Advantageously, test-module 297 includes a plurality of testing circuits, each associated with one or more particular half-capacitors 297a and adapted to generate and/or evaluate test signals at the particular half-capacitor (s). Such testing circuits implemented on the active surface of test-module 297 (preferably near or beneath half-capacitors 297a) substantially increase the bandwidth of the testing process. In order to compensate for the presence of defective testing circuits, one may sequentially test a given module-under-test 296 using two or more different test-modules 297, thereby ensuring that each circuit (or die) on the module-under-test is tested by at least one operational test circuit on at least one of the test-modules.

A wafer-scale test-module 297 may also be advantageously used as a micrometer caliper when many components are assembled into a multichip module, thereby effectively providing long-distance fiducials.

Module-under-test 296 need not be passivated. Indeed, a high dielectric factor material may advantageously be disposed on the plurality of half-capacitors 297a, and not on half-capacitors 296a, to lower manufacturing costs and simplify testing. Use of a lower-than-designed dielectric factor or greater separation can advantageously help identify weak drivers or receivers. Likewise, a higher-than-designed dielectric factor or smaller separation can advantageously simulate over-strong communications circuitry. Varying separation and/or alignment between module-under-test 296 and test-module 297 during parametric testing may be used to simulate various environmental extremes. As a result, full parametric testing can be done easily, exercising permutations of extreme variance in clock rate, temperature, voltage, and so forth.

Numerous means for powering module-under-test 296 are known in the art. Preferably, module-under-test 296 is powered through a conductive connection between respective contact points 296b and 297b formed from reversible fuzz buttons, compliant conductive material, or AMPSTAR™-like springy contacts.

Figure 25:
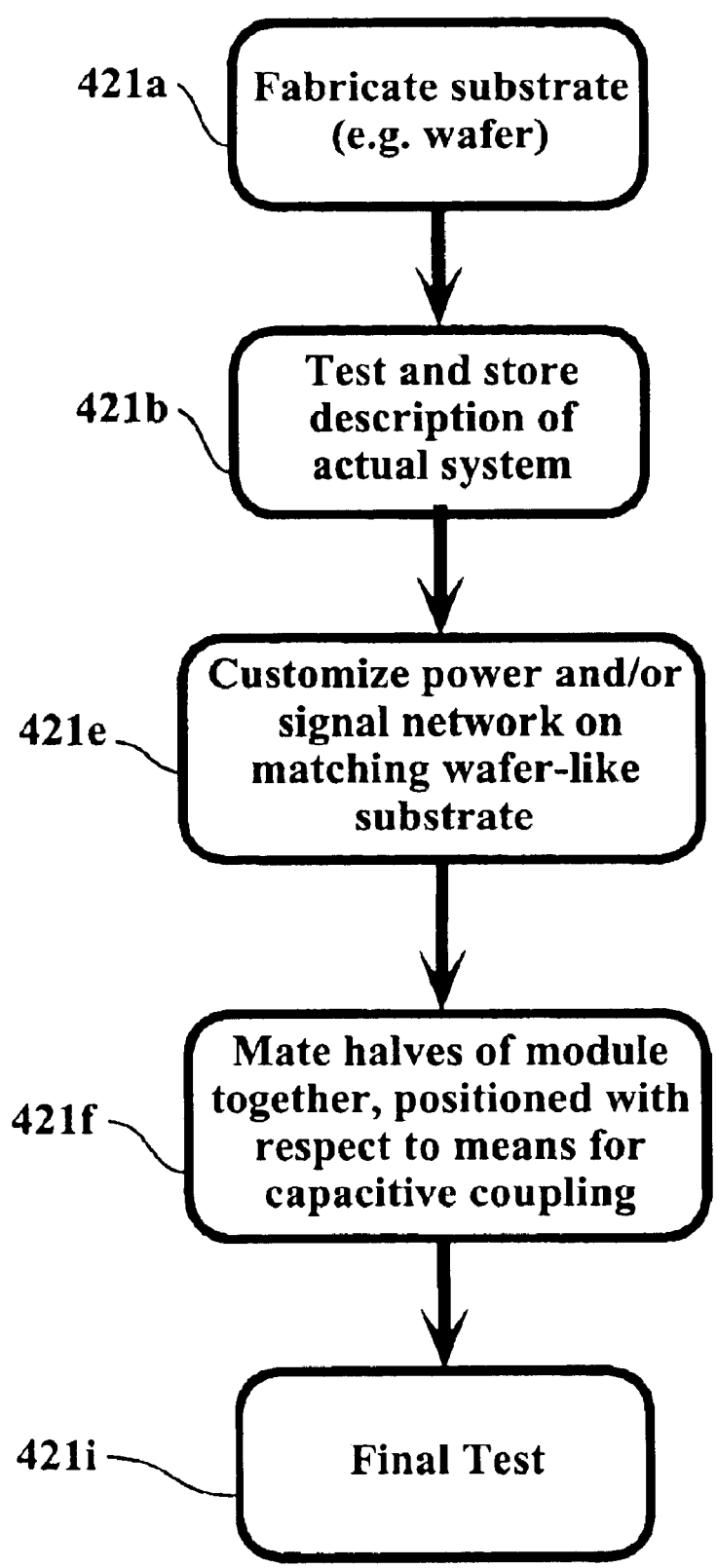
Figure 26:
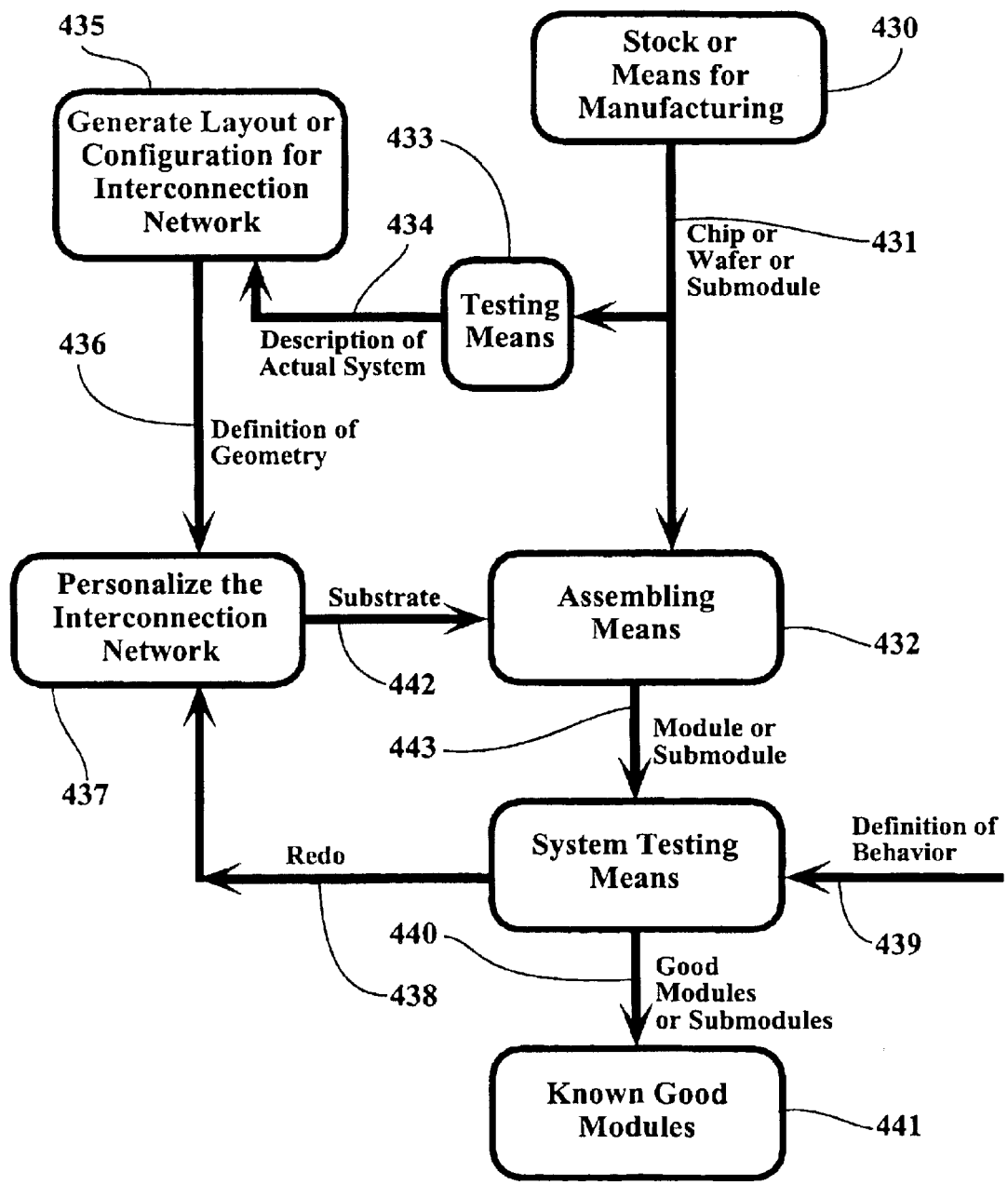
FIG. 26 depicts the general flow of assembly, testing and rework of a wafer-scale or similar modular system in accordance with the present invention.

Although the testing protocols discussed in regard to FIGS. 23A, 25 and 26 are exemplified with reference to the testing of an undiced semiconductor wafer, these testing protocols are applicable to modules at any level in the packaging hierarchy, to the extent that such higher-level modules employ the capacitive interfaces associated with the invention.

Testing of modules constructed in accordance with the invention affords significant advantages, compared to testing of conventional, conductively interconnected modules. One advantage is the substantially reduced cost of the test fixture (e.g., test-module 297). The cost of conventional testing depends largely on the number of conductive connections between fixture and module-under-test. A conventional system requires conductive signal connections for each node being stimulated and each node being observed, as well as conductive connections for powers and grounds. The present invention eliminates the need for all these conductive connections, except for powers and grounds (e.g., 296b and 297b). Advantageously, power and ground may be applied to module-under-test 296 via a network on the back side 296c, thereby completely eliminating the need for conductive connections between module-under-test 296 and test-module 297. In either case, the cost of a non-conductively coupled test-module 297 will generally be substantially less than the cost of a comparable conductively coupled fixture.

In cases requiring a very high density of interconnections between fixture and module-under-test, use of the non-conductive interconnections 296a–297a of the invention permits a substantially greater number of signal connections between module-under-test 296 and test-module 297 to be realized. Therefore, the present invention provides substantially increased controllability and observability of module-under-test 296. This capability to provide very high interconnection density between module-under-test 296 and test-fixture 297 is particularly valuable in the testing of very small modules (e.g., silicon dies) and makes economically feasible the manufacture of larger and/or denser circuitry on such modules because of the increased capability and reduced cost of the testing process.

It is well known that identification of known-good die is critical to the economics of high-yield assembly of MCMs. (See Hagge et al., "High-Yield Assembly of Multichip Modules Through Known-Good IC's and Effective Test Strategies." *Proc. of the IEEE*, December 1992, and "Known Good Die." 1993 Proceedings, *International Conference on Multichip Modules*, International Society for Hybrid Microelectronics, Reston Va. 1993.) Deficiencies in the ability of present testing techniques to identify defective die prior to assembly into an MCM contribute approximately ten to fifty percent of the cost of present day MCMs. (See Tai et al., "Exploration and Advances in MCM Technology." IEEE Multi-Chip Module Conference MCMC-93, Santa Cruz, Calif.) The invention provides novel testing methods which dramatically reduce these costs. These methods reduce the problem of identifying Known Good Die[s] (which in the prior art typically entails packaging a die in a sacrificial test rig and tolerating poorly matched or poorly characterized parasitics) into the Known Good Chip problem whose treatment is well-known by practitioners in semiconductor fabrication. Moreover, packaged chips can still be tested after assembly into a module, just by opening the module and removing some of the high resolution signal substrate or other chips overlaying the suspect chip. A specialized test rig can then be applied directly to the chip, either in situ or after removal from the module.

Still referring to FIG. 23A, test-module 297 advantageously incorporates test-circuitry (not depicted) operable to apply and/or receive and evaluate test data from module-under-test 296 via half-capacitors 297a. Such incorporated test-circuitry provides in effect a "built-in self-test" ("BIST") capability, but without the disadvantages of conventional approaches. With conventional built-in self-test, significant real estate on the module-under-test must be used to implement the testing circuits, which increases the cost, decreases the performance and decreases the yield of the module-under-test. Because the invention allows test circuitry to be implemented on the test-module (as opposed to the module-under-test), it eliminates these problems of conventional built-in self-test, while retaining the advantages of low cost for test equipment and procedures, high observability/controllability, high testing bandwidth, and so forth. Thus, the incorporation of test-circuitry into test-module 297 in accordance with the invention enables a variety of novel approaches for testing, verifying and repairing modular electronic systems. Self-test circuits can still be built in, but do not need to be built in. The test method does not disadvantage or rule out the use of boundary scan methods, examination by electron beams, or the use of plasmas for testing, but it makes them less necessary by comparison.

In the prior art, changes to built-in self-test circuitry require expensive mask changes to the module-under-test. Such mask changes often introduce costly new failure modes and subtle side effects, which eventually may require still further engineering changes and increase the time-to-market. The present invention permits changes to the "built-in" testing hardware (i.e. test-circuitry on test-module 297) usually without requiring any changes to the part being manufactured (i.e. module-under-test 296), thereby substantially reducing the cost and risk associated with changes in the testing process of a production part. Further, different test-modules 297 may be advantageously employed to qualify a module-under-test 296 for different specifications, such as military, high-speed commercial, or low-cost commercial.

The method and apparatus can test or validate any module 296, so any module which can be built can be tested. In the prior art, particularly at higher clock rates, it is possible to build a die or submodule which cannot be tested until fully assembled into a system, which may be combinatorily prohibitive. (DEC's 36-bit Jupiter machine proved untestable hence unbuildable for this reason, ending that company's line of 36-bit machines.) In accordance with the invention, testing is advantageously performed before spending money to package the module-under-test, which is often infeasible in the prior art.

Figure 23B:
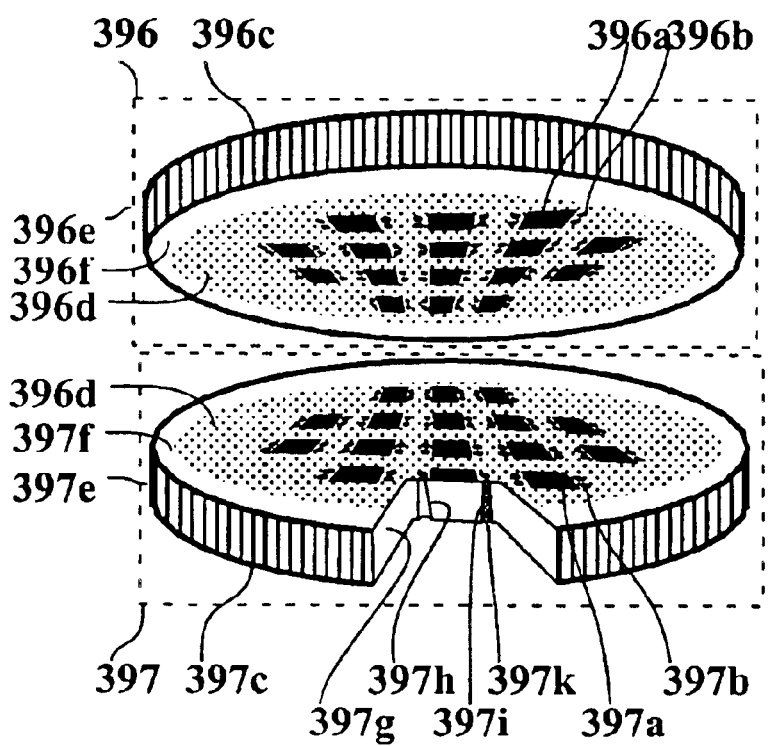
FIG. 23B depicts a wafer-scale modular system constructed in accordance with the present invention.

Reference is now made to FIG. 23B, which depicts the use of mated, undiced wafers to implement fault-tolerant, wafer-scale modular electronic systems in accordance with the invention. Important examples include applications for a breadboard (optionally including a routing network), for wafer-scale integration per se, and in multi-die systems of wafer-scale or smaller.

Breadboards serve purposes well-known to practitioners in the field, such as providing a readily customized routing network. Using the invention, the off-die connectivity of a wafer-scale module 396 may be defined by customizing the interconnections on interconnection substrate 397, capacitively coupled to the wafer-scale module. Such personalized interconnections can be made durable enough to be "shipped," not just handled in a laboratory. Most of the uses and benefits of wire-wrap coupling can be exploited by breadboard-like interconnection substrates 397 using capacitive coupling, but without paying wire-wrap's penalties for size, power, reliability, durability, parts count, or other factors. The interconnections on interconnection substrate 397 are advantageously made electrically configurable by use of programmable logic devices (PLDs).

Personalizing wafer-scale systems is straightforward using the invention, as outlined above, since the matrix of interconnections on interconnection substrate 397 can be lithographed or assembled in one piece in a fixed amount of time, rather than wired in a time proportional to the number of leads. Unlike conventional breadboards, such interconnection substrates are mechanically stable and compact enough for commercial production runs. In addition, submodules may readily be swapped in or out by replacing, reconfiguring, or otherwise altering the interconnection network represented on 397.

Unneeded good dies on wafer-scale module 396 can be powered or unpowered, depending on the maintenance strategy. Extra good functional units, so called "hot spares," may be advantageously exploited through adaptive configuration or targeted compiler output. For instance, Very Long Instruction Word (VLIW) compiler techniques can be used to generate object code optimized to the custom configuration of circuits found to be good on the wafer-scale module 296.

Referring again to FIG. 23B, personalization of such a wafer-scale modular system may also be achieved by use of an interconnection substrate 397 comprising a routing network to programmably interconnect half-capacitors 397a on module 397. Routing networks offer a general means for redefining paired couples 297a–397a. In testing, routing networks may be advantageously used to reconfigure the configuration of module 297 by rerouting signals from the half-capacitors 297a associated with defective test circuitry to other functioning test circuitry during a second testing phase; the second phase tests the circuits on module-under-test 296 missed during the first testing phase.

The interconnections on interconnection substrate 397 can be personalized either through hardware configuration or software programming of an incorporated routing network. On the hardware side, customization of a coarse resolution substrate entails opening or closing connections among leads, using any of a variety of techniques. Cutting connections is the simplest. Customization at the high resolution substrate could be done in a number of ways, including metallizing leads, opening or closing fuses with a laser, or voting. Various xerographic or mundane photoresist processes might be employed to create custom multilayer high resolution interconnect substrates rapidly.

On the software side, there exists a large body of literature analyzing how to use routing networks or buses to arbitrate communication among dies when the exact pattern of faults will not be known until after fabrication. If the individual dies on a wafer have to be large, which is desirable when signalling is expensive, their yield collapses and connecting good die together can become a prohibitively general problem. Worse, the real estate given over to editing out faults with conductive connections can easily swamp the gains in density won by wafer-scale fabrication, as has been demonstrated by the many failed wafer-scale integration efforts in the prior art.

Buses or routing networks can be made fully general, independent of the detailed fault map, for a bounded fault density. They can also be reconfigured dynamically, allowing hot restart with spare dies. The fault tolerant routing network or bus may be a significant, even dominant, portion of the overall real estate of a wafer such as 296. Fault tolerant interconnection mechanisms become important in systems with a large number of components, at the system level if not at the module level. Implementation details of such schemes are available in published literature. One can avoid global interconnect schemes by developing locally fault tolerant clusters, leaving longer distance interconnects possibly fault intolerant. For example, nine adders might be fabricated into a cluster requiring eight, with entirely local circuitry concealing a bad unit. No external customization of interconnect wiring would then be needed.

Figure 24:
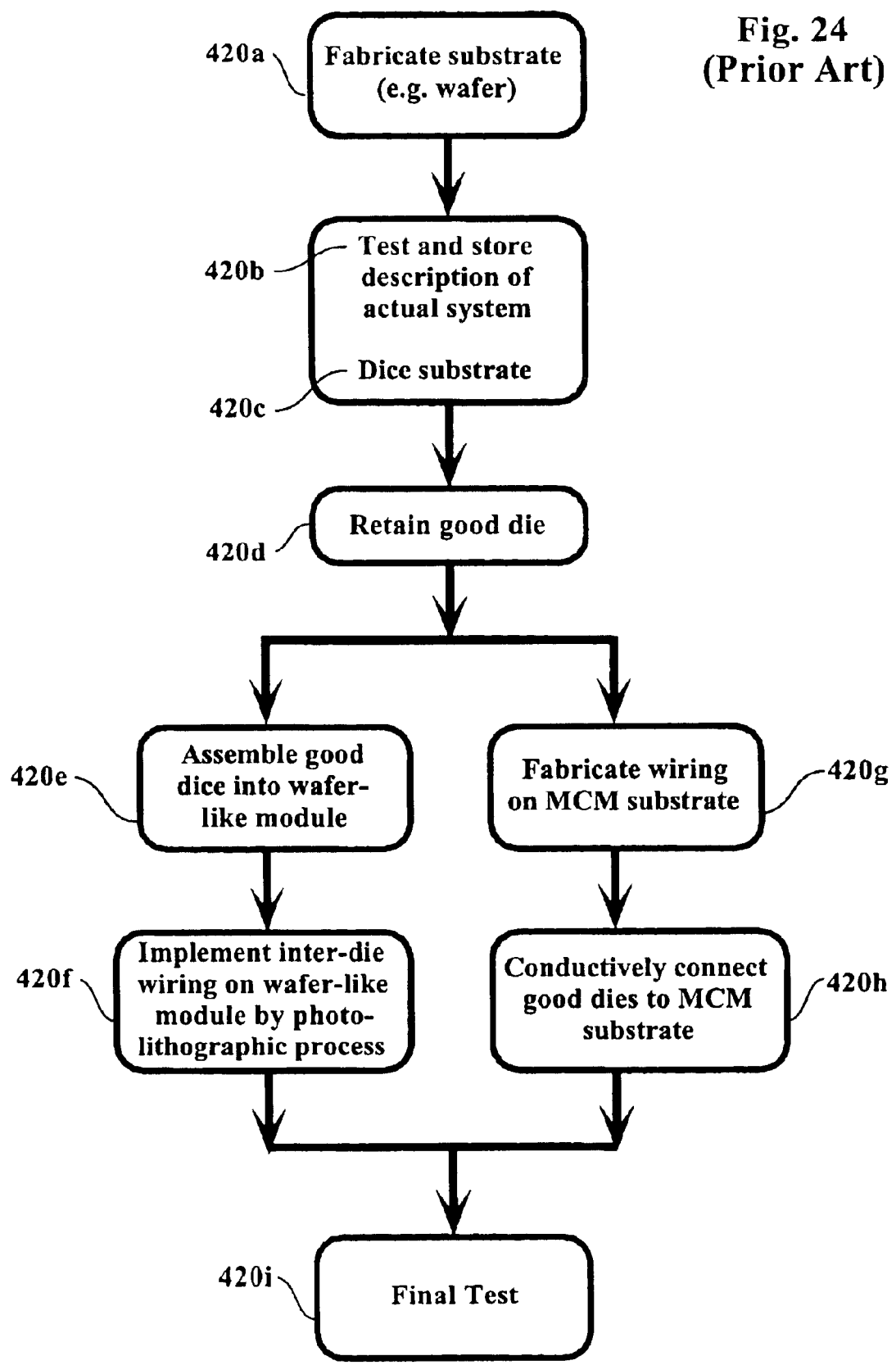
FIGS. 24–25 compare the fabrication of MCMs in the present art (FIG. 24) and the fabrication of wafer-scale modules in accordance with the invention (FIG. 25)

Reference is now made to FIGS. 24 and 25, which compare the fabrication of MCMs in the present art (FIG. 24) and the fabrication of wafer-scale modules in accordance with the invention (FIG. 25).

Referring now to FIG. 24, prior art assembly methods typically entail an initial sequence of steps 420a, 420b, 420c and 420d, the output from which is a collection of individually separated, known good die; some methods swap the order of steps 420b and 420c. Assembly into the MCM typically proceeds in either of two ways. In a chips-first method (steps 420e–f), good die are assembled into a planarized wafer-like module, whereupon interchip wiring is implemented using a photolithographic process. Alternatively, the more common chips-last MCM assembly method (steps 420g–h) involves implementing wiring on an MCM substrate onto which the known good die are bonded, by flip-chip, wire-bond or TAB. In either case, the known good die are subjected to substantial high-temperature and/or mechanically stressful processing steps after the initial step 420b test that identified the die as good. Therefore, complete functional test of the assembled system (step 420i) is advisable to ensure a working multi-die system.

Reference is now made to FIG. 25, which shows the assembly of a wafer-scale system in accordance with the invention proceeds initially, in steps 421a–b, along the same course as the conventional manufacturing methods. (The testing in step 421b, however, advantageously utilizes the methods discussed in reference to FIG. 23 above.) Wafer-scale module 396, however, is not separated into individual die. Rather, in step 421e, interconnection substrate 397 is personalized, in response to the results of step 421b, so as to realize a pattern of interconnect, half-capacitors and/or power connections that will interconnect and power the known good die to form the desired system. In step 421f, the unsawed wafer-scale module 396 is mated with the personalized interconnection substrate 397 to realize the wafer-scale modular system. Step 421i optionally performs a final system test.

Advantageously, the wafer-scale assembly method depicted in FIG. 25 does not subject the known good die to high-temperature or other physically stressful processing steps. Therefore, the likelihood that a die identified in step 421b as good will fail at the final step 421i test is dramatically reduced, as compared to the conventional methods of FIG. 24. Moreover, even if such failures occur, rework in accordance with the invention is substantially simpler since it advantageously confines changes to the interconnection substrate 397 and does not require changes to the unsawed wafer-scale module 396 and since the mating to the unsawed wafer-scale module can be easily reversed without damage to either.

Personalization of the interconnection substrate is advantageously performed by selectively deleting power and/or ground contacts, preferably fuzz buttons like metallic protrusions 397k, corresponding to known bad dies from a coarse resolution power substrate portion of the interconnection substrate. Bad dies will therefore not be powered, so shorts or other defects in them can be electrically isolated from the system. This process of editing out defects by deleting connections to power and/or ground isolates bad dies as effectively as sawing them out would, for any point defect or region defect of the unsawed wafer; equivalently, power connections could be enabled only for known good die.

Referring again to FIG. 23B, interconnection substrate 397 can be fabricated by a number of methods, including those taught earlier. It may be the same size as the unsawed wafer 396 or composed of regularly or irregularly tiled smaller sections. It may also be built of one or more wafers or dies itself. Leads can be brought outside through fuzz buttons at the same cost as in conductively coupled systems, and breadboarded or connected to other components in a traditional fashion.

Leaving wafer 396 undiced saves manufacturing steps and wastes less real estate. While electrically empty gutters are still needed to separate dies, the neighbor-to-neighbor die separation need only be about 10 microns in the current art, which is realistic in light of present technology for stepping cameras and is comparable to the separation of neighboring half-capacitor plates on a die. This amounts to less than one percent of the real estate for a 2 mm$^2$ die. (N.B.: If the capacitive coupling were designed with much smaller separation (e.g., h=1 micron), the line width would then have to be considered in the optimization, since the gutter must also be wider than several standard deviations of the linewidth.) In comparison, the gutters needed when die are to be sawed are typically 300–900 microns wide, and restricted to having common edges abutting chords across the wafer, typically in a rectangular grid. The embodiment taught above removes the requirement for colinearity, which makes available the real estate padded out to form rectangular dies from non-rectangular layouts, and facilitates the placement of fabrication process control cells, which, in the prior art, are typically lithographed in the gutters. Leaving the wafer unsawed also avoids stress-induced failures from handling, sawing, or drilling, which increases yield. Also, since all of the active die used to form the wafer-scale module advantageously derive from a single wafer, wafer-to-wafer variances in device parameters are not relevant.

Reference is now made to FIG. 26, which depicts the general flow of assembly, testing and rework of a wafer-scale or similar modular system in accordance with the present invention. A module 431 is initially provided from existing prefabricated stock (e.g., a configurable array or the like) or manufactured by manufacturing means 430. Module 431 is characterized by testing means 433 to produce a description 434 of its actual performance. In response to performance description 434, layout generation means utilizes well-known CAD techniques to generate a geometric description 436 of an interconnection substrate. In response to geometric description 436, substrate generation means 437 personalizes an interconnection substrate 442.

Assembly means 432 then assembles substrate 442 and the wafer 431 into a (potentially operable) module 443. System testing means 440 compares the behavior of module 443 with a description of the desired system behavior. If module 443 tests acceptably, system testing means 440 designates the module as a known good module 441. If, on the other hand, it identifies problems in the performance of module 443, system testing means 440 generates rework instructions 438 for substrate generation means 437, in which case a new or reworked interconnection substrate is created and tested.

Various novel methods for testing and assembling wafer-scale systems have been discussed previously. The invention further provides advantages in terms of repair, optimization and/or rework of such modular systems. Since wiring is advantageously disposed on mated modules, a die or sub-module identified as bad can be identified and swapped out with much less tear-down and rebuild than would be required in test-replace cycles for conductively coupled systems in the prior art. Non-destructive assembly and disassembly in accordance with the invention advantageously allows full systems to be built for testing and torn down for repair with substantially no damage to submodules. Reparability is facilitated by the lack of impact on neighboring die, tolerance of alignment mis-registration, absence of metal fatigue, and simplicity of testing, among other factors.

Rework involves disassembling a modular system and repairing or replacing a module so as to correct a performance deficiency. Importantly, rework may be used not only to repair or replace inoperable modules, but also to repair or replace slow or otherwise suboptimal modules so as to improve the performance of an already operable system.

In accordance with the invention, the forming or breaking of capacitive signal junctions advantageously entails substantially zero force, sheer, torque, or change in energy across any pair of coupled half-capacitors. Such assembly or disassembly advantageously proceeds with: no rise or fall in temperature at the signal junctions; no application or removal of heat at the signal junctions; no severing or joining of conductor-conductor leads at the signal junctions; no melting, solidifying, or other phase changes at the signal junctions; and/or no use of conductive liquids, solids, pastes, gases, plasmas, solvents, suspensions, or combinations of these at the signal junctions. Those skilled in the art will appreciate the cost and complexity advantages afforded by the avoidance of each of these requirements of various prior art disassembly methods.

Figure 27:
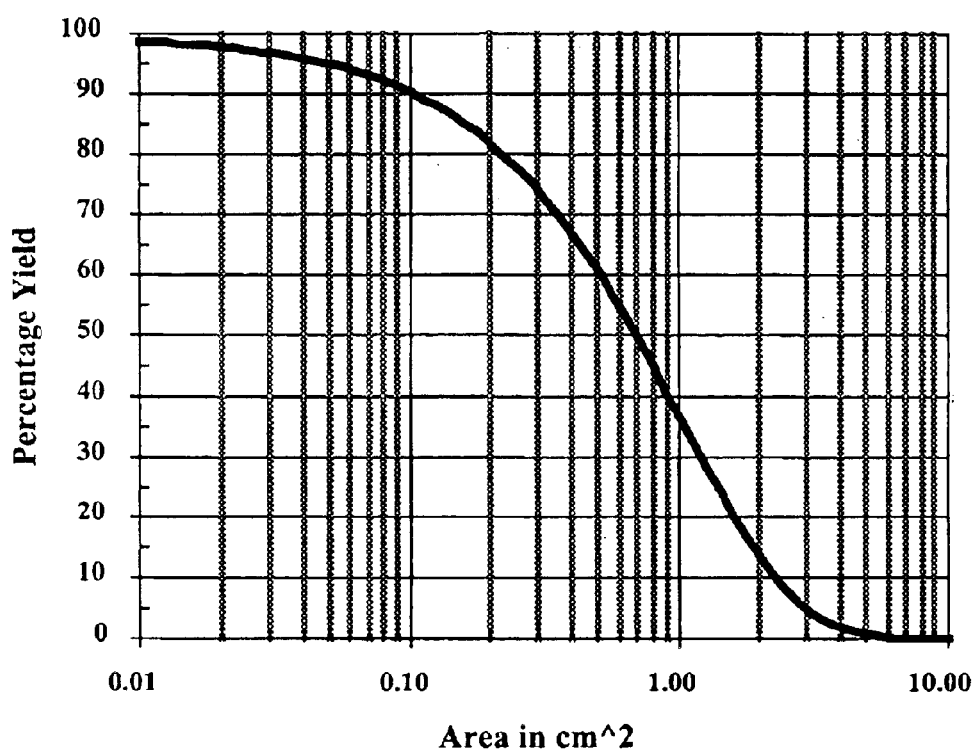
FIG. 27 shows the yield of good dies in a typical semiconductor fabrication process as a function die size.

Reference is now made to FIG. 27, which shows the yield of good dies in a typical semiconductor fabrications process as a function of die size. For an average of 1 fault per square centimeter, a Poisson distribution of point-localized defects predicts defect-less yields of approximately 90% for 0.10 $cm^2$ die, 37% for 1.0 $cm^2$ die, and 5% for 3 $cm^2$ die, which are realistic figures for certain mature VLSI processes. Under these conditions, a 60 $cm^2$ wafer would on average yield approximately 1 good die of 3 $cm^2$ size, or 21 of 1 $cm^2$ size, or 540 of 10 $mm^2$ size. A good 10 $cm^2$ die will be found, on average, once every 22 $ft^2$ of wafer, and thus is not a practical design target.

Given the foregoing yield constraints, it is readily apparent that a system much larger than approximately the average fault density (1.0 $cm^2$ in this example) may advantageously be fractionated into subunits (e.g., die) which can themselves be manufactured with significantly better yield.

At a high level of abstraction, the choice of die size can be viewed as essentially a tradeoff between system cost and system performance. While techniques for analyzing these system partitioning issues are known for conventional, conductively interconnected systems, the analysis of such tradeoffs for the capacitively interconnected systems of the invention requires different yield and performance models. An exemplary yield model for a capacitively interconnected system appears below.

Figure 28:
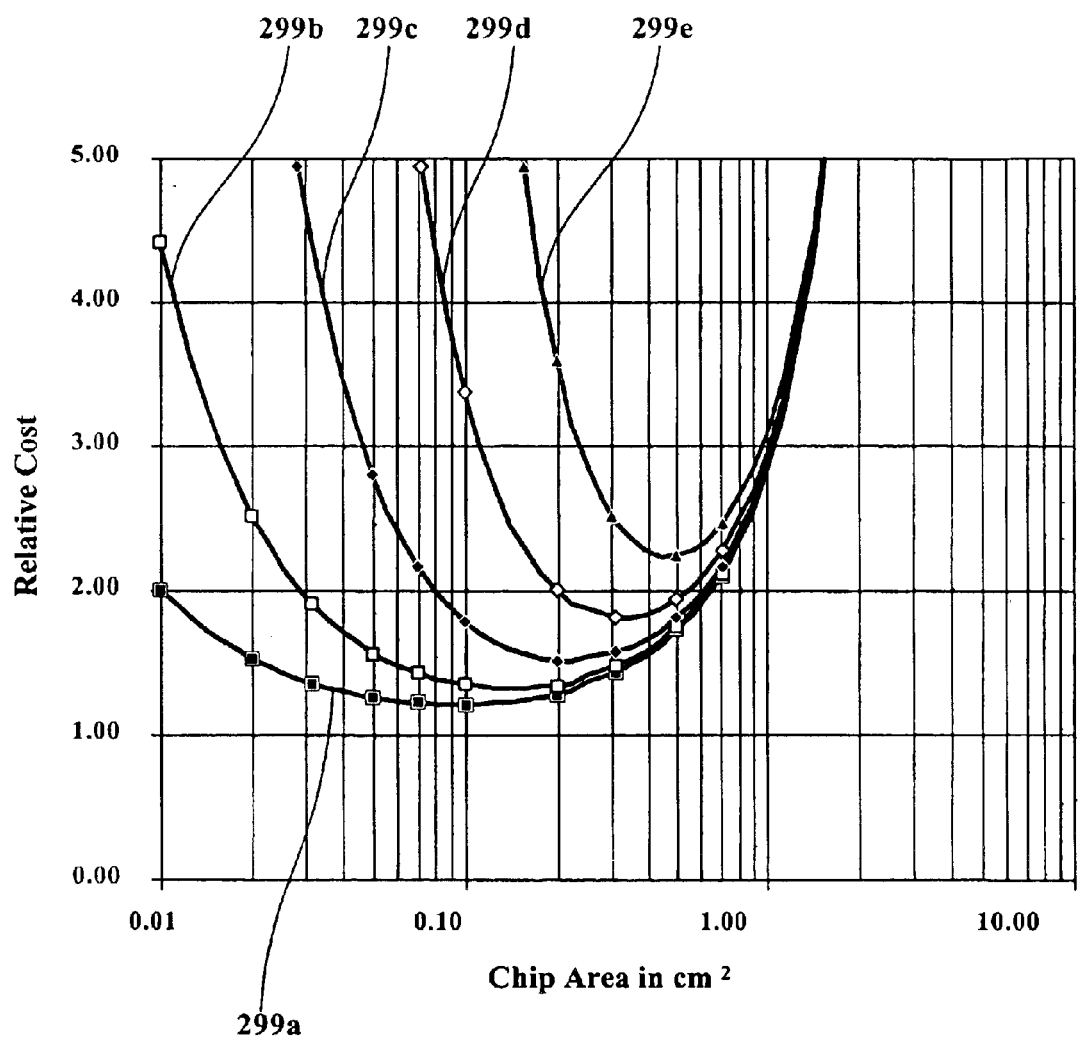
FIG. 28 depicts several plots of system cost as a function of die size for an exemplary capacitively interconnected system.

Reference is now made to FIG. 28, which depicts several plots of system cost as a function of die size for an exemplary capacitively interconnected system. FIG. 28 shows the value of fractionating large dies into smaller ones and coupling them together using the invention. The cost for a substrate to interconnect signal lines is assumed to be much, much smaller than the cost of the dies themselves, so can generally be ignored to a first approximation. A system requiring a certain amount of silicon real estate (e.g., 10 $cm^2$ for useful circuitry) might variously be designed as one 10 $cm^2$ piece, ten 1.0 $cm^2$ pieces, one hundred 0.1 $cm^2$ pieces, or so forth. In addition to the 10 $cm^2$ of useful circuitry, additional real estate must be taken up in every case for power and ground, and also taken up on each of the fractionated dies for overhead" circuitry for inter-die communication that would not otherwise have been necessary in a single die, including drivers, level-to-pulse converters, pulse-to-level converters, and/or receivers. In FIG. 28, the communication real estate on each die is estimated for illustrative purposes to scale in several ways: in trace 299a as a constant (i.e. no dependence on the overall number of pieces), in trace 299e as a constant times the number of pieces (i.e. a unit of circuitry for communicating with every other piece), and as a constant times the number of pieces raised to the intermediate powers of ¼, ½, and ¾, in traces 299b, 299c and 299d, respectively. Tradeoffs for real systems will roughly resemble one of these canonical curves. Furthermore, contact pads for DC powering, typically occupying 0.5 $mm^2$ for every 25 $mm^2$ of die, need to be provided even if the die is not a multiple of that size, so introduce a step-function of real estate, which is observable as a segmentation of the curves. The example actually depicts a system with 10.0 cm$^2$ for useful circuitry plus 0.2 cm$^2$ for power pads.

Consider, for example, trace 299c, in which the communication circuitry is assumed to scale as 0.5 mm$^2$ times the square root of the number of die into which the 10 cm$^2$ of system is packaged.

In a system built from two hundred dies with 5 mm$^2$ of useful circuitry each, each die would need one power-ground pair (0.5 mm$^2$) and 7.1 mm$^2$ (=0.5×200$^{1/2}$) of communication circuitry, so would actually be a 12.6 mm$^2$ die. The yield for 12.6 mm$^2$ die is 95 percent, so the full system would "cost" about (200×12.6/0.95)=26.5 cm$^2$ of wafer, or 2.6 times as much as the 10.2 cm$^2$ system described above. Very small dies are dominated by the "surface-to-volume" size of their power pads and the circuitry for inter-die communication, so are inefficient even though their yield is high.

In a system built with fifty dies with 20 mm$^2$ of useful circuitry each, each die would still need one power-ground pair and 3.6 mm$^2$ (=0.5×50$^{1/2}$ of communication circuitry, so would actually be a 24.1 mm$^2$ die. The yield for 24.1 mm$^2$ die is 82 percent, so the "cost" of the full system would be about 14.7 cm$^2$ of wafer, or 1.4 times as much as the 10.2 cm$^2$ system described above. For the particular model selected to simulate the cost of power pads, signal circuitry, and useful circuitry, dies of about 20 mm$^2$ provide the most cost effective building blocks.

In a system built with ten dies with 1.0 cm$^2$ of useful circuitry each, each die would need four power-ground pairs (2.0 mm$^2$) and 1.6 mm$^2$ (=0.5×10$^{1/2}$) of communication circuitry, so would actually be a 103.6 mm$^2$ die. The yield for 103.6 mm$^2$ die is 37 percent, so the "cost" of the full system would be about 28.0 cm$^2$ of wafer, or 1¼ times as much as the 10.2 cm$^2$ system described above. Large dies lose in fabrication yield more than they gain in design efficiency, and very large dies yield at close to zero, even though they have an even more attractive ratio of useful circuitry to overhead.

Figure 29:
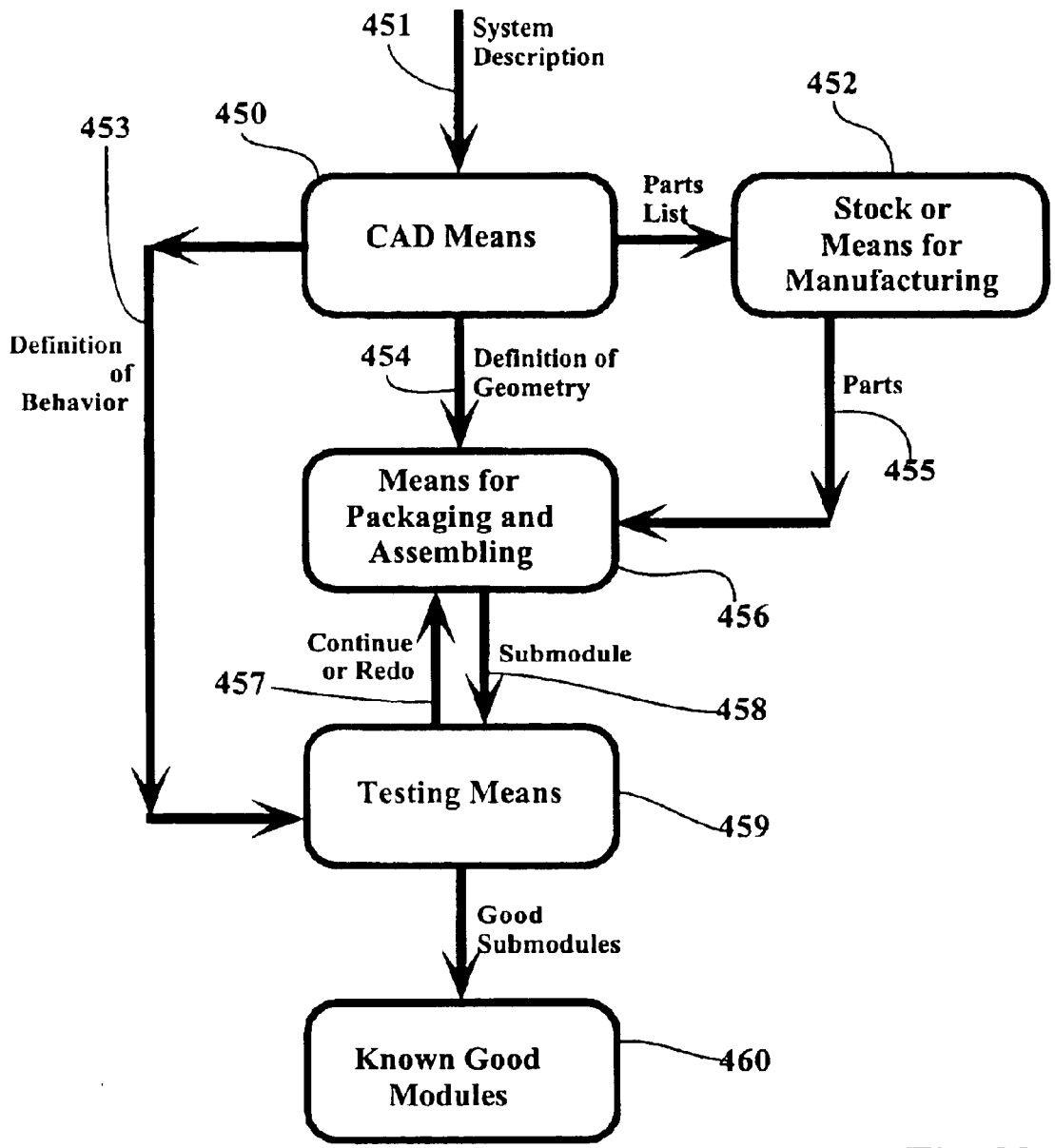
FIG. 29 depicts the flow of a design cycle for a modular system constructed in accordance with the present invention.

Reference is now made to FIG. 29, which depicts the flow of a design cycle in accordance with the present invention. A system description 451 is provided to CAD means 450, which advantageously utilizes performance, yield, reliability and cost models for available or manufacturable submodules to produce an optimized design for the modular system, which design is provided to stock or manufacturing means 452 as a list of parts 461, to means for packaging and assembling 456 as a definition of geometry 454, and to testing means 459 as a definition of the expected behavior of the system 453.

Parts 455 are provided to means for packaging and assembling 456 from stock or means for manufacturing 452. The module 458 is assembled and provided to testing means 459, which decides whether to designate the module as a known good module 460 or initiate a rework or continuation cycle 457.

CAD means 450 advantageously optimizes the partitioning of the modular system into modules. The present invention permits considerable flexibility in selecting the size of system partitions (e.g., die sizes) since it largely obviates the need to rely on standard pad fan-out and wire-bonding configurations. Therefore, yield modelling, as exemplified in FIG. 28 above, is advantageously incorporated into CAD means 450 and forms an integral part of the design process for semi-custom systems based on the present invention.

Since the invention facilitates low-cost integration of heterogeneous systems comprising a plurality of modules (each potentially implemented by a different manufacturing technology), such yield models are advantageously derived by curve-fitting data from all available fabrication processes, in order to provide a library of yield models that CAD means 450 can use in optimizing the implementation of a capacitively interconnected system. In addition to such yield models, CAD means 450 advantageously utilizes models of the electrical performance characteristics and other physical characteristics of the various technologies available to implement the modules of a capacitively interconnected system. Equipped with models of the cost, yield, performance and physical characteristics of various technology resources, the CAD means 450 employs well-known algorithms to optimize the partitioning and implementation of a semi-custom, capacitively interconnected system. Such optimization preferably includes: (1) the selection of the sizes and types of modules utilized to construct the system; (2) the assignment of logical subcomponents of the system to particular modules for implementation, and/or (3) the design of patterned substrates or like means for capacitively interconnecting the modules to realize the system.

Figure 30:
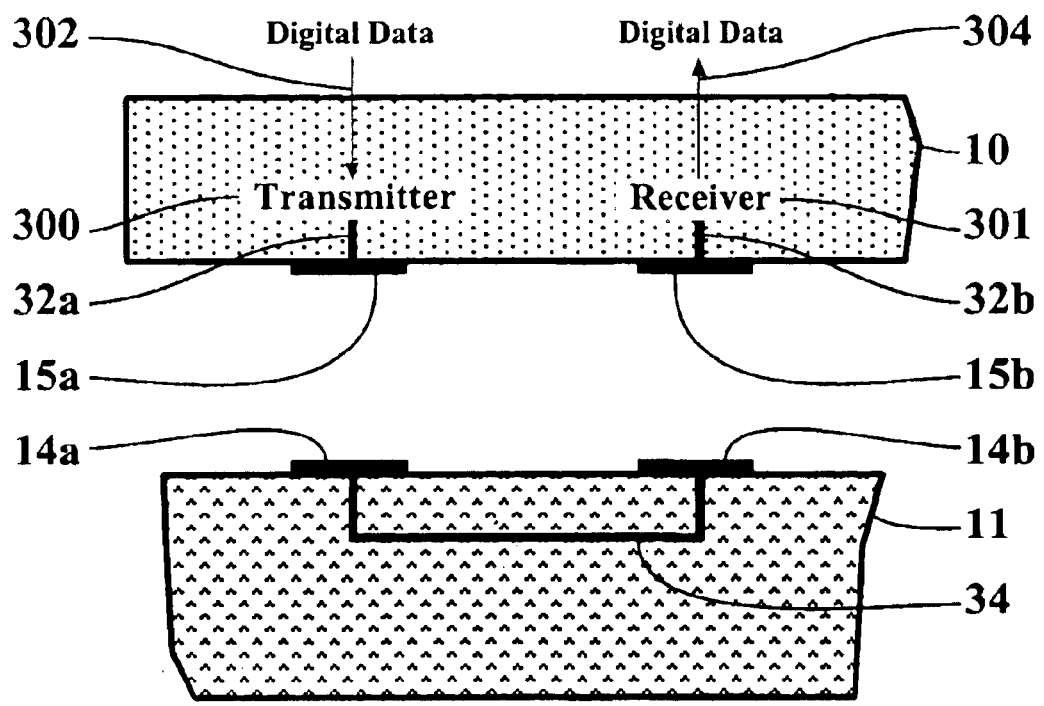
FIG. 30 depicts a block diagram of an off-die capacitive signal path in accordance with the invention.

Reference is now made to FIG. 30, which depicts a block diagram of an off-die capacitive signal path in accordance with the invention. In the signal path shown in FIG. 30, digital data 302 is: (1) input to transmitter 300; (2) coupled to die half-capacitor 15a via transmission line or wire 32a; (3) coupled from substrate half-capacitor 14a to substrate half-capacitor 14b via transmission line or wire 34; (4) coupled from die half-capacitor 15b to receiver 301 via transmission line or wire 32b; and (5) provided as digital output 304 from receiver 301.

Transmitter 300 and receiver 301 may be implemented on the same die 10 (an intra-die off-die signal path) or on different dies (an inter-die signal path). Transmitter 300 and receiver 301 are preferably implemented on the active surface of die 10, preferably directly beneath half-capacitors 15a and 15b, respectively.

Transmitter 300 transforms digital input data 302 to a form appropriate for transmission on the capacitive signal path. Such transformations might include, for example, level shifting, edge rate modification, phase, frequency or amplitude modulation of an appropriate carrier, coding of data using Non Return to Zero (NRZ) or Alternate Mark Inverse (AMI) techniques and the like.

Receiver 301 preferably performs an inverse transformation on the signal received from die half-capacitor 15b to generate digital output signal 304. Preferably, receiver 301 converts modulated signals coupled from substrate half-capacitor 14b into digital data by detection, discrimination or pulse slicing techniques, or by recovery of AMI or NRZ data. In the preferred embodiments, the waveform coupled to the receiver on line 32b is either a pulse or a level waveform.

FIG. 30 depicts a single-ended capacitive signal path for illustrative purposes. It should be noted, however, that differential signalling, as depicted in later figures, is considered preferable. It should also be noted that a receiver or driver could be connected to more than one half-capacitor, and that both a receiver and a driver could be connected to a single half-capacitor or collection of capacitive coupling means. It should be further noted that transmission line 34 is merely exemplary. Receivers and/or transmitters could be implemented directly on substrate 11, preferably beneath or near half-capacitors 14a and/or 14b.

Figure 31A:
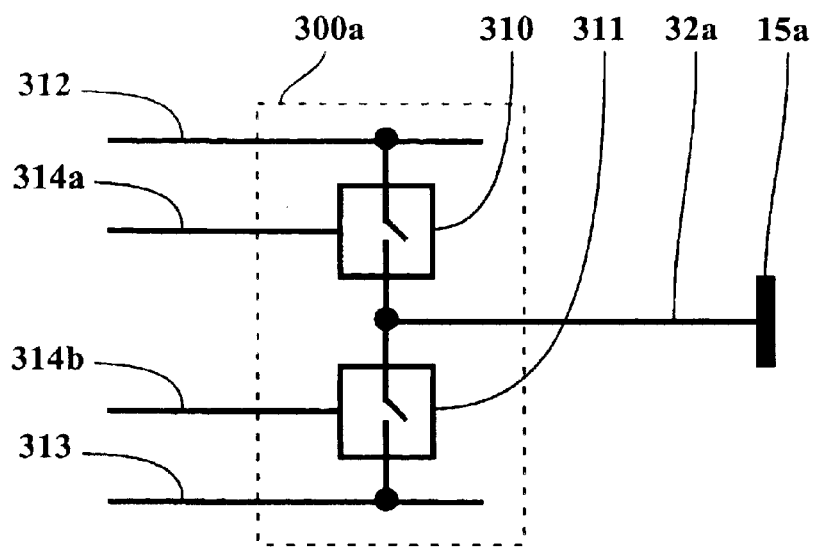
FIGS. 31A–B depict a final stage of a preferred embodiment of a transmitter.
Figure 31B:
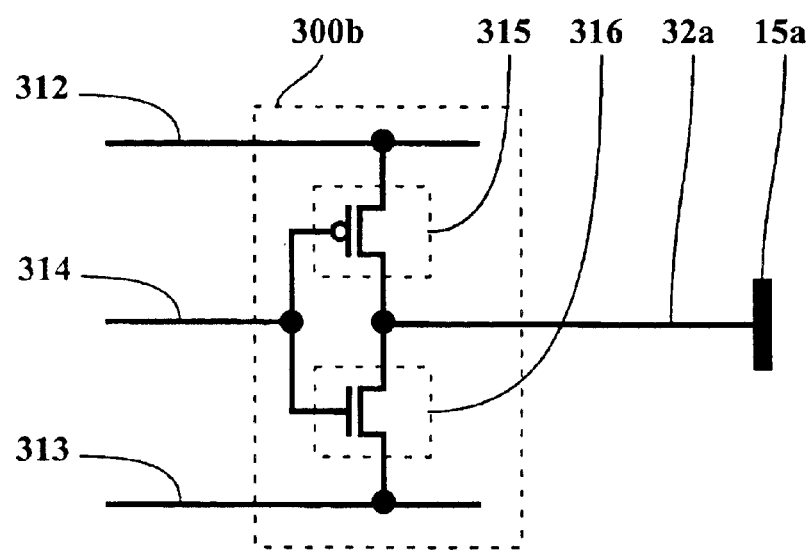

Reference is now made to FIGS. 31A and 31B, which depict a final stage of the preferred embodiment of transmitter 300. In FIG. 31A, a transmitter includes a means 300a for rapidly switching the output signal 32a between two voltage levels 312 and 313, the means for rapidly switching comprising switches 310 and 311, controlled by control signals 314a and 314b, respectively. Control signals 314a and 314b are determined by the digital data 302 entering the transmitter.

FIG. 31B depicts a preferred embodiment of the means for rapidly switching comprising a CMOS inverter 300b. Inverter 300b requires only a single control signal 314, which controls both PMOS switch 315 and NMOS switch 316.

The switching means 300a of transmitter 300 imparts a waveform on substrate half-capacitor 14a (and transmission line 34) when output 32a switches voltage levels. If transmission line 34 is terminated, the imparted waveform will be a pulse. If wiring is unterminated, the waveform will be a level voltage.

Figure 32:
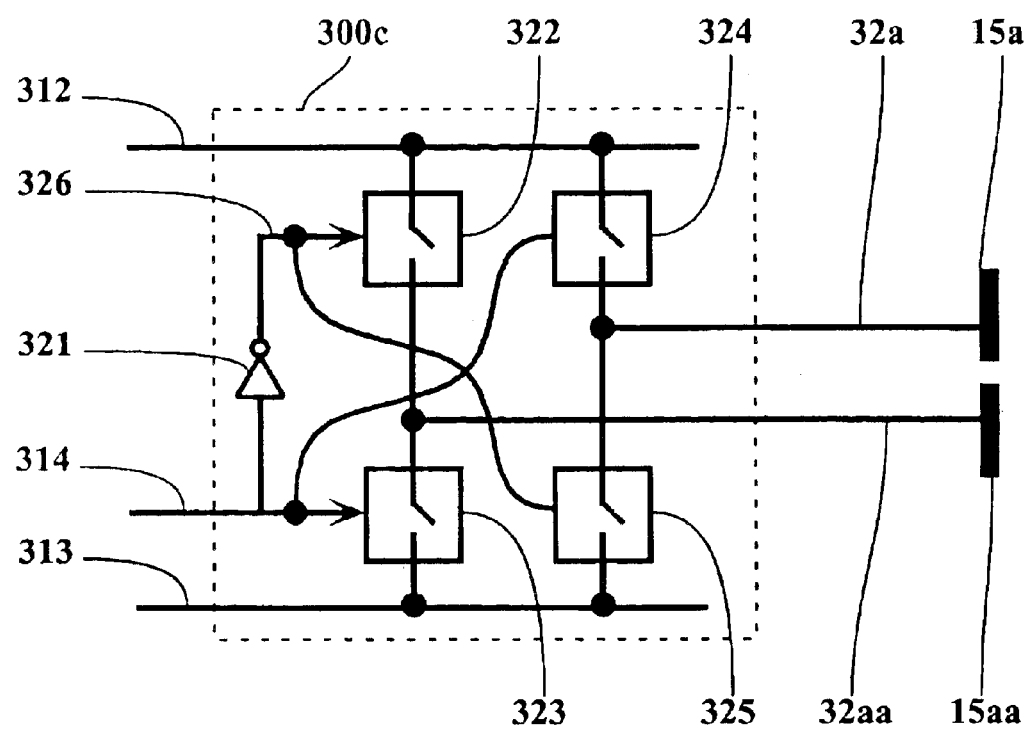
FIG. 32 depicts a preferred embodiment of a switching means adapted to drive differential capacitive signal paths.

Reference is now made to FIG. 32, which depicts a preferred embodiment of a switching means adapted to drive a differential capacitive signal path. Differential switching means 300c comprises a control signal inverter 321 and four switches 322–325. Depending on the state of control signal 314, one of voltage levels 312 and 313 is selectively coupled to output line 32a while the other voltage level is coupled to output line 32aa. Die half-capacitors 15a and 15aa impart a differential waveform to their respective substrate half-capacitors (not shown) wherein each substrate half-capacitor sees a waveform of opposite polarity. The waveforms are pulse waveforms if the substrate transmission lines are terminated and level waveforms if the substrate transmission lines are unterminated.

Figure 33:
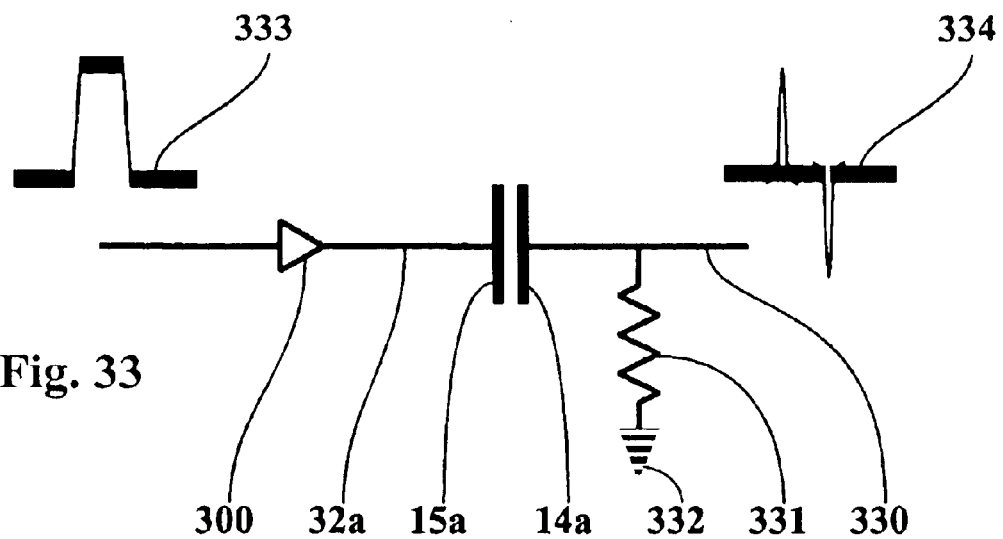
FIG. 33 depicts a simplified electrical model of the interface between an exemplary switching means and a terminated substrate transmission line.

Reference is now made to FIG. 33, which depicts a simplified electrical model of the interface between an exemplary switching means 300 and a terminated substrate transmission line 330. A level waveform 333 is applied to switching means 300a, which couples a similar waveform to die half-capacitor 15a. In response thereto, a pulse waveform 334 is imparted on substrate transmission line 330. A termination resistor 331 connected between transmission line 330 and an AC ground 332 terminates transmission line 330.

Figure 34:
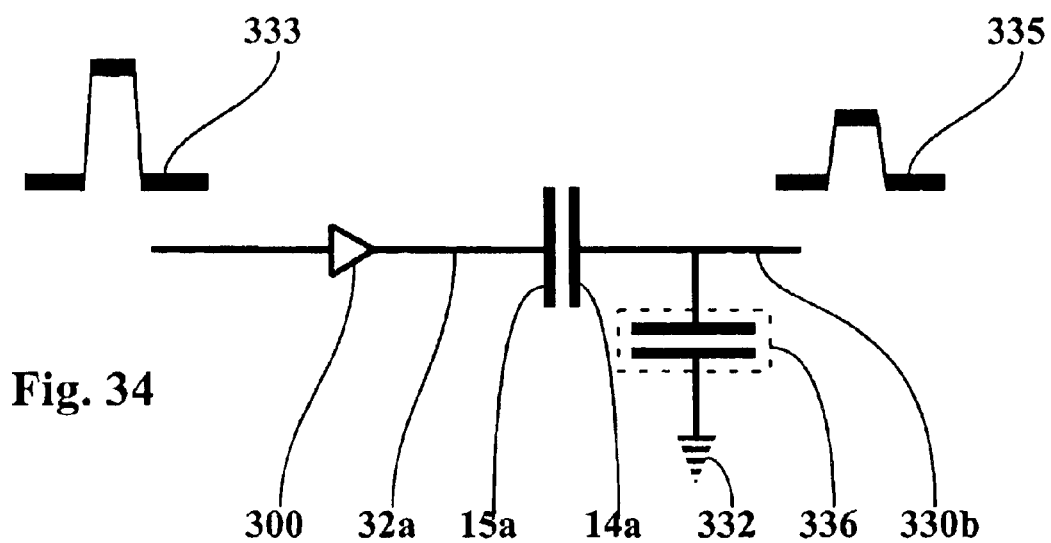
FIG. 34 depicts a simplified electrical model of the interface between an exemplary switching means and an unterminated substrate wiring line.

Reference is now made to FIG. 34, which depicts a simplified electrical model of the interface between an exemplary switching means 300 and unterminated substrate wiring line 330b. A level waveform 333 is applied to switching means 300, which couples a similar waveform to die half-capacitor 15a. In response thereto, a level waveform 335 is imparted on substrate wiring 330b. Capacitor 336 represents the parasitic capacitance between unterminated wiring 330b and AC ground 332. A voltage divider is formed by capacitor 336 and the coupled half-capacitors 15a and 14a. Therefore, waveform 335 represents a reduced swing version of waveform 333.

Figure 35:
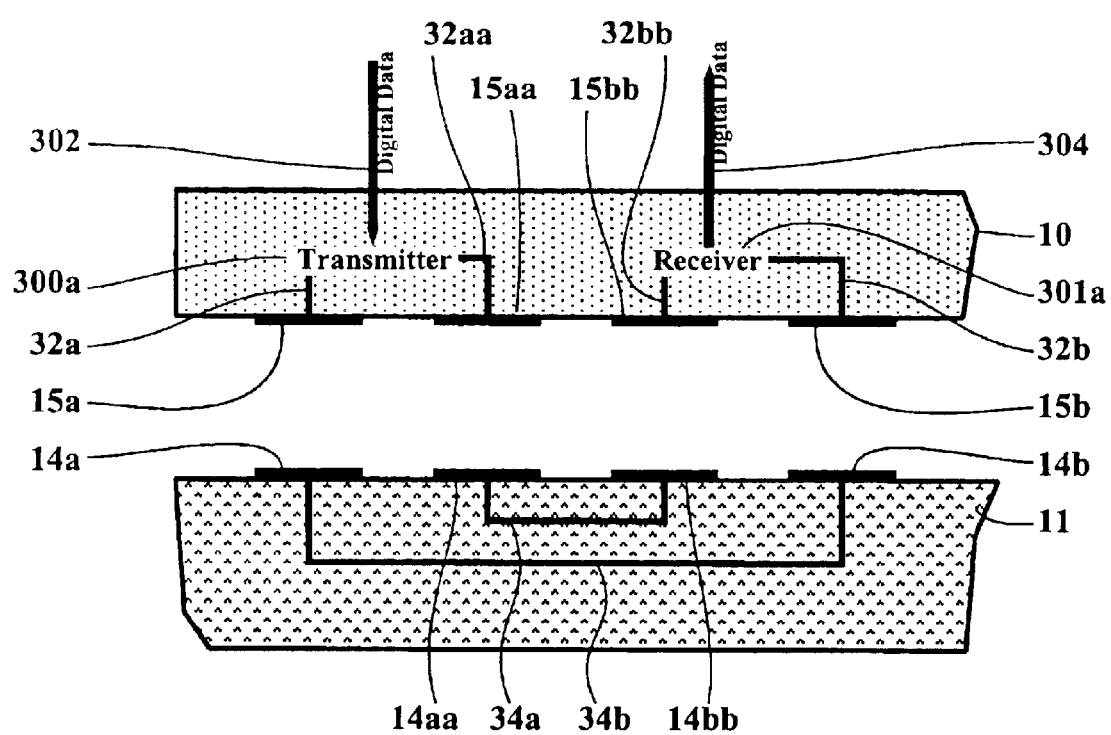
FIG. 35 depicts a block diagram of a preferred, differential off-die signal path.

Reference is now made to FIG. 35, which depicts a block diagram of a preferred, differential off-die signal path in accordance with the invention. In the path shown in FIG. 35, digital data 302 is: (1) input to transmitter 300a; (2) coupled differentially to die half-capacitors 15a and 15aa via wiring 32a and 32aa; (3) coupled differentially from substrate half-capacitors 14a and 14aa to substrate half-capacitors 14b and 14bb via wiring 34a and 34b, respectively; (4) coupled differentially from die half-capacitors 15b and 15bb to receiver 301a via transmission lines 32b and 32bb; and, (5) provided as digital output 304 from receiver 301a.

Differential transmitter 300a and receiver 301a may be implemented on the same die 10 (an intra-die off-die signal path) or different dies (an inter-die signal path). Transmitter 300a and receiver 301a are preferably implemented on the active surface of die 10, preferably directly beneath half-capacitors 15a–15aa and 15b–15bb, respectively. Advantageously, one side of the differential signal path can be employed as a "reference line," for example, by enlarging half-capacitors 14aa, 15aa, 14bb, and 15bb.

As with the single-ended capacitive signal paths, pulse or level waveforms on transmission lines 34a and 34b preferably convey digital information between transmitter 300a and receiver 301b. However, other differential signalling techniques, such as those based on modulation of amplitude, phase, frequency or signal-to-noise ratio, may also be used to transmit data via the differential capacitive signal paths of the invention. Certain combinations of pulse and level waveforms offer advantageous implementations, such as a configuration wherein a transmitter drives a single-ended pulse and the receiver reads a differential signal, taking a level waveform, preferentially ground, as the other side of the difference.

Figure 36:
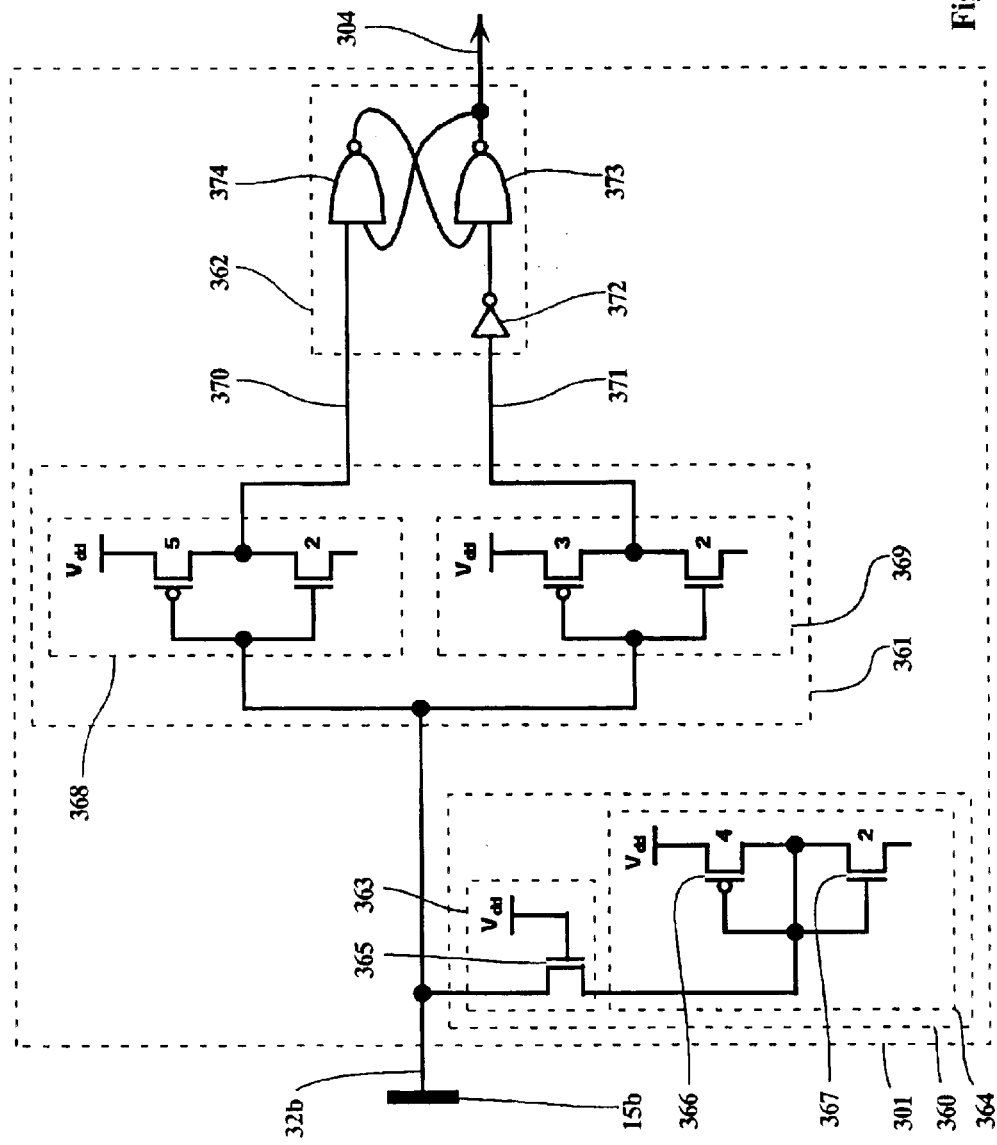
FIG. 36 is a schematic diagram of an exemplary single-ended receiver compatible for use in the signal path depicted in FIG. 30.

Reference is now made to FIG. 36, which is a schematic diagram of an exemplary single-ended receiver 301 compatible for use in the signal path depicted in FIG. 30. Receiver 301 converts a pulse waveform received on half-capacitor 15b and coupled via wiring 32b to a digital output 304. Receiver 301 comprises a biasing means 360 coupled to input line 32b, a slicing means 361 also coupled to input line 32b, and a pulse-to-level converter 362 coupled to the slicing means.

Biasing means 360 comprises a resistive means 363 coupled to input line 32b and a voltage generator means 364 coupled to the resistive means. Resistive means 363 preferably comprises an MOS transistor 365. Voltage generator means 364 preferably comprises a feedback-connected CMOS inverter wherein the relative sizes of PMOS transistor 366 and NMOS transistor 367 are selected to provide the desired bias voltage. Preferably, this ratio of transistor sizes is the same as that for an ordinary inverter in the given process, so as to provide a bias voltage approximately equal to the switching threshold of an ordinary inverter. Resistive means 363 and voltage generator means 364 are designed to track process variations. Advantageously, a single voltage generator means 364 may be used in conjunction with multiple resistive means 363 to bias multiple half-capacitor plates 15b.

Slicing means 361 illustratively comprises a high-threshold inverter 368 and a low-threshold inverter 369, both coupled to input line 32b. High-threshold inverter 368 preferably comprises a CMOS inverter having a PMOS-to-NMOS size ratio larger than that of voltage generator 364. Similarly, low-threshold inverter 369 preferably comprises a CMOS inverter having a PMOS-to-NMOS size ratio smaller than that of voltage generator 364. Slicing means detects deviations of the voltage on input line 32b imparted by signals coupled from half-capacitor 15b, as either pulse or level waveforms. The switching thresholds of inverters 368 and 369 advantageously track process variations.

Pulse-to-level converter 362 comprises an R-S flip-flop, including inverter 372 and cross-coupled NAND gates 373–374, all preferably implemented in CMOS. Pulse-to-level converter 362 effectively reconstructs the digital waveform driven by transmitter 300 on half-capacitor 15a (See FIG. 30). Output 370 from slicing means 361 drives the Set input of pulse-to-level converter 362, thereby driving digital output 304 low when a positive pulse or level change is imparted on input line 32b. Similarly, output 371 from slicing means 361 drives the Reset input of pulse-to-level converter 362, thereby driving digital output 304 high when a negative pulse or level change is imparted on input line 32b. Pulse-to-level converter 362 is preferably designed such that the timings in the Set and Reset paths of the R-S flip-flop are substantially identical, so as to provide a digital output waveform 304 having substantially the same timing as the digital input waveform 302 at transmitter 300.

Figure 37:
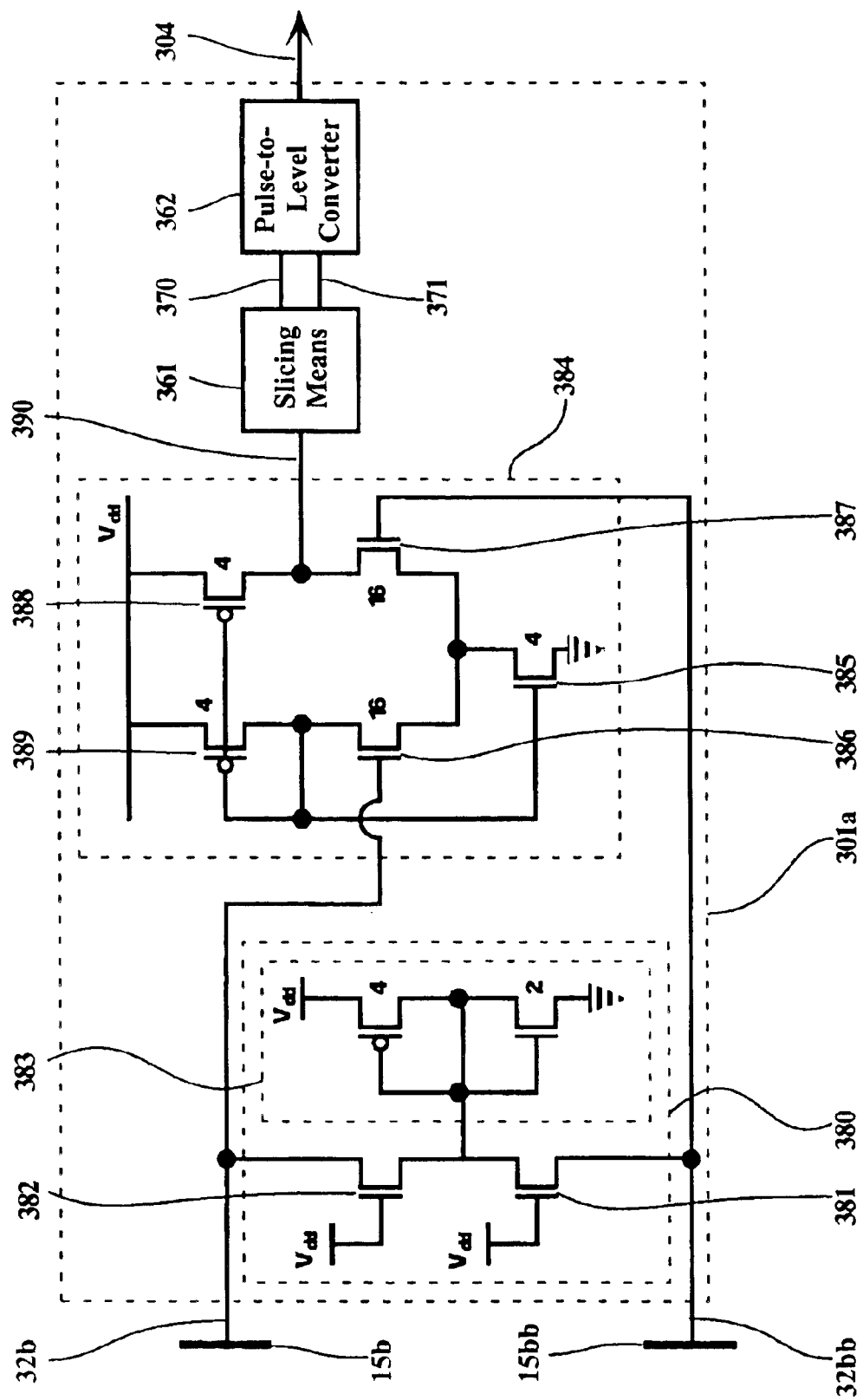
FIG. 37 is a schematic diagram of an exemplary differential receiver compatible for use in the signal path depicted in FIG. 35.

Reference is now made to FIG. 37, which is a schematic diagram of an exemplary differential receiver 301a compatible for use in the signal path depicted in FIG. 35. Differential receiver comprises a biasing means 380, a signal conditioning means 384, a slicing means 361 and a pulse-to-level converter 362. Receiver 301a receives a differential pulse or level waveform input from half-capacitors 15b–15bb and provides a digital output 304.

Biasing means 380 comprises a voltage generator means 383, first resistive means 381 and second resistive means 382. Voltage generator means 383 preferably comprises an ordinary sized, feedback-connected CMOS inverter. First resistive means 381 comprises an appropriately sized NMOS transistor connected between voltage generator means 383 and input line 32bb. Second resistive means similarly comprises an appropriately sized NMOS transistor connected between voltage generator means 383 and input line 32b. Biasing means 380 advantageously tracks process variations.

Signal conditioning means 384 receives differential input from lines 32b versus 32bb and provides a single-ended output 390, thereby enhancing the rejection of common-mode noise or other signals on input lines 32b and 32bb. Signal conditioning means 384 illustratively comprises a DMC differential amplifier, wherein an NMOS current source 385 and the gates of load devices 388 and 389 are self-biased by one output of the differential amplifier, and differential input from lines 32b and 32bb drives an NMOS differential pair 386 and 387. (See Chappel et al., *IEEE J. of Solid State Circuits*, February 1988.) This differential amplifier design advantageously provides excellent tracking of the output voltage 390 with the input threshold of a nominal CMOS inverter across process, temperature and supply voltage variations, as well as good common mode and power supply rejection. Thus, signal conditioning means 384 provides an output 390 approximately equal to the switching threshold of an ordinary CMOS inverter when its inputs 32b and 32bb are approximately the same.

The single-ended output from signal conditioning means 384 is provided to slicing means 361, which drives the Set and Reset inputs 370–371 of pulse-to-level converter 362 to provide digital output 304. Slicing means 361 and pulse-to-level converter 362 have been previously described in regard to FIG. 26.

Figure 38A:
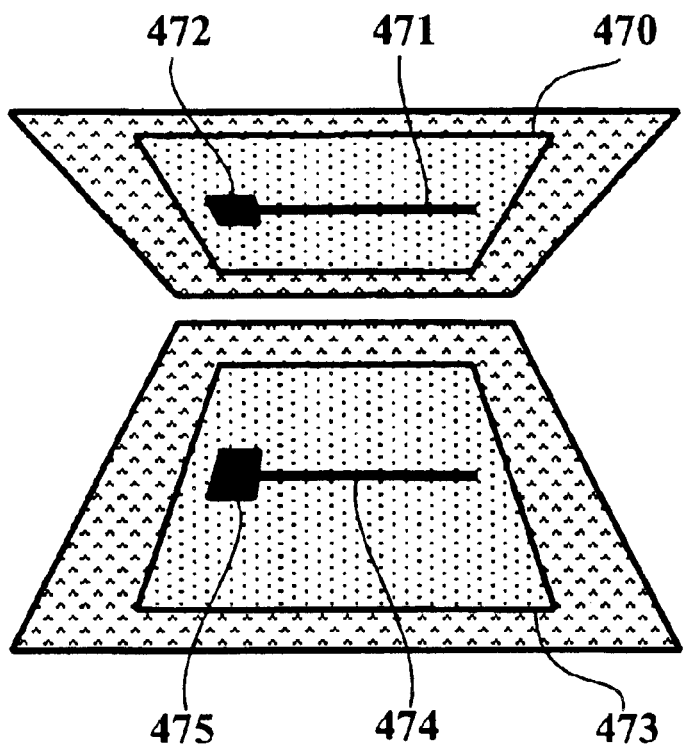
FIGS. 38A–B illustrate non-conductive signalling between modules by means of parallel and perpendicular coupled transmission lines.
Figure 38B:
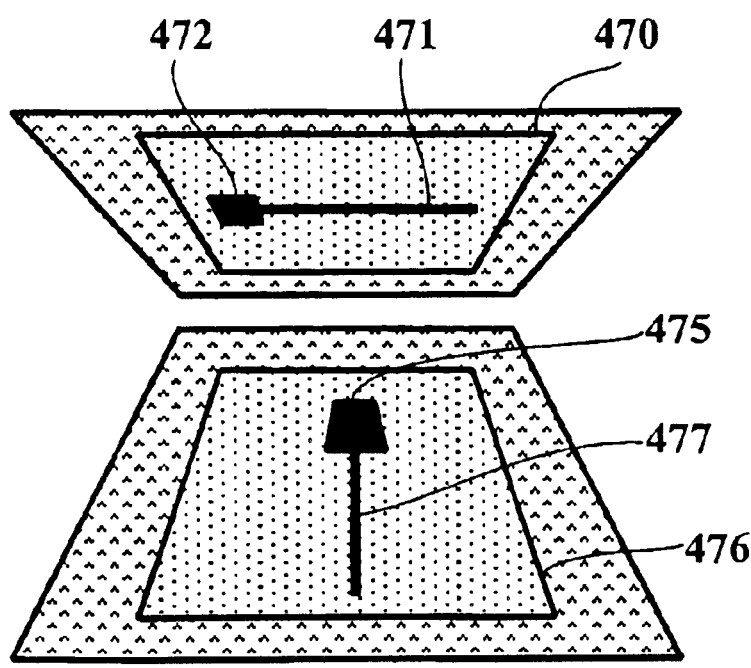

Reference is now made to FIGS. 38A–B. FIG. 38A shows an exploded view of a modular system including a transmission line 471 on module 470 and a parallel transmission line 474 on module 473. Coupled transmission lines 471 and 474 provide a means for non-conductively signalling between modules 470 and 473. FIG. 38B shows an exploded view of an alternative arrangement, wherein transmission line 471 on module 470 and perpendicular transmission line 477 on module 476 couple magnetically, thereby providing a means for non-conductively signalling between modules 470 and 476. Signalling means 472 comprises a transmitter and signalling means 475 comprises a receiver, and/or vice versa.

While the invention has been illustrated with reference to preferred embodiments utilizing capacitive coupling, other modes of non-conductive interconnection, as described in FIG. 38, can be used to construct modular systems in accordance with the invention. U.S. Pat. No. 5,012,321, entitled INTERCONNECTION DEVICE BETWEEN THE CELLS OF A PRE-IMPLANTED HYPERFREQUENCY INTEGRATED CIRCUIT, incorporated herein by reference, teaches the use of transmission line coupling between overlapping microstrips as a technique for implementing a custom interconnect layer on a pre-implanted hyperfrequency integrated circuit. The '321 patent differs from the present invention in at least two important respects: (1) the '321 patent does not teach the use of transmission line coupling to signal inter-chip between different modules in a modular system, or intra-chip via an off-chip path such as between two units of a chip via a distinct capacitively coupled substrate; and (2) the '321 patent expressly excludes "integrated circuits on silicon . . . operating at a low frequency."

We have found that with a sufficiently high dielectric factor, transmission line coupling as depicted in FIG. 38 may be used in place of previously described half-capacitor coupling methods to implement a means for non-conductively signalling in accordance with the present invention, and that such alternative signalling means may thus be used in silicon-based systems such as CMOS. In particular, modular microwave and millimeter wave systems can advantageously employ transmission line coupling as a means for non-conductively signalling between modules in the system. Additionally, it may be advantageous to distribute clock signals and the like through coupled transmission lines. In these and similar circumstances, transmission line coupling and capacitive coupling represent alternative means for non-conductively signalling. Thus, the present invention encompasses modular electronic systems in which at least some of the modules communicate via coupled half-capacitors, coupled transmission lines, or both.

What is claimed is:

1. A method of coupling signals between electronic devices in a modular electronic system, said method comprising the steps of:
    locating a first subset of said electronic devices and a plurality of half-capacitors on a first semiconductor chip;
    locating a second subset of said electronic devices and a plurality of half-capacitors on a second semiconductor chip; and,
    aligning and affixing said first and second chips so as to capacitively couple said first and second chips using at least some of the half-capacitors on each of said chips.

2. A method of coupling signals between electronic devices in a modular electronic system as defined in claim 1 wherein the first and second chips are affixed to a base substrate thereby capacitively coupling said first and second chips via said substrate.

3. A method of capacitively coupling signals between first and second chips, each said chip having a plurality of half-capacitors, said method comprising the steps of:
    affixing said first chip to a substrate;
    aligning said second chip to said first chip; and,
    affixing said second chip to said substrate, thereby capacitively coupling corresponding half-capacitors on said first and second chips and providing direct capacitive coupling between said first and second chips.

4. A method of fabricating an integrated circuit module, comprising:

providing a plurality of first dice, said first dice each having half-capacitors formed on a surface thereof;

providing a plurality of second dice, said second dice each having half-capacitors formed on a surface thereof; and arranging said first dice so that each of said first dice overlaps at least three of said second dice, and each of said second dice overlaps at least three of said first dice, thereby defining overlap areas, wherein at least some half-capacitors of said plurality of first dice are configured to be capacitively coupled to corresponding half-capacitors of said second dice in said overlap areas.

5. The method of claim 4 wherein providing said plurality of first dice and second dice include forming a dielectric layer on some of said first dice and second dice, so that half-capacitors in said overlap areas are spaced apart.

6. The method of claim 4 wherein said plurality of first dice are rectangles.

7. The method of claim 4 wherein said plurality of second dice are rectangles.

8. The method of claim 6 wherein said plurality of second dice are squares.

9. The method of claim 4 wherein said plurality of first and second dice are shaped as octagons.

10. The method of claim 4 further comprising:

arranging said first dice to form a first two-dimensional repeating pattern; and arranging said second dice to form a second two-dimensional repeating pattern.

11. The method of claim 4 further comprising:

capacitively coupling some half-capacitors of said first dice to some half-capacitors of said second dice in said overlap areas.

12. A method of fabricating an integrated circuit module, comprising:

providing a plurality of first dice, said first dice each having first half-capacitors formed on a surface thereof;

providing a plurality of second dice, said second dice each having second half-capacitors formed on a surface thereof; and arranging said first dice so that each first die overlaps at least two of said second dice, thereby defining overlap areas, wherein said first half-capacitors located in said overlap areas are configured to be capacitively coupled to some of said second half-capacitors, wherein said first dice or said second dice have raised areas relative to said surfaces, the raised areas of each of said first or said second die contacting an area on one of the overlapping die.

13. The method of claim 12 wherein each of said first dice and said second dice have raised areas relative to said surfaces, and the signals pads in said overlapping areas are disposed in between said raised areas.

14. The method of claim 12 wherein each of said raised areas of said first dice contact one of the raised areas of said second dice.

15. The method of claim 12 wherein said plurality of first dice are on a plane that is above each of said plurality of second dice.

16. The method of claim 12 wherein the plurality of first dice comprises half-capacitors that do not overlap one of the plurality of second dice.

17. The method of claim 12 wherein arranging said first dice further comprises arranging said first dice so that each first die overlaps at least three of said second dice.

18. A method of fabricating an integrated circuit module, comprising:

providing a plurality of first dice, said first dice each having half-capacitors formed on a surface thereof;

providing a plurality of second dice, said second dice each having half-capacitors formed on a surface thereof;

arranging said first dice so that each first die overlaps at least four of said second dice, thereby defining overlap areas; and aligning said first dice so that half-capacitors thereof located in said overlap areas are configured to be capacitively coupled to some half-capacitors of said second dice.

19. The method of claim 18 wherein said plurality of first dice are on a plane that is above each of said plurality of second dice.

20. The method of claim 18 wherein each of the plurality of first dice comprises four sides, and each of said first dice overlaps one of said plurality of second dice on each of said four sides of said first dice.

21. The method of claim 18 wherein the plurality of first dice comprises half-capacitors that do not overlap one of the plurality of second dice.

22. The method of claim 18 wherein at least some of said half-capacitors in said plurality of first dice are capacitively coupled to a chip substrate within said first dice.

23. The method of claim 18 wherein at least some of said half-capacitors in said plurality of first dice are coupled to a chip substrate through vias within said first dice.

* * * * *